United States Patent [19]
Nakaura et al.

[11] Patent Number: 6,139,591
[45] Date of Patent: Oct. 31, 2000

[54] WAFER SEPARATING AND CLEANING APPARATUS AND PROCESS

[75] Inventors: Kenichi Nakaura; Satoru Minami; Daizo Miyanari, all of Mitaka, Japan

[73] Assignee: Tokyo Seimitsu Co., Ltd., Mitaka, Japan

[21] Appl. No.: 09/244,049

[22] Filed: Feb. 4, 1999

[30] Foreign Application Priority Data

| Mar. 4, 1998 | [JP] | Japan | ................................. 10-052393 |
| Apr. 1, 1998 | [JP] | Japan | ................................. 10-088921 |
| Apr. 1, 1998 | [JP] | Japan | ................................. 10-088922 |

[51] Int. Cl.[7] .......................... H01L 21/00; H01L 21/64; H01L 21/46; H01L 21/78; H01L 21/301
[52] U.S. Cl. .......................... 29/25.01; 438/463
[58] Field of Search ............................. 29/25.01; 438/463

[56] References Cited

U.S. PATENT DOCUMENTS 4,903,681  2/1990  Honda et al. .
4,949,700  8/1990  Ebashi .
5,142,756  9/1992  Ibaraki et al. .

*Primary Examiner*—David E. Graybill
*Attorney, Agent, or Firm*—Nixon Peabody LLP; David S. Safran

[57] ABSTRACT

An individual wafer separating part separates batched wafers one by one from a slice base mounting beam, and then a shuttle conveyor transports the separated wafers one by one to an individual cleaning part so that the wafers can be cleaned individually. After the cleaning, a detecting part detects the thickness, breaking, chipping and remaining adhesives of the wafers. The wafers are classified in accordance with the results of the detection. Normal wafers are collected in wafer collecting parts, failed wafers are collected in a failed wafer collecting part, and wafers with remaining adhesives are collected into an adhesive remaining wafer collecting part.

36 Claims, 45 Drawing Sheets

FIG. 45
PRIOR ART
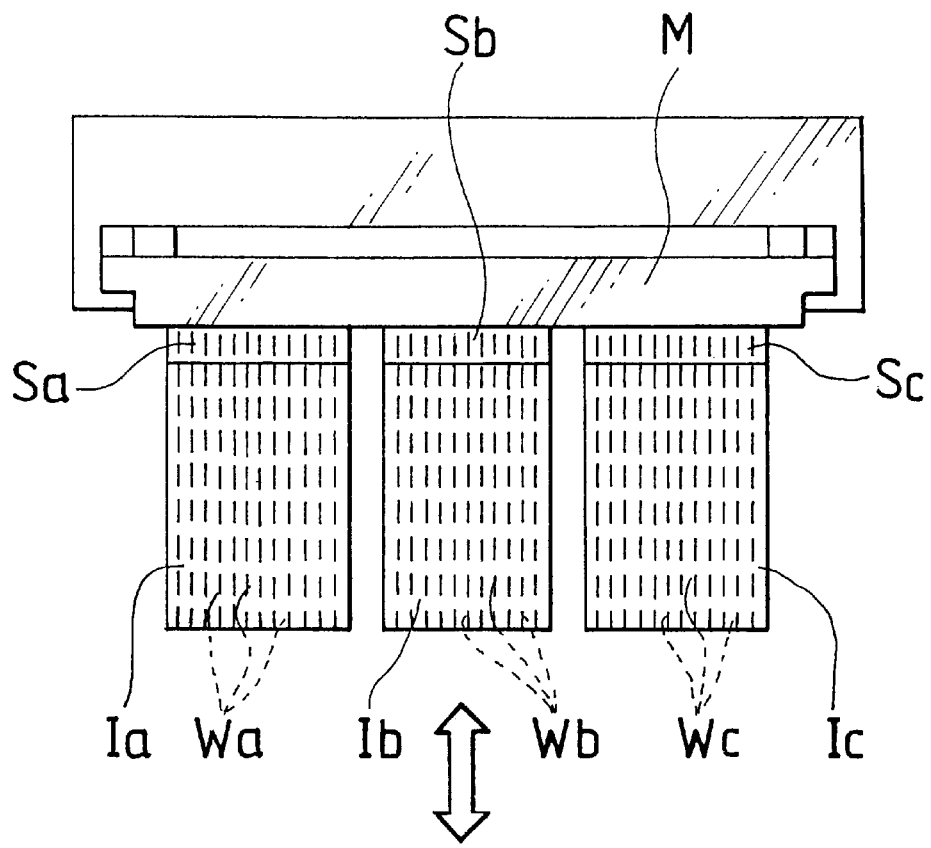
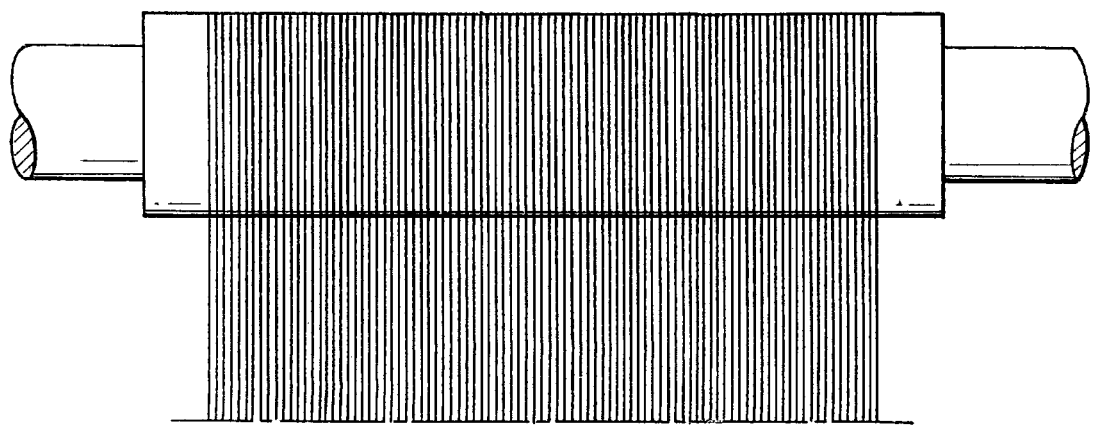

WAFER SEPARATING AND CLEANING APPARATUS AND PROCESS

BACKGROUND OF THE INVENTION

1. Field of the Invention

The present invention relates generally to a wafer separating and cleaning apparatus, and more particularly to a wafer separating and cleaning apparatus which separates wafers, sliced simultaneously from an ingot by a wire saw, from a slice base mounting beam, and which cleans and collects the wafers.

2. Description of Related Art

FIG. 44 is a perspective view illustrating the structure of a conventional wire saw 2. As shown in FIG. 44, the wire saw 2 forms a wire row 7 by winding a wire 5, which runs between a pair of wire reels 3 (FIG. 44 shows only one side) with the guide of multiple guide rollers 4, around a plurality of grooved rollers 6 (three grooved rollers in FIG. 44). The wire saw 2 slices an ingot In into a number of wafers W simultaneously by pressing the ingot In against the wire row 7 while supplying a machining liquid (slurry) including abrasive grains to the wire row 7.

When the wire saw 2 slices the ingot In, a slice base mounting beam is adhered to the peripheral surface of the ingot In to prevent the chipping at the slicing end. The slice base mounting beam, which is adhered to the peripheral surface of the ingot In, is adhered to a mounting plate so that the ingot In can be attached to the wire saw 2. Accordingly, the wafers are sliced from the ingot In while they are all adhered to the slice base mounting beam. Therefore, the wafers must be separated individually from the slice base mounting beam after the slicing. A special wafer separating and cleaning apparatus separates the wafers.

The wafer separating and cleaning apparatus consists of a rough cleaning part, an individual wafer separating part, a cleaning part and a collecting part. The wafers, which have been sliced by the wire saw, are sent to the rough cleaning part, and they are roughly cleaned. Then, the wafers are transported to the individual wafer separating part, where the wafers are separated from the slice base mounting beam one at a time. The wafers, which have been separated from the slice base mounting beam, are transported to the cleaning part, and they are cleaned individually. Afterwards, the wafers are sequentially collected into a cassette at the collecting part.

The wafers, which have been sliced by the wire saw, do not necessarily have the uniform thickness. Some wafers have the thickness of more than a prescribed value. Some wafers are broken, chipped and have remaining adhesives after slicing, separating and cleaning. The failed wafers, which are irregular in thickness, broken, chipped and has the remaining adhesives, must be removed before the wafers are transported to the next stage. Conventionally, the failed wafers are detected in such a way that the wafers, which have been separated, cleaned and collected by the wafer separating and cleaning apparatus, are transported to a detecting apparatus.

Considering the flow of the wafer manufacturing process as a whole is taken into consideration, however, the processing is extremely inefficient if the wafers are transported to the detecting apparatus after they are separated and cleaned by the wafer separating and cleaning apparatus.

As shown in FIG. 45, a multiple slicing method has been adopted conventionally. In the multiple slicing method, different kinds of ingots Ia, Ib, Ic are attached to a mounting plate M, and a wire saw slices those ingots at the same time. The conventional wafer separating and cleaning apparatus, however, cannot classify and collect different kinds of wafers Wa, Wb, Wc, which have been sliced in the multiple slicing method. Specifically, an individual wafer separating apparatus incorporated into the conventional wafer separating and cleaning apparatus vacuums one side of the wafers adhered to the slice base mounting beam by means of a pad, and swings the pad to separate the wafers from the slice base mounting beam. Since the different kinds of wafers are continuously processed without classifying them, it is impossible to recognize the boundaries between the different kinds of wafers.

The conventional wafer separating and cleaning apparatus is capable of automatically separating the wafers from the slice base mounting beam, but an operator must manually remove the slice base mounting beam from the mounting plate. It is very inconvenient and dangerous. When the operator removes the slice base mounting beam, the mounting beam is heated to soften an adhesive agent by heat. The operator uses a hammer to hit the side of the slice base mounting beam whose adhesive agent has been softened. Since the mounting plate is high temperature, it is extremely dangerous for the operator to manually remove the slice base mounting beam. Moreover, since the mounting plate is heavyweight, it is extremely strenuous for the operator to manually remove the slice base mounting beam.

SUMMARY OF THE INVENTION

The present invention has been developed in view of the above-described circumstances, and has as its object the provision of a wafer separating and cleaning apparatus which is able to efficiently process wafers that have been sliced by a wire saw.

To achieve the above-mentioned object, the present invention is directed to a wafer manufacturing method comprising the steps of: transporting a plurality of wafers, sliced from an ingot by a wire saw, to a wafer separating part to separate the wafers one by one from a slice base mounting beam; transporting the wafers, separated from the slice base mounting beam, to a cleaning part one by one to clean the wafers; transporting the wafers cleaned by the cleaning part to a detecting part to detect the shapes of the wafers; and collecting the wafers one by one into a cassette of a collecting part after detecting the shapes of wafers at the detecting part, According to the present invention, the plurality of wafers that has been sliced by the wire saw is transported to the wafer separating part, where the wafers are separated from the slice base mounting beam one at a time. Then, the wafers, that have been separated from the slice base mounting beam at the wafer separating part, are transported to the cleaning part one at a time and they are cleaned at the cleaning part. The wafers that have been cleaned by the cleaning part are transported to the detecting part to detect the shapes of the wafers. After the detection, the wafers are sequentially collected in a cassette of the collecting part.

To achieve the above-mentioned object, the present invention is directed to a wafer manufacturing method comprising the steps of: transporting a plurality of wafers, sliced from a plurality of ingots by a wire saw, to a wafer separating part to separate the wafers one by one from a slice base mounting beam for each lot; transporting the wafers, separated from the slice base mounting beam, to a cleaning part one by one to clean the wafers; transporting the wafers cleaned by the cleaning part to a detecting part to detect the shapes of the wafers; and collecting the wafers one by one into each cassette for each lot at a collecting part after detecting the shapes of wafers at the detecting part. According to the present invention, a plurality of wafers that has been sliced from a plurality of ingots by the wire saw is transported to the wafer separating part, where the wafers are separated from the slice base mounting beam one at a time for each lot. Then, the wafers that have been separated from the slice base mounting beam are transported to the cleaning part one at a time, and they are cleaned at the cleaning part. The wafers that have been cleaned at the cleaning part are transported to the detecting part to detect the shapes of the wafers. After the detection, the wafers are classified according to lots, and they are collected into corresponding cassettes one at a time.

To achieve the above-mentioned object, the present invention is directed to a wafer manufacturing apparatus comprising: a wafer separating part for separating wafers, sliced by a wire saw, individually from a slice base mounting beam; a cleaning part for cleaning the wafers one by one; a wafer transport part for transporting the wafers, separated from the slice base mounting beam by the wafer separating part, to the cleaning part; a detecting part for detecting the shape of the wafers cleaned by the cleaning part; and a collecting part for collecting the wafers whose shapes have been detected by the detecting part one by one.

According to the present invention, the wafer detecting part, which detects the shapes of the wafers, is provided in the wafer manufacturing apparatus, which processes the wafers that have been sliced by the wire saw. After the detecting part detects the shapes of the wafers, the collecting part collects the separated and cleaned wafers.

To achieve the above-mentioned object, the present invention is directed to the wafer manufacturing, wherein the collecting part comprises: a wafer loading cassette for loading normal wafers; a failed wafer collecting box for collecting the wafers which are failed in shape; adhesive remaining wafer collecting cassette for collecting the wafers with adhesives remaining thereon; and wherein the collecting part classifies the wafers according to the detected results of the detecting part and collects the wafers.

According to the present invention, the detecting part, which detects the shapes of the wafers, is provided in the wafer manufacturing apparatus, which processes the wafers that have been sliced by the wire saw in the multiple slicing method. After the detecting part detects the shapes of the wafers, the collecting part collects the separated and cleaned wafers.

To achieve the above-mentioned object, a wafer separating apparatus which separates wafers, sliced simultaneously from a plurality of ingots by a wire saw, one by one from slice base mounting beams holding the wafers; the wafer separating apparatus comprising: a hot water tank which contains hot water; an attachment base placed in the hot water tank, the wafers subject to separation being attached to the attachment base; holding means for holding end faces of the wafers at one side; moving means for moving the holding means along the attachment base; swinging means provided in the moving means, the swinging means swinging the holding means; and partitions inserted into spaces between different kinds of wafers; and a sensor for detecting the partitions inserted between the wafers.

According to the present invention, the slice base mounting beam is soaked in the hot water stored in the hot water tank to thereby soften the adhering part of the slice base mounting beam and the wafers due to the heat. The holding means holds the end face of the wafer, which is located at one end, among the plurality of wafers adhered to the slice base mounting beam. The swinging means swings the holding means to separate the wafers from the slice base mounting beam. After the first wafer is separated, the moving means moves the holding means and the following wafers are separated in the same manner. Normally, the different kinds of wafers are separated continuously as the separation proceeds. According to this invention, however, the partition is inserted between the different kinds of wafers, and it is therefore possible to recognize the boundaries between the different kinds of wafers by detecting the partitions with the sensor. For example, it is possible to collect the wafers without mixing the different kinds of wafers by exchanging the cassettes for collecting the separated wafers, etc.

To achieve the above-mentioned object, the present invention is directed a wafer separating apparatus which separates wafers, sliced from a plurality of ingots by a wire saw, one by one from a slice base mounting beams to which the wafers are adhered; the wafer separating apparatus comprising: a hot water tank which contains hot water; holding means for holding the slice base mounting beam adhered to the wafers while soaking the slice base mounting beams in the hot water; a guide member arranged along the hot water tank; a running base running along the guide member; separating means provided at the running base and separating the wafers one by one from the slice base mounting beams soaked in the hot water; a plurality of moving means provided in such a way as to move freely along the guide member, the running base pressing and moving each moving means; partitions provided at each moving means, the partitions being inserted between wafer lots; moving means driving means connecting to each moving means to move the each moving means along the guide member; lot detecting means for detecting boundaries between the wafer lots adhered to the slice base mounting beams while the moving means driving means is moving the each moving means along the guide member; partition detecting means for detecting each partition inserted between the wafer lots while the separating means is separating the wafers; partition inserting means for inserting the partitions between the wafer lots in accordance with a detection signal from the lot detecting means and retreating the partitions from the spaces between the wafers in accordance with a detection signal from the partition detecting means; and connecting means for connecting the each moving means to the moving means driving means and releasing the connection in accordance with a detection signal from the lot detecting means.

A description will be given of the operation of this invention. First, the holding means holds the slice base mounting beam, to which the wafers are adhered. Consequently, the slice base mounting beam is soaked in the hot water. Then, the connecting means connects the movable member drive means with each movable member, and the movable member drive means is driven to move each movable member along the guide member. While the movable member moves along the guide member, the lot detecting means detects the boundaries between the wafer lots adhered to the slice base mounting beam. The partition insertion means inserts the partitions between the wafer lots in accordance with the detection signals from the lot detecting means. At the same time as the insertion of the partitions, the connecting means releases the connection between the movable members at which the inserted partitions are provided and the movable member drive means in accordance with the detection signals from the lot detecting means. The separating means starts the separation after the insertion of the partitions.

As the separating means separates the wafers sequentially from the slice base mounting beam, the partitions inserted between the wafers appear. The partition detecting means detects the appearing partitions to recognize the boundaries between the lots.

On detection of the partitions, the partition insertion means moves back the partitions from the wafers. Afterwards, the wafers of the next lot are separated sequentially from the slice base mounting beam.

The movable members, at which the moving-back partitions are provided, move along the guide member while they are pressed by the running base.

To achieve the above-mentioned object, the present invention is directed to a slice base mounting beam removal apparatus which removes a slice base mounting beam, from which wafers have already been separated, from a mounting plate; the slice base mounting bean removal apparatus comprising: a hot water tank for containing hot water; holding means for holding the mounting plate to which the slice base mounting beams is adhered; transport means for transporting the holding means from a predetermined receiving position to a predetermined slice base mounting beam removal position in the hot water tank; and slice base mounting beam pressing means provided in the hot water tank and pressing the side of the slice base mounting beam adhered to the mounting plate transported to the slice base mounting beam removal position to thereby remove the slice base mounting beam from the mounting plate.

According to the present invention, the holding means located at the receiving position holds the mounting plate, to which the slice base mounting beam is adhered, in order to remove the slice base mounting beam from the mounting plate. Then, the transport means transports the holding means, which holds the mounting plate, to the slice base mounting beam removal position. The slice base mounting beam removal position is set in the hot water tank, and thus, the slice base mounting beam adhered to the mounting plate is soaked in the hot water. Therefore, the heat softens the adhesive agent, which adheres the mounting plate to the slice base mounting beam. When the adhesive agent is softened enough by heat, the slice base mounting beam pressing means presses the side of the slice base mounting beam, which is removed from the mounting plate.

To achieve the above-mentioned object, the present invention is directed to a wafer separating apparatus which separates a plurality of wafers, sliced from an ingot by a wire saw, from a slice base mounting beam holding the wafers one by one; the wafer separating apparatus comprising: a hot water tank for containing hot water; an attachment base placed in the hot water tank, the wafers subject to separation being attached to the attachment base; holding means for holding end faces of the wafers at one side; first moving means for moving the holding means along the attachment base; swinging means provided at the first moving means, the swinging means swinging the holding means; a wafer pressing member coming into contact with the top of some wafers attached to the attachment base to press the wafers; second moving means for moving the wafer pressing means along an axis of the wafers attached to the attachment base; and retracting means provided at the second moving means, the moving means retracting the wafer pressing member from the wafers.

According to the present invention, the slice base mounting beam is soaked in the hot water stored in the hot water tank to thereby soften the adhering part between the slice base mounting beam and the wafers. On the other hand, the holding means vacuums and holds the end face of the wafer positioned at one end of the wafers adhered to the slice base mounting beam. The swinging means swings the holding means to separate the wafer from the slice beam mounting beam. When the separation of the first wafer is completed, the first moving means moves the holding means to separate the following wafers in the same procedure. The wafer pressing member supports the top of some wafers separated from the slice base mounting beam. For this reason, the wafers never fall even if they are naturally separated from the slice base mounting beam. Even if the wafers, which are not supported by the wafer pressing member, are separated from the slice base mounting beam and fall, the fallen wafers are supported by the wafers supported by the wafer pressing member. The wafers do not fall completely to such an extent that the holding means cannot hold the wafers. Thus, the wafers can be separated without fail.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 45 is a view of assistance in explaining a conventional multiple slicing method.

DETAILED DESCRIPTION OF THE PREFERRED EMBODIMENT

This invention will be described in further detail by way of example with reference to the accompanying drawings.

Figure 1:
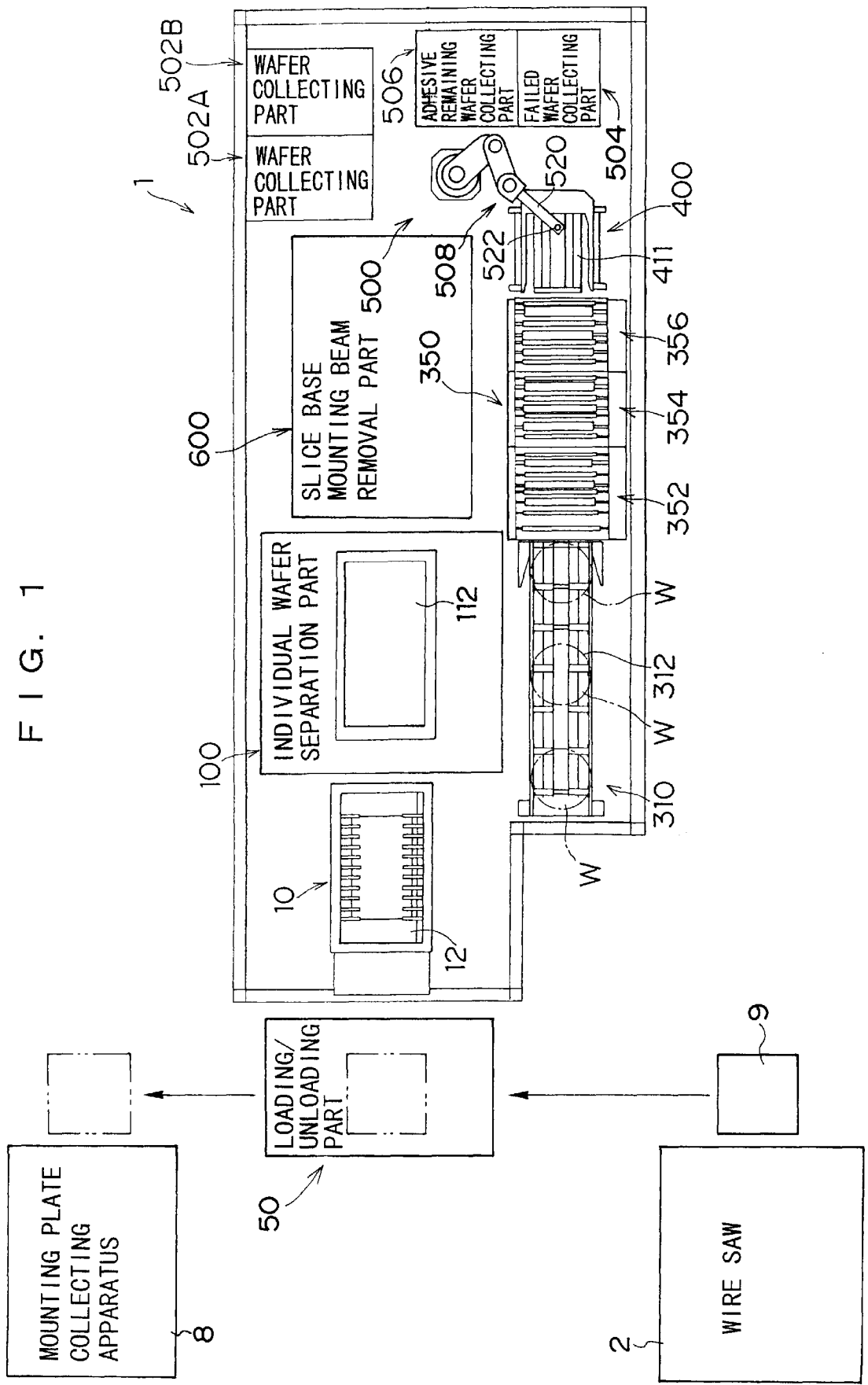
FIG. 1 is a plan view illustrating the entire structure of a wafer manufacturing apparatus.

FIG. 1 is a plan view illustrating the structure of an embodiment of a wafer manufacturing apparatus 1 according to the present invention.

As shown in FIG. 1, the wafer manufacturing apparatus 1 is comprised mainly of a loading/unloading part 50, a rough cleaning part 10, an individual wafer separation part 100, a transport part 310, an individual wafer cleaning part 350, a detecting part 400, a collecting part 500 and a slice base mounting beam removal part 600.

A description will be given of the loading/unloading part 50. As shown in FIG. 1, the loading/unloading part 50 loads wafers W to be separated and cleaned, and unloads a mounting plate M, from which the wafers W have already been separated.

A transport apparatus 9 transports the wafers W sliced by the wire saw 2 to the loading/unloading part 50. The loading/unloading part 50 transfers the wafers W to a transfer chuck (not illustrated).

On the other hand, the mounting plate M, from which a slice base mounting beam S was removed by the slice base mounting beam removing part 600, is transported from the slice base mounting beam removing part 600 to the loading/unloading part 50 by a transfer chuck (not illustrated). Then, the loading/unloading part 50 loads the mounting plate M on a transport apparatus 9, which transports the mounting plate M to a mounting plate collecting apparatus 8.

A description will be given of the rough cleaning part 10. The rough cleaning part 10 showers the batched wafers (the wafers W adhered to the slice base mounting beam S), which have just been sliced by the wire saw 2, thus removing slurry adhered to the wafers during the slicing. The rough cleaning part 10 is provided with a rough cleaning apparatus 12, which cleans the wafers W.

As shown in FIGS. 2–5, the rough cleaning apparatus 12 has a cleaning tank 14, which is open at the top thereof. A rectangular frame 16 is attached to the top of the cleaning tank 14. A lid 17, which is opened and closed by a rotary actuator (not illustrated), is provided at the top of the frame 16.

A pair of cleaning liquid supply pipes 18A, 18B is arranged inside the frame 16. The cleaning liquid supply pipes 18A, 18B are rotatably and slidably supported by the frame 16 through a bush (not illustrated).

Six nozzles 20A, 20B are respectively provided at the pair of the cleaning liquid supply pipes 18A, 18B at regular intervals. Flexible tubes 24A, 24B connect to the ends the cleaning liquid supply pipes 18A, 18B through joints 22A, 22B. The tubes 24A, 24B connect to a cleaning liquid supply apparatus (not illustrated). A cleaning liquid is supplied from the cleaning liquid supply apparatus to the cleaning liquid supply pipes 18A, 18B through tubes 24A, 24B. Then, the cleaning liquid supplied to the cleaning liquid pipes 18A, 18B is jetted from the nozzles 20A, 20B against the wafers W, so that the wafers W can be cleaned in shower.

As stated previously, the cleaning liquid supply pipes 18A, 18B are rotatably and slidably supported by the frame 16. Thus, the nozzles 20A, 20B slide at the same time as the sliding of the cleaning liquid supply pipes 18A, 18B, and the nozzles 20A, 20B rotate (swing) at the same time as the rotation of the cleaning liquid supply pipes 18A, 18B.

Drive units 26A, 26B, which are provided at the ends of the cleaning liquid supply pipes 18A, 18B, slide and rotate the cleaning liquid supply pipes 18A, 18B. The drive units 26A, 26B are constructed in the above-mentioned manner. Since the drive units 26A, 26B are constructed in the same manner, a description will only be given of the structure of the drive unit 26A.

A cylindrical support member 28A is secured to the side of the frame 16. The cleaning liquid supply pipe 18A is inserted into the support member 28A, and a body frame 30 and a drive gear 32A of the drive unit 26A are rotatably supported by the outer periphery of the support member 28A.

A feed screw 34A is rotatably supported on the body frame 30A so that the feed screw 34A can be parallel with the cleaning liquid supply pipe 18A. A nut member 36A is engaged with the feed screw 34A, and the nut member 36A connects to the cleaning liquid supply pipe 18A.

A follower gear 38A is secured to one end of the feed screw 34A, and the follower gear 38A is engaged with the drive gear 32A, which is rotatably supported on the support member 28A.

The rotation of the drive gear 32A is transmitted to the follower gear 38A to thereby rotate the feed screw 34A, which is secured to the follower gear 38A. The rotation of the feed screw 34A moves the nut member 36A, which is engaged with the feed screw 34A, along the feed screw 34A, thereby sliding the cleaning liquid supply pipe 18A.

Figure 2:
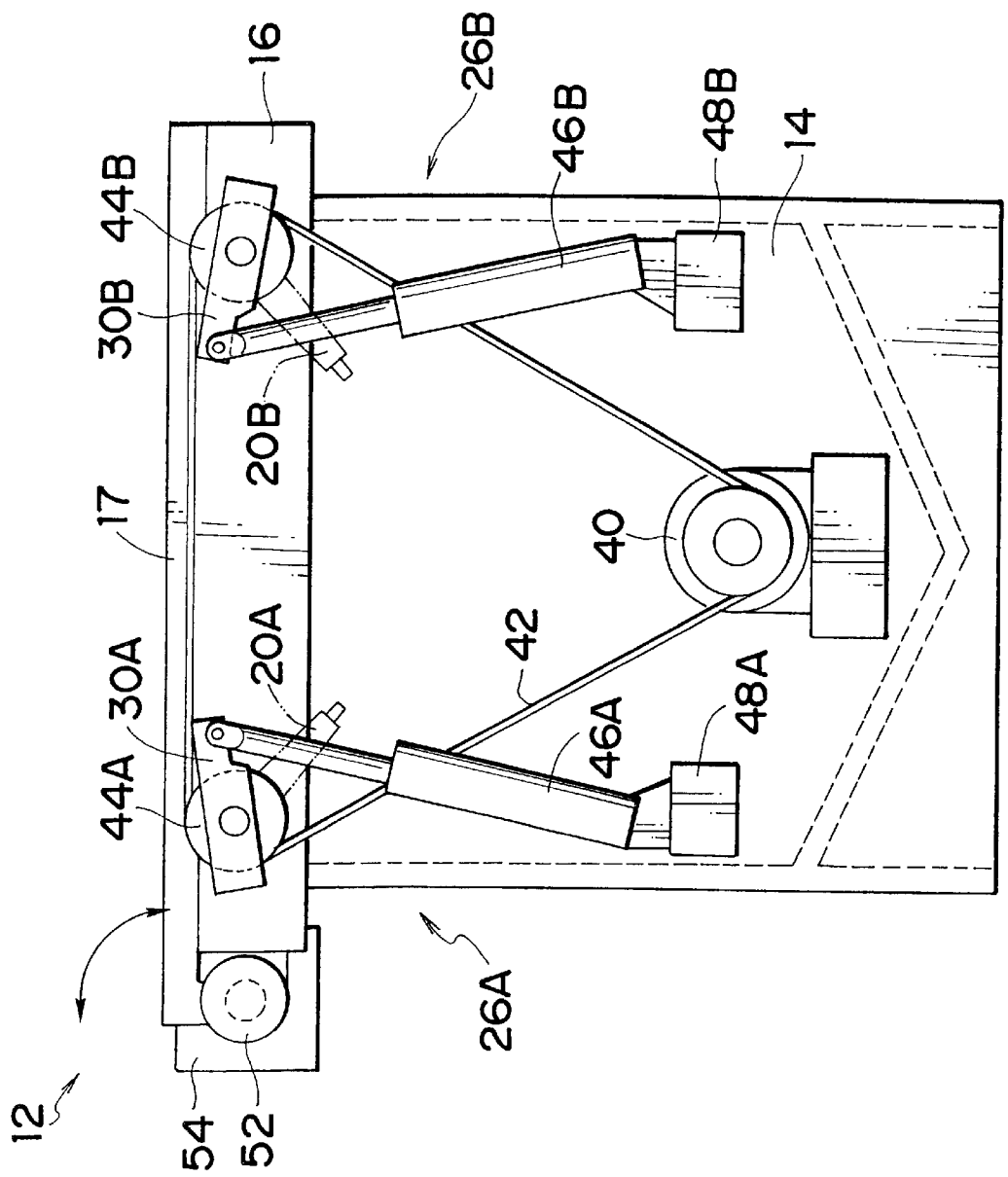
FIG. 2 is a front view illustrating the structure of a rough cleaning apparatus.
Figure 3:
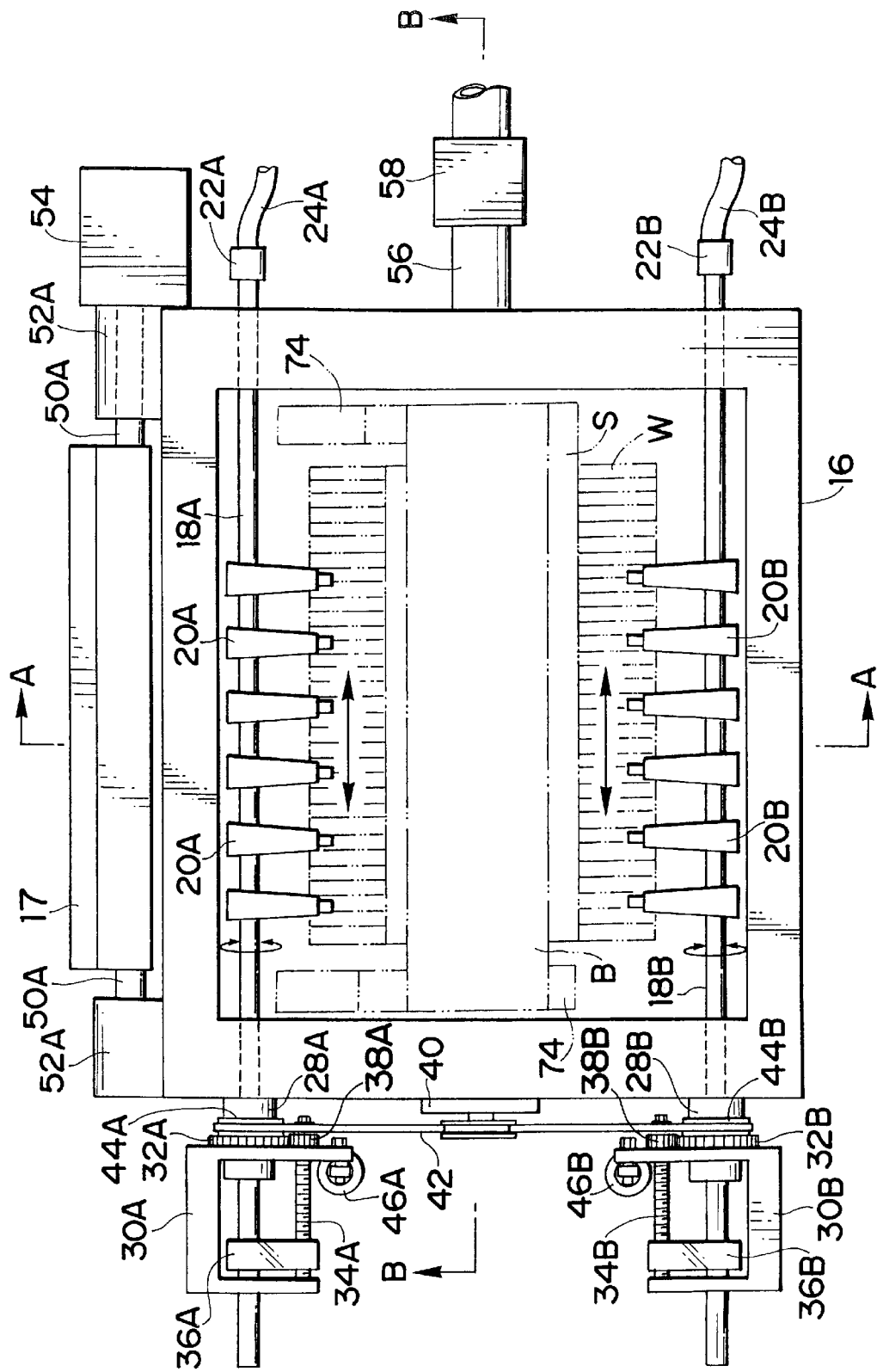
FIG. 3 is a plan view illustrating the rough cleaning apparatus.

As shown in FIG. 2, the rotation of a motor 40, which is provided at the side of the cleaning tank 14, is transmitted to the drive gear 32A through a timing belt 42 to drive the drive gear 32A. A pulley 44A is integrated with the drive gear 32A so that the timing belt 42 can be wound on the pulley 44A.

The motor 40, which drives the drive gear 32A, is capable of rotating forward and backward, and the forward and backward rotations of the motor 40 reciprocate the cleaning liquid supply pipe 18A.

A description will be given of a mechanism for swinging the cleaning liquid supply pipe 18A.

As shown in FIG. 2, a pair of air cylinders 46A, 46B is supported at the side of the cleaning tank 14 through brackets 48A, 48B, respectively. The ends of the air cylinders 46A, 46B are connected to the body frames 30A, 30B of the swinging units 26A, 26B. Driving the pair of the air cylinders 46A, 46B and expanding and contracting the rods thereof cause the body frames 30A, 30B to rotate about the support members 28A, 28B.

The cleaning liquid supply pipes 18A, 18B are connected to the body frames 30A, 30B through the nut members 36A, 36B. For this reason, the cleaning liquid supply pipes 18A, 18B rotate in association with the rotation of the body frames 30A, 30B.

Running the motor 40 causes the cleaning liquid supply pipes 18A, 18B to reciprocate along the axis of the cleaning liquid supply pipes 18A, 18B, and driving the air cylinders 46A, 46B rotates the cleaning liquid supply pipes 18A, 18B. Since the nozzles 20A, 20B are provided at the cleaning liquid supply pipes 18A, 18B, the reciprocation and rotation of the cleaning liquid supply pipes 18A, 18B causes the nozzles 20A, 20B to reciprocate and rotate (swing vertically).

A description will hereunder be given of a method for roughly cleaning the wafer W in the rough cleaning apparatus 12 which is constructed in the above-mentioned manner.

The transport apparatus 9 transports the batched wafers W, which have been sliced by the wire saw 12, to the loading/unloading part 50 of the wafer manufacturing apparatus 1. The wafers W are loaded on the transfer chuck (not illustrated). The transfer chuck can hold both ends of the mounting plate M, to which the wafers W are adhered, and transport the wafers W vertically and reverse the wafers W.

The wafers W, which are held by the transfer chuck, are transferred to a position just above the rough cleaning apparatus 12. Then, the wafers W are transferred to a first lifter (not illustrated).

When the wafers W are transferred to the first lifter, a rotary actuator (not illustrated) is driven to open the lid 17 of the cleaning tank 14. When the lid 17 opens, the first lifter moves down vertically by a predetermined amount, causing the wafers W to be stored in the cleaning tank 14 of the rough cleaning apparatus 12.

When the wafers W are stored in the cleaning tank 14, the rotary actuator (not illustrated) is driven to close the lid 17. Then, the air cylinders 46A, 46B, which swing the nozzles 20A, 20B, are driven to move the nozzles 20A, 20B from positions indicated by long and two short alternate lines to positions indicated by solid lines in FIG. 4.

Figure 4:
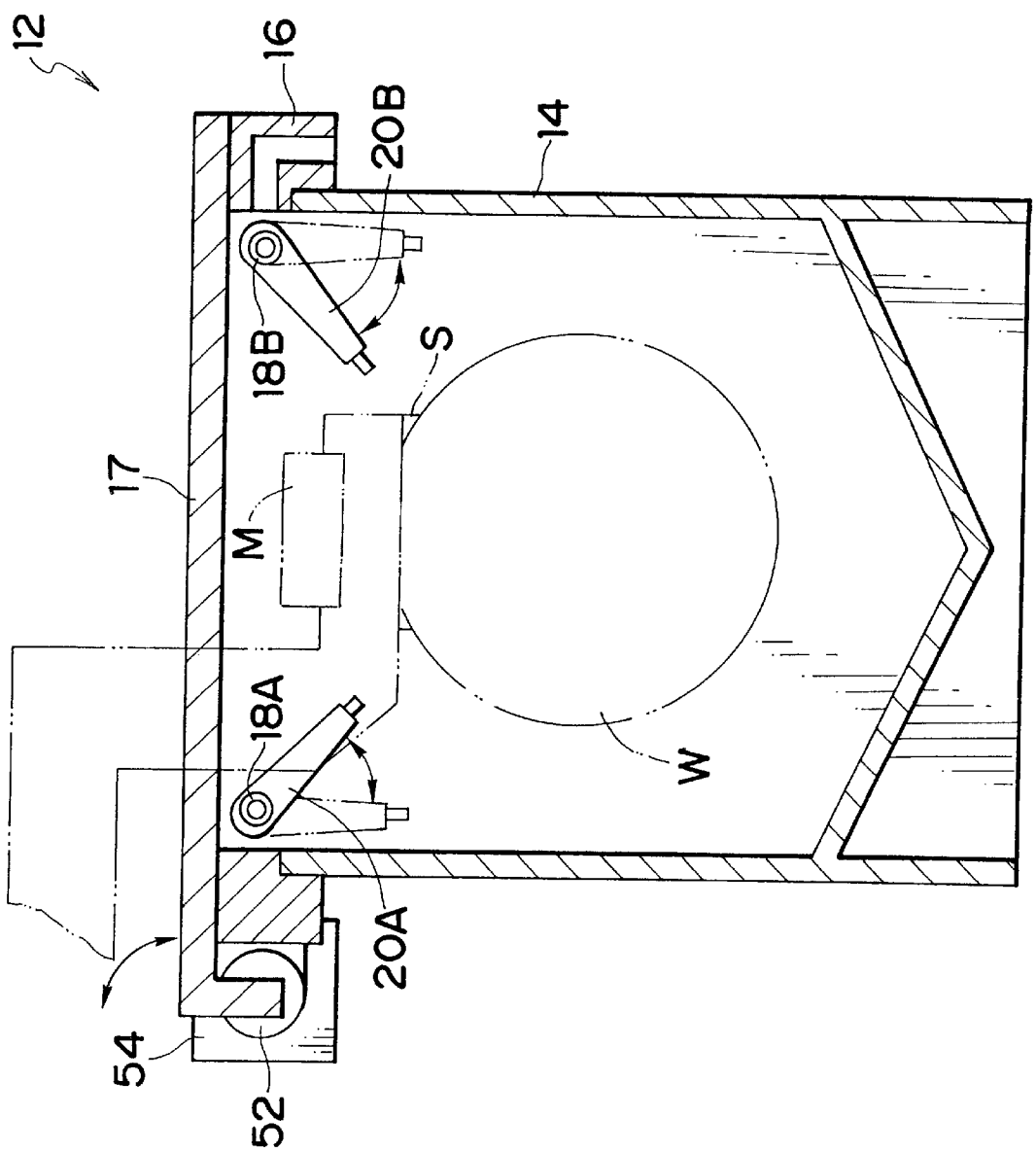
FIG. 4 is a sectional view taken along line A—A in FIG. 3.
Figure 5:
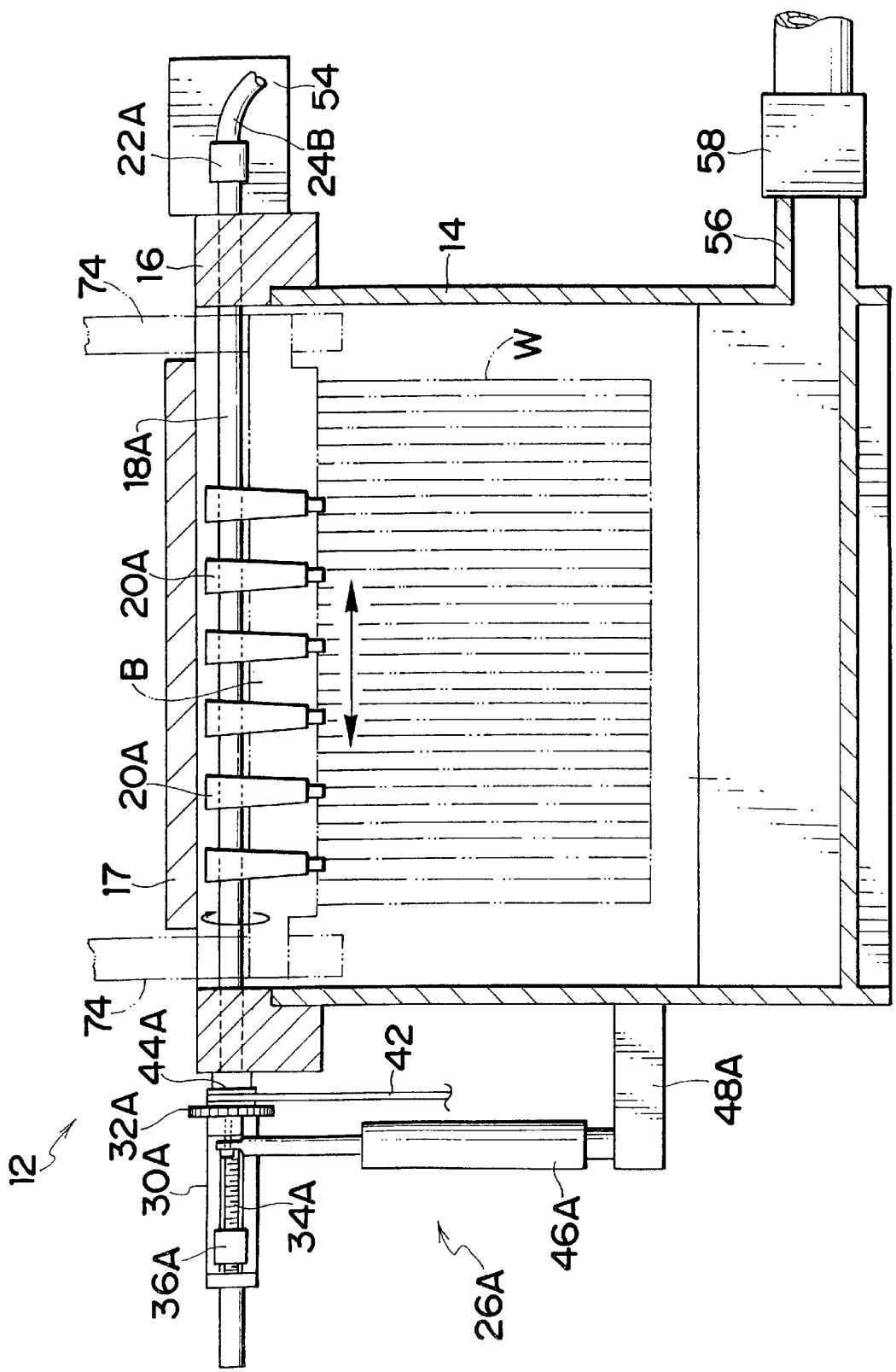
FIG. 5 is a sectional view taken along line B—B in FIG. 3.

Incidentally, the reason why the nozzles 20A, 20B are moved back to the positions indicated by the long and two short alternate lines in FIG. 4 when the wafers W are loaded is to prevent the wafers W, which are loaded from above the cleaning tank 14, from coming into contact with the nozzles 20A, 20B

The cleaning starts when the nozzles 20A, 20B reach the positions indicated by solid lines in FIG. 4. Specifically, the cleaning liquid supply apparatus (not illustrated) supplies the cleaning liquid to the cleaning liquid supply pipes 18A, 18B, and the cleaning liquid supplied to the cleaning liquid supply pipes 18A, 18B is jetted from the nozzles 20A, 20B. The wafers W stored in the cleaning tank 14 are showered by the cleaning liquid jetted from the nozzles 20A, 20B. The nozzles 20A, 20B are driven in a manner described below.

Running the motor 40 causes the nozzles 20A, 20B to reciprocate along the axis of the wafers W. Consequently, the cleaning liquid is jetted uniformly against the entire wafers W so that the wafers W can be cleaned completely. The cleaning liquid jetted from the nozzles 20A, 20B gets into the gaps between the wafers W and cleans the inside of the gaps because of its pressure.

The nozzles 20A, 20B continues to shower the wafers W for a predetermined period. After the passage of the predetermined time, the supply of the cleaning liquid is stopped to end the operation. The jetted cleaning liquid is collected at the bottom of the cleaning tank 14, and is discharged from an outlet 56.

After the showering, the air cylinders 46A, 46B are driven to move the nozzles 20A, 20B from the positions indicated by the solid lines to the positions indicated by the long and two short alternate lines in FIG. 4.

Then, the rotary actuator (not illustrated) is driven to open the lid 17 of the cleaning tank 14. When the lid 17 opens, the first lifter (not illustrated) is driven to lift, and therefore, the wafers W are unloaded from the cleaning tank 14.

Thus, the rough cleaning of the wafers W is completed. The wafers unloaded from the cleaning tank 14 are transferred to the transfer chuck (not illustrated), which reverses the wafers W. The transfer chuck transfers the wafers W to the individual wafer separation part 100.

A description will be given of the individual wafer separation part 100. The individual wafer separation part 100 separates the batched wafers W from the slice base mounting beam S individually.

Figure 6:
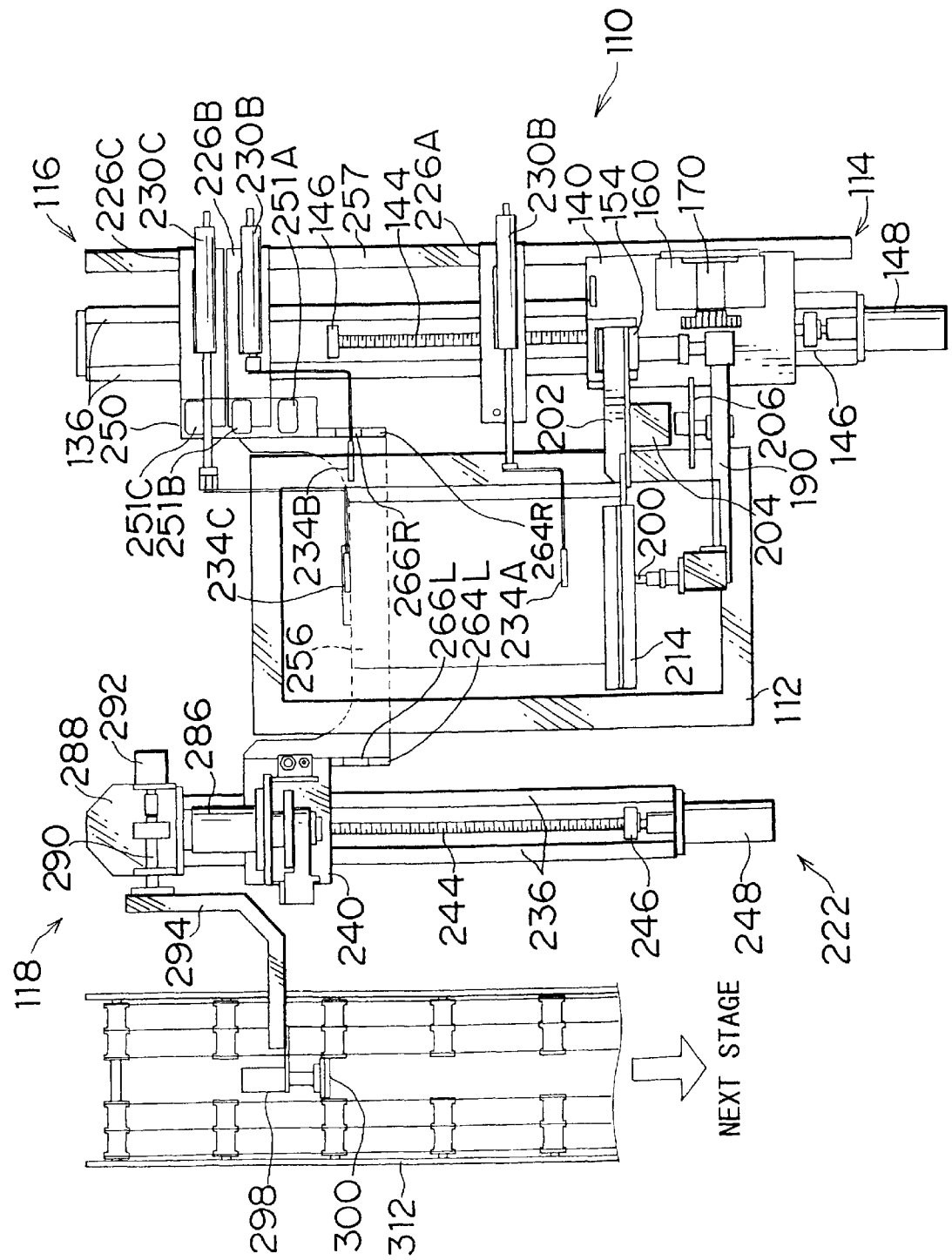
FIG. 6 is a plan view illustrating the structure of an individual wafer separation part.
Figure 7:
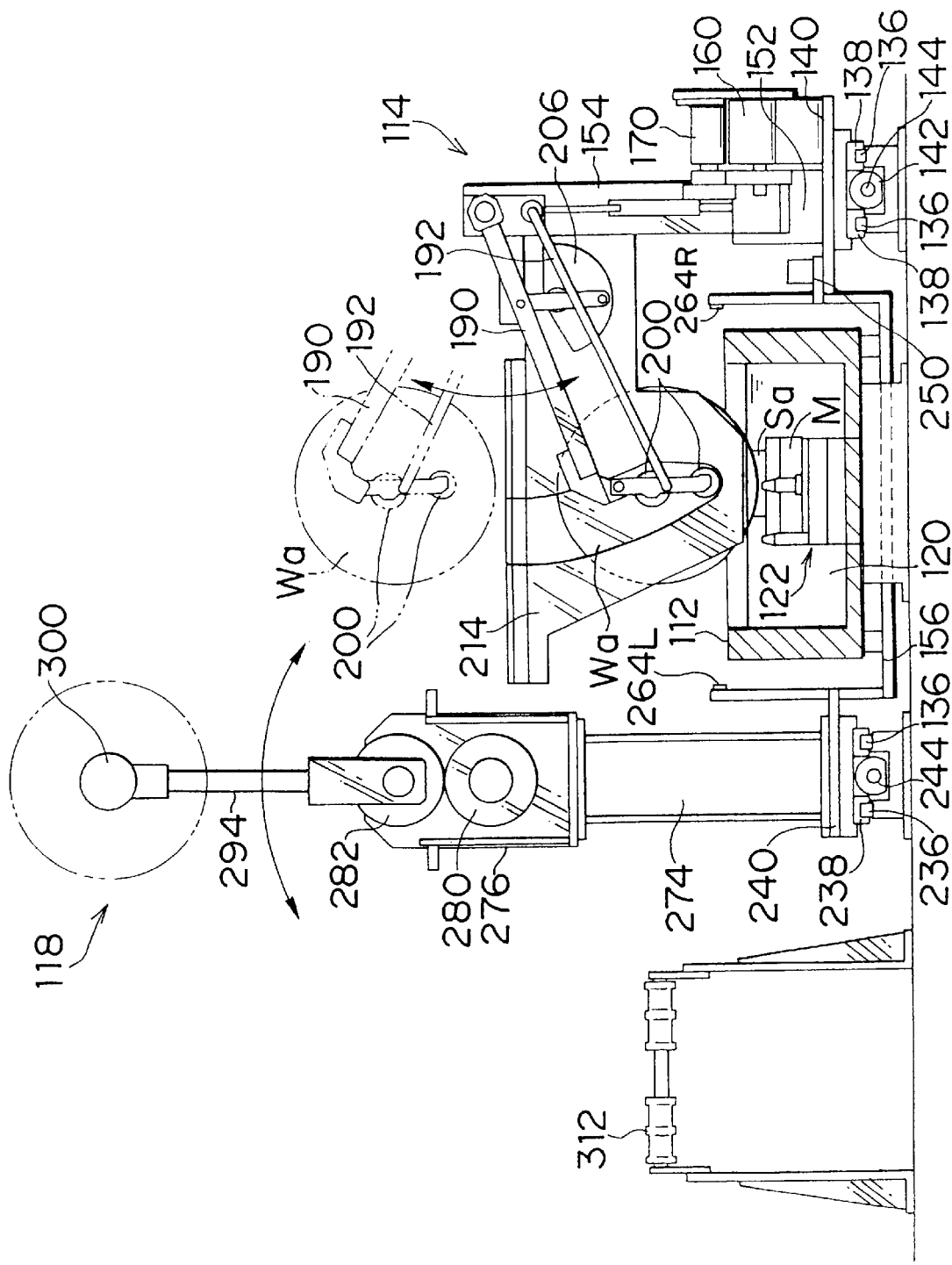
FIG. 7 is a plan view illustrating the structure of an individual wafer separation part.

FIGS. 6 and 7 are a plan view and a front view, respectively, illustrating the structure of the individual wafer separation part 100.

As shown in FIGS. 6 and 7, the individual wafer separation part 100 is provided with an individual wafer separation apparatus 110, which is comprised mainly of a hot water tank 112, an individual wafer separation apparatus 114, a partition apparatus 116 and a delivery apparatus 118.

First, a description will be given of the structure of the hot water tank 112. The hot water tank 112 is a rectangular box, and it contains hot water 120. Wafers Wa–Wc that will be separated from slice base mounting beams Sa–Sc are set in a workpiece holding part 112, which is provided in the hot water tank 112. Consequently, the slice base mounting beams Sa–Sc adhered to the wafers Wa–Wc are soaked in the hot water 120.

Figure 8:
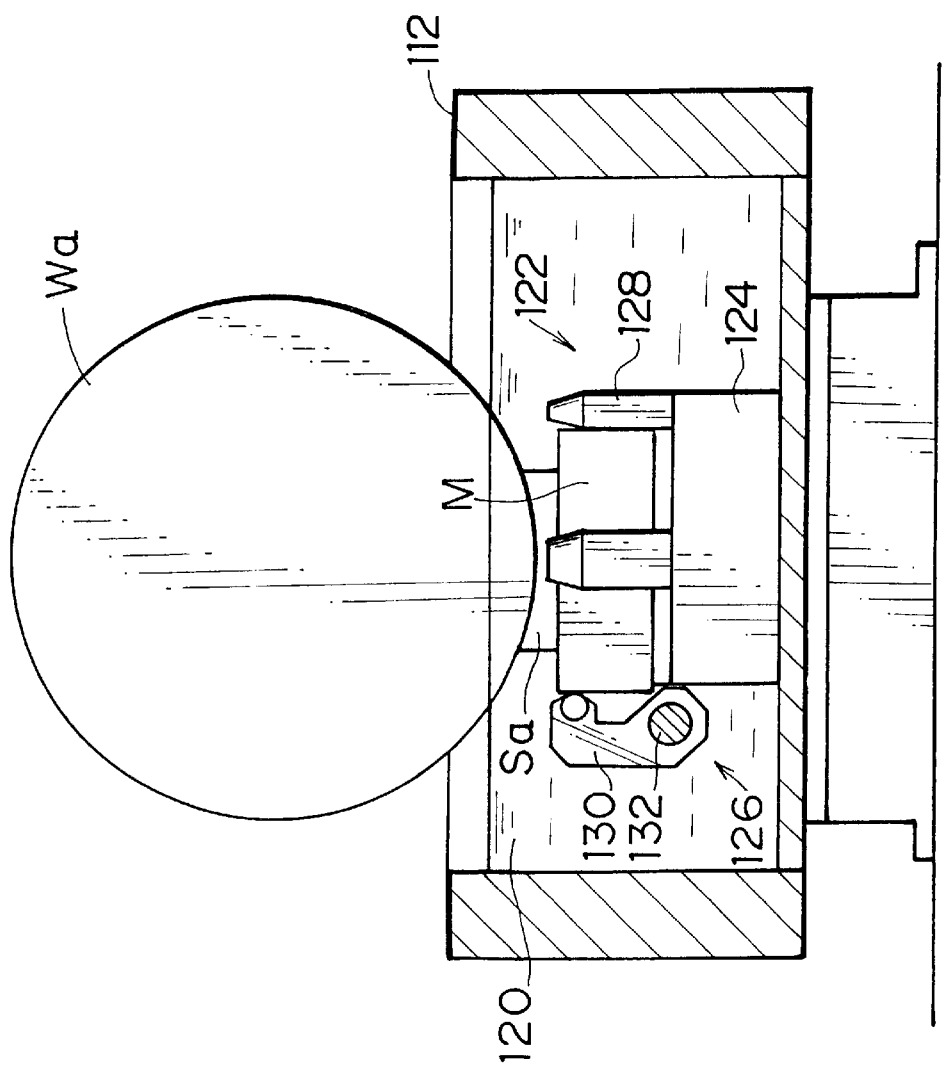
FIG. 8 is a front sectional view illustrating the structure of a hot water tank.
Figure 9:
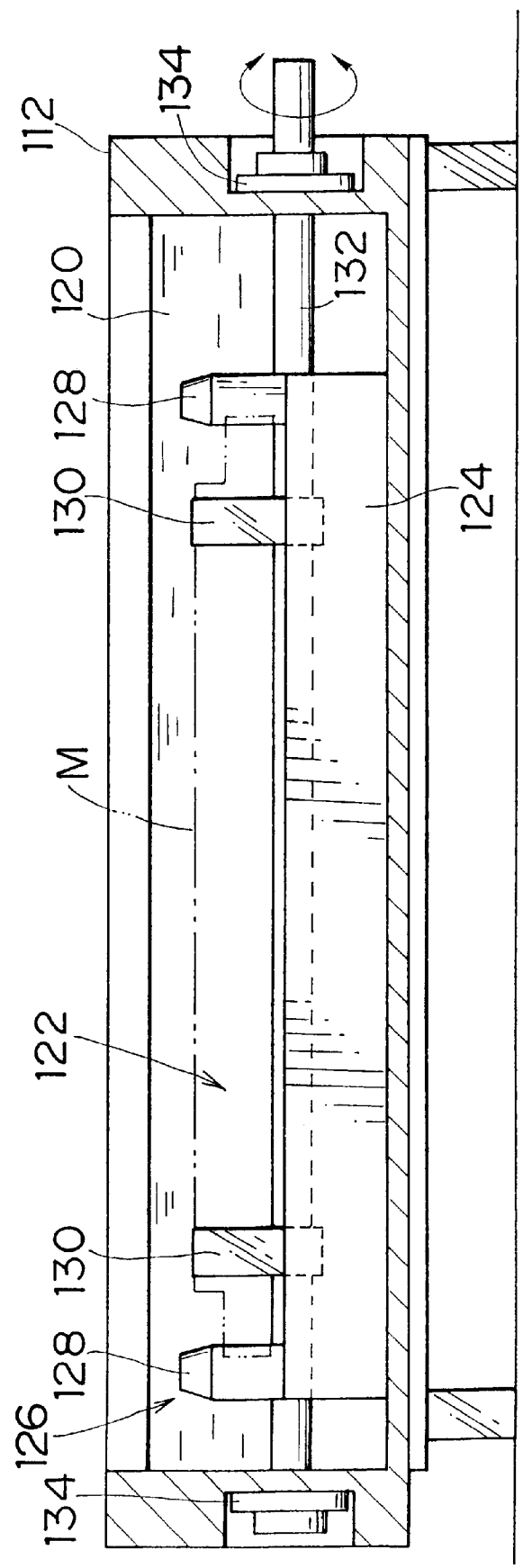
FIG. 9 is a side sectional view illustrating the structure of a hot water tank.

As shown in FIGS. 8 and 9, the workpiece holding part 122 consists of a table 124 on which the mounting plate M is placed, and a clamp unit 126 which clamps the mounting plate M placed on the table 124.

The clamp unit 126 consists of a pair of stopper pins 128, which stands on the table 124; and a pair of clamps 130 which are arranged to face the stopper pins 128.

The pair of clamps 130 is secured to a rotary shaft 132. Both ends of the rotary shaft 132 are rotatably supported by bearings 134 provided in the hot water tank 112. An air cylinder (not illustrated) connects to the rotary shaft 132 through an arm, and driving the air cylinder rotates the rotary shaft 132. The rotation of the rotary shaft 132 causes the clamps 130 to swing.

The wafers Wa–Wc are set in the workpiece holding part 122 as described below.

The wafers Wa–Wc, which have been roughly cleaned by the rough cleaning part 10, are reversed by the transfer chuck (not illustrated) and are transferred to the individual wafer separation part 14. Then, the wafers Wa–Wc are transferred to the second lifter (not illustrated) provided in the individual wafer separation part 14. The second lifter moves vertically with respect to the hot water tank 112, and places the received mounting plate M on the table 124 of the workpiece holding part 122 provided in the hot water tank 112. When the mounting plate M is placed on the table 124, the air cylinder (not illustrated) is driven to rotate the rotary shaft 132. The clamps 130 swing toward the stopper pins 128, and the swinging clamps 140 press the mounting plate M against the stopper pins 128 so that the mounting plate M can be clamped. Therefore, the wafers Wa–Wc are set at predetermined positions.

A description will be given of the structure of the individual separation apparatus 114. The individual wafer separation apparatus 114 separates the wafers Wa–Wc, which are set in the hot water tank 112, from the slice base mounting beams Sa–Sc one by one.

As shown in FIGS. 6–7, a pair of first guide rails 136 is arranged in proximity to the right side of the hot water tank 112 and in parallel with the hot water tank 112. A first slide table 140 is slidably supported on the first guide rails 136 through linear guides 138.

A nut member 142 is secured to the bottom of the first slide table 140. The nut member 142 is engaged with a screw 144, which is arranged between the first guide rails 136. Both ends of the screw 144 are rotatably supported by the bearings 146. One end of the screw 144 connects to the first feed motor 148 arranged at the ends of the first guide rails 136. Running the first feed motor 148 rotates the screw 144, causing the first slide table 140 to move along the first guide rails 136.

A separation unit 150 is provided on the first slide table 140 to separate the wafers Wa–Wc from the slice base mounting beams Sa–Sc. A description will be given of the structure of the separation unit 150.

Figure 10:
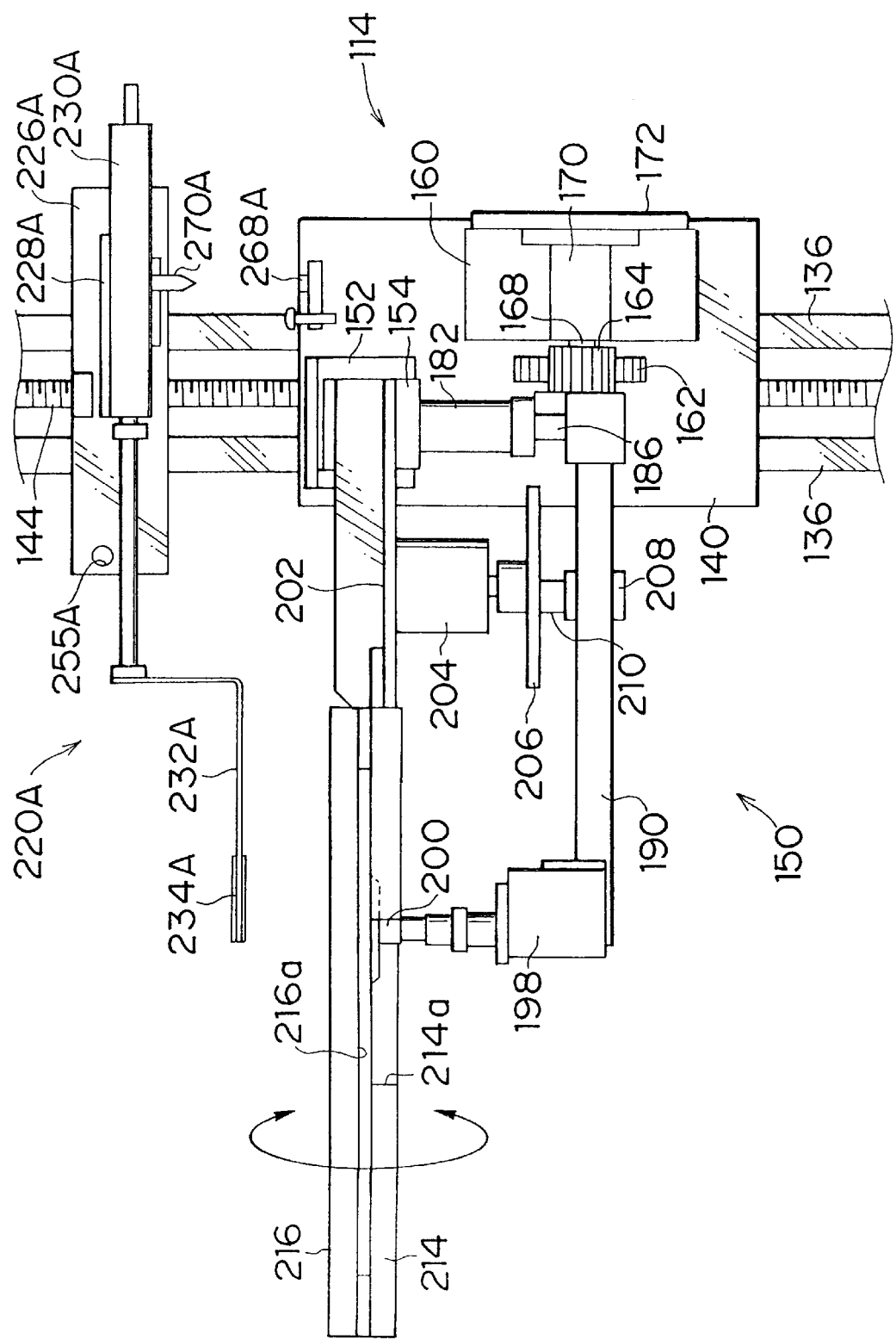
FIG. 10 is a plan view illustrating the structure of an individual wafer separation equipment.
Figure 11:
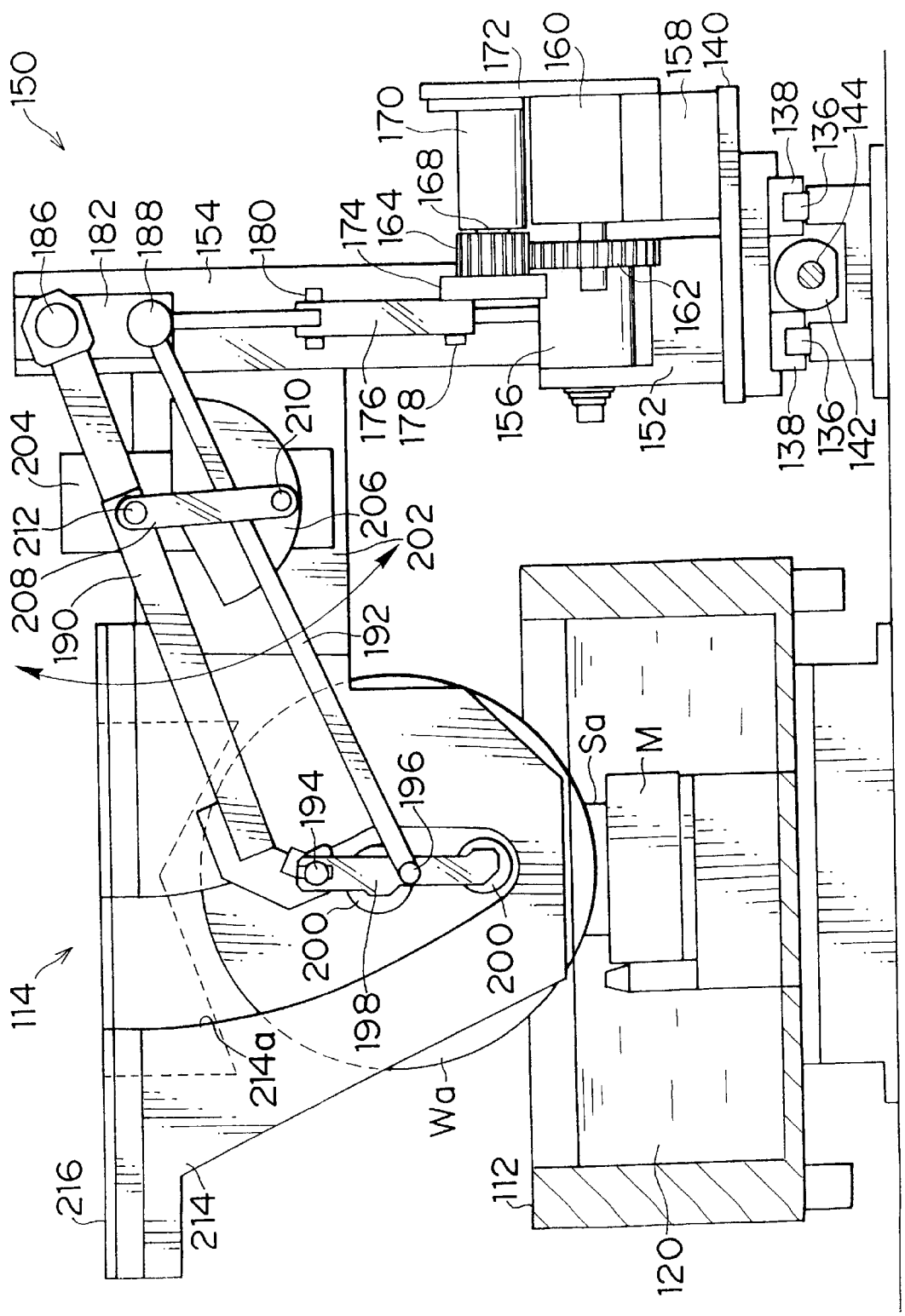
FIG. 11 is a front view illustrating the structure of an individual wafer separation equipment.
Figure 12:
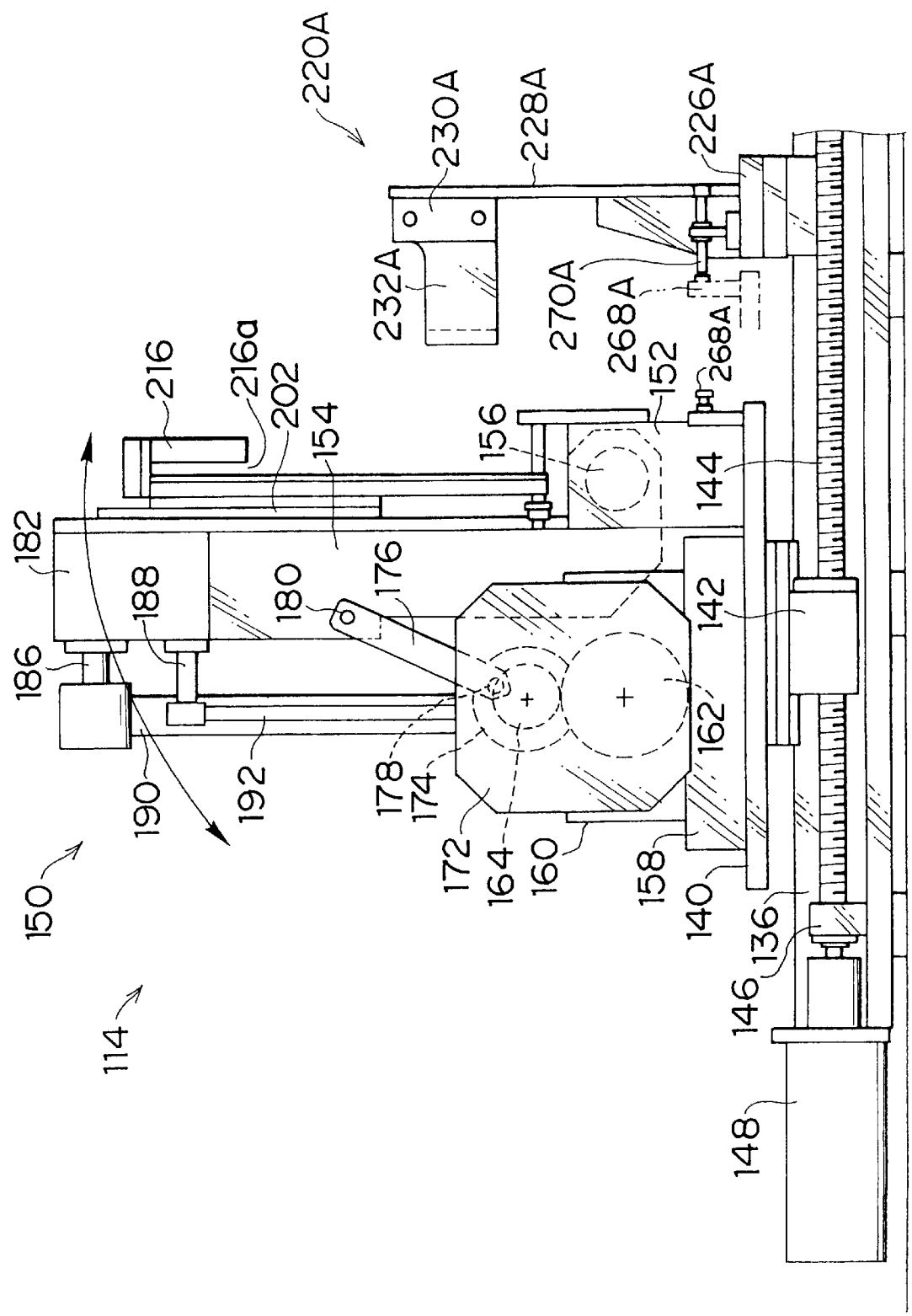
FIG. 12 is a side view illustrating the structure of an individual wafer separation equipment.

As shown in FIGS. 10–12, a bearing block 152 is provided on the first slide table 140, and a pivot 156, which is provided at the base end of a swinging frame 154, is swingably supported by the bearing block 152.

A swinging rotary actuator 160 is arranged on the first slide table 140 through a bracket 158, and a drive gear 162 is secured to an output shaft of the swinging rotary actuator 160. A follower gear 164 is engaged with the drive gear 162, and is secured to the end of the rotary shaft 168. The rotary shaft 168 is rotatably supported by a bearing member 170, which is supported on a support plate 172 fixed to the swinging rotary actuator 160.

A disc-shaped rotary plate 174 is coaxially secured to the follower bear 164, and one end of a connecting rod 176 connects to the rotary plate 174 through a pin 178. The other end of the connecting rod 176 connects to the swinging frame 154 through a pin 180.

Accordingly, driving the swinging rotary actuator 160 swings the pivot 156 about the pivot 156 provided at the base end of the swinging frame 154. In other words, driving the swinging rotary actuator 160 rotates the rotary plate 174 reciprocally within the range of 360°. The reciprocal rotations of the rotary plate 174 are transmitted to the swinging frame 154 through the connecting rod 176 to swing the swinging frame 154.

A bearing unit 182 is provided at the top end of the swinging frame 154, and two rotary shafts 186, 188 are rotatably supported by the bearing unit 182. Arms 190, 192 are secured to the ends of the rotary shafts 186, 188, respectively. The ends of the arms 190, 192 connect to a pad support plate 198 through pins 194, 196. A pair of separation vacuum pads 200 is arranged at a predetermined interval on the pad support plate 198. The pair of separation vacuum pads 200 vacuums and holds the wafers Wa–Wc.

A support plate 202 is attached to the back of the swinging frame 154, and a lifting rotary actuator 204 is arranged on the support plate 202. A fan-shaped rotary plate 206 is secured to an output shaft of the lifting rotary actuator 204. One end of the connecting rod 208 connects to the rotary plate 206 through a pin 210. The other end of the connecting rod 210 connects to the arm 190 through a pin 212.

Accordingly, driving the lifting rotary actuator 204 causes the separation vacuum pads 200, which are provided on the pad support plate 198, to move up and down. Specifically, driving the lifting rotary actuator 204 rotates the rotary plate 206 reciprocally within the range of 180°. The reciprocal rotations of the rotary plate 206 are transmitted to the arm 190 through the connecting rod 208, resulting in the vertical and reciprocal angular movements of the arm 190. The reciprocal angular movements of the arm 190 result in the reciprocal angular movements of the arm 192, which serves as a swinging lever. Consequently, the separation vacuum pads 200 provided on the pad support plate 198 move up and down.

As stated above, driving the lifting rotary actuator 204 moves up and down the separation vacuum pads 200, which vacuum and hold the wafers Wa–Wc.

Swinging the swinging frame 154 causes the pad support plate 198 provided with the separation vacuum pads 200, since they connect to the swinging frame 154 through the arms 190, 192.

In other words, driving the swinging rotary actuator 160 swings the separation vacuum pads 200 forward and backward, and driving the lifting rotary actuator 204 moves up and down the separation vacuum pads 200. The separation vacuum pads 200 separate the wafer Wa from the slice base mounting beam Sa as described below.

First, the separation vacuum pads 200 vacuum and hold the end face of the wafer Wa, which is set in the hot water tank 112. Then, the swinging rotary actuator 160 is driven to swing the separation vacuum pads 200 forward and backward (along the axis of the wafer).

An adhesive, which adheres the wafers Wa to the slice base mounting beam Sa, is sufficiently softened by heat since it is soaked in the hot water 120. For this reason, the wafers Wa can easily be separated from the slice base mounting beam Sa by swinging the separation vacuum pads 200 several times.

When the wafers Wa are separated from the slice base mounting beam Sa, the lifting rotary actuator 204 is driven to move up the separation vacuum pads 200, which are holding the separated wafers Wa. Then, the wafers Wa stop at a predetermined delivery position.

The wafers Wa, which has reached the delivery position, are delivered to a later-described delivery apparatus 118. Then, the delivery apparatus 118 transfers the wafer Wa to a shuttle conveyor 312, which transports the wafer Wa to the next step.

When the separation vacuum pads 200 finish transferring the wafer Wa, they are moved down by the lifting rotary actuator 204 and return to the original separating position. As stated above, the separation vacuum pads 200 swing the end faces of the wafers Wa–Wc to thereby separate the wafers Wa–Wc from the slice base mounting beams Sa–Sc. Some of the wafers Wa–Wc, however, are separated from the slice base mounting beams Sa–Sc before the separation vacuum pads 200 swing the end faces of the wafers Wa–Wc. In this case, the wafers Wa–Wc may fall forward, and therefore, they cannot be collected. To solve this problem, a stopper plate 214 is arranged in front of the wafers Wa–Wc in order to prevent the wafers Wa–Wc from falling forward. The stopper plate 214 is attached to the support plate 202 provided with the lifting rotary actuator 204, and the stopper plate 214 swings with the separation vacuum pads 200.

The separation vacuum pads 200 move up and down through a passage 214a formed in the stopper plate 214.

A double separation prevention plate 216 is secured to the top of the stopper plate 214. The wafers Wa–Wc, which have already been separated from the slice base mounting beams Sa–Sc, are transferred to a predetermined delivery position through a slit 216a formed in the double separation prevention plate 216.

The slit 216a is formed in such a size that only one wafer can pass through.

When two wafers are separated at the same time, it is possible to prevent the attached two wafers from being simultaneously transferred to the delivery position.

Even if the two wafers are separated at the same time from the slice base mounting beam and they are attached to each other, the second wafer attached to the first wafer falls without passing through the slit 216a so that the wafers can be transferred to the delivery position one by one. The wafer, which falls without passing through the slit 216a, can be prevented from falling forward by the stopper plate 214, and thus, the wafer can be collected without fail for the next separation.

A description will be given of the partition apparatus 116. The partition apparatus 116 inserts partitions between the wafer lots Wa–Wc, which are set in the hot water tank 12, and detects the inserted partitions during the separation of the wafers Wa–Wc, thereby recognizing the boundaries between the lots. The partition apparatus 116 consists of three partition units 220A, 220B, 220C; a drive unit 222 which drives the partition units 220A–220C; a connecting unit 224 which connects the drive unit 222 to the partition units 220A–220C; and a brake unit 225 which fixes the partition units 220A–220C at a predetermined position.

First, a description will be given of the structure of the partition units 220A–220C. As shown in FIG. 6, three slide plates 226A, 226B, 226C are slidably supported on the first guide rails 136, on which the individual wafer separation apparatus 114 is placed.

Figure 13:
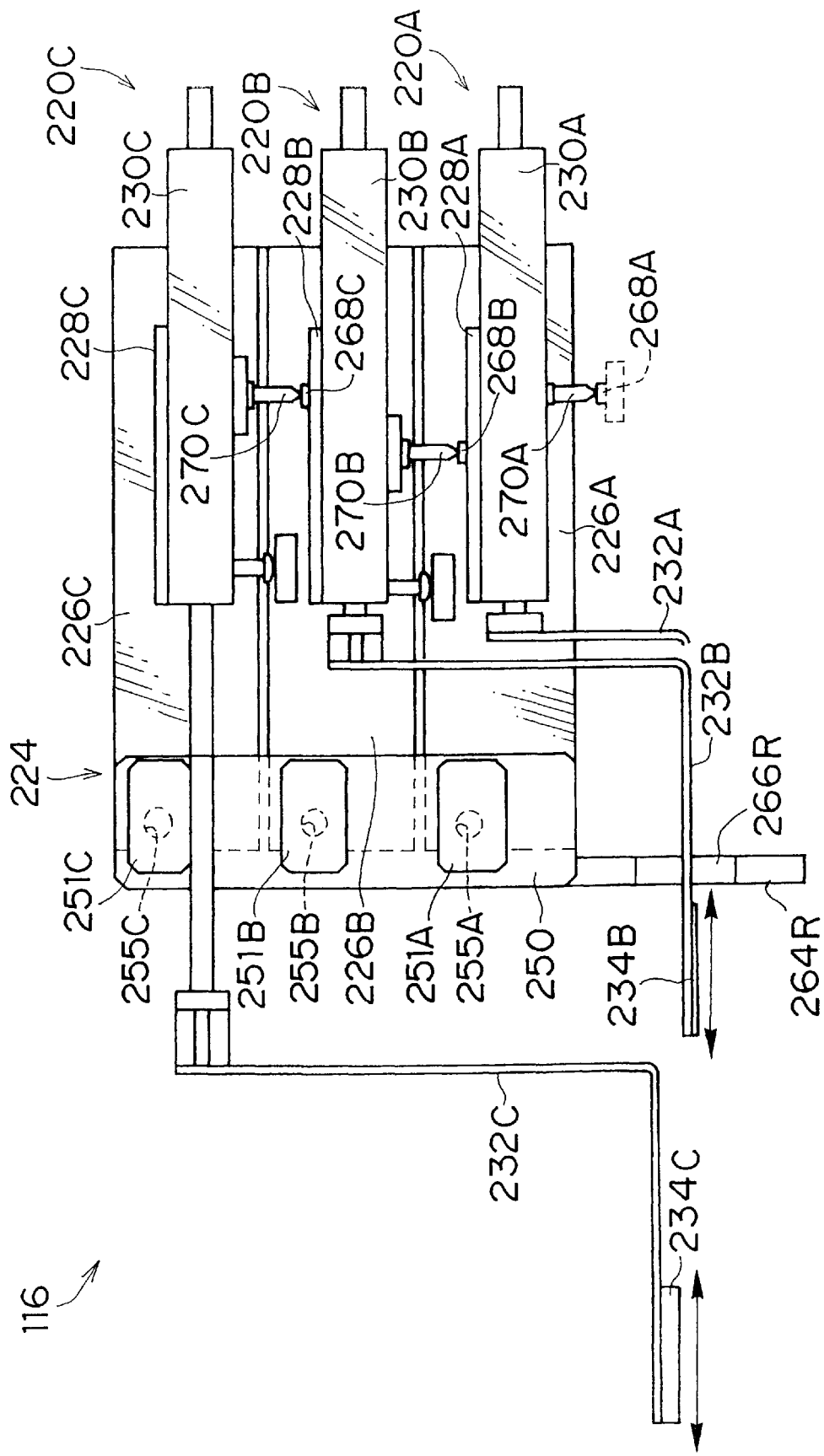
FIG. 13 is a plan view illustrating the structure of a partition unit.
Figure 14:
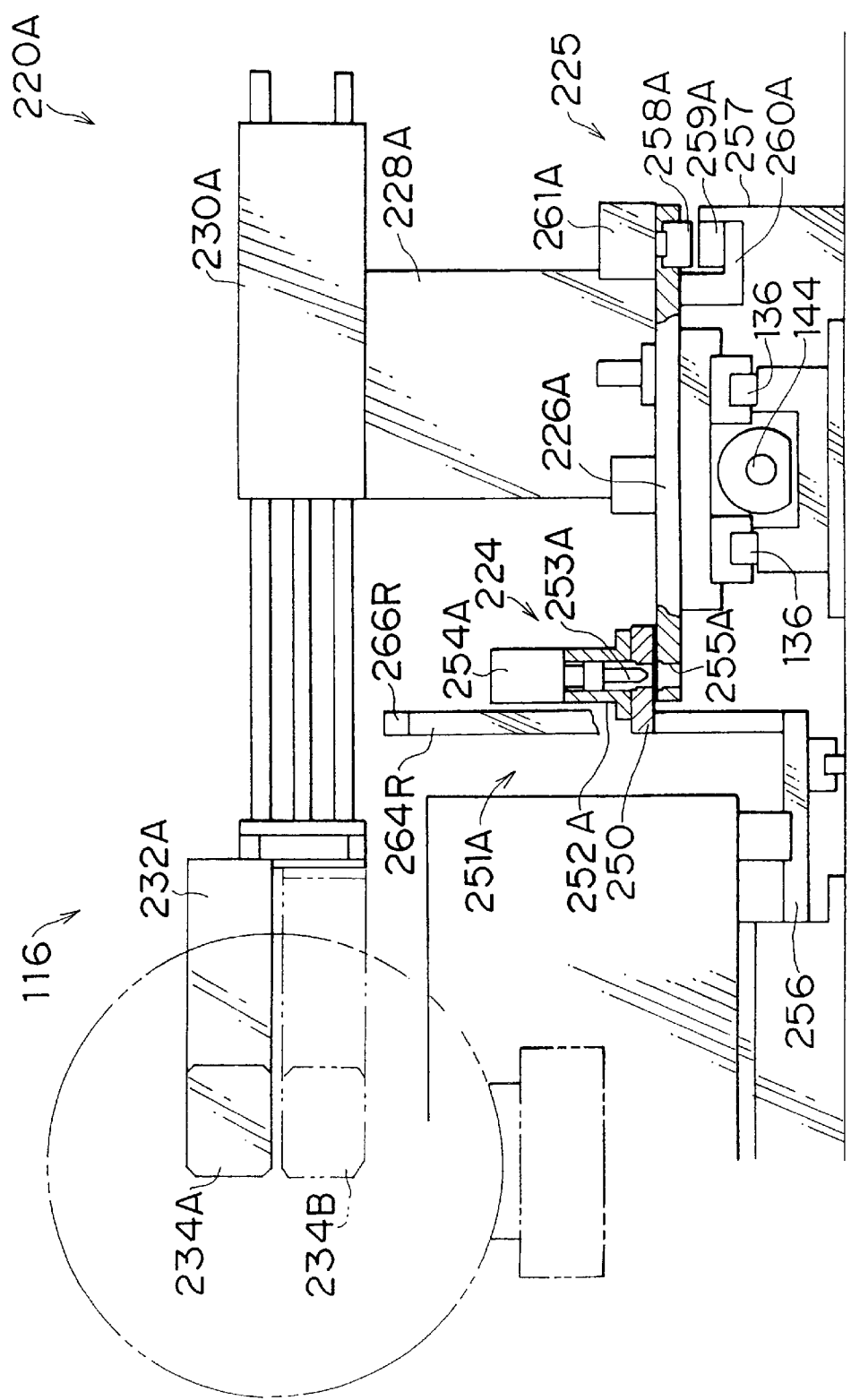
FIG. 14 is a front view illustrating the structure of a partition unit.

As shown in FIGS. 13 and 14, the support plates 228A–228C stand vertically on the slide plates 226A–226C, and cylinders 230A–230C are horizontally supported at the tops of the support plates 228A–228C. L-shaped connecting arms 232A–232C are secured to the ends of the cylinders 230A–230C, and partitions 234A–234C are secured to the ends of the connecting arms 232A–32C.

Driving the cylinders 230A–230C moves the partitions 234A–234C forward and backward, and controlling the driving of the cylinders 230A–230C controls the insertion and extraction of the partitions 234A–234C. In other words, the partitions 234A–234C are inserted between the wafers Wa–Wc by expanding the rods of the cylinders 230A–230C. The partitions 234A–234C are extracted from the wafers Wa–Wc by contracting the rods.

The length and vertical positions of the arms 232A and 232B are set so that the first partition 234A can be flush with the second partition 234B when the slide plates 226A are spliced together (see FIG. 13).

The length of the arm 232C is set so that the third partition 234C can be arranged just behind the first partition 234A and the second partition 234B.

The partition units 220A–220C are constructed as described above. The partition units 220A, 220B, 220C will hereinafter be referred to as the first, second and third partition units 220A, 220B, 220C, respectively. The cylinders 230A–230C and the partitions 234A–234C will be referred to in the same manner.

A description will be given of the structure of the drive unit 222, which moves the partition units 220A, 220B, 220C along the first guide rails 136.

Figure 15:
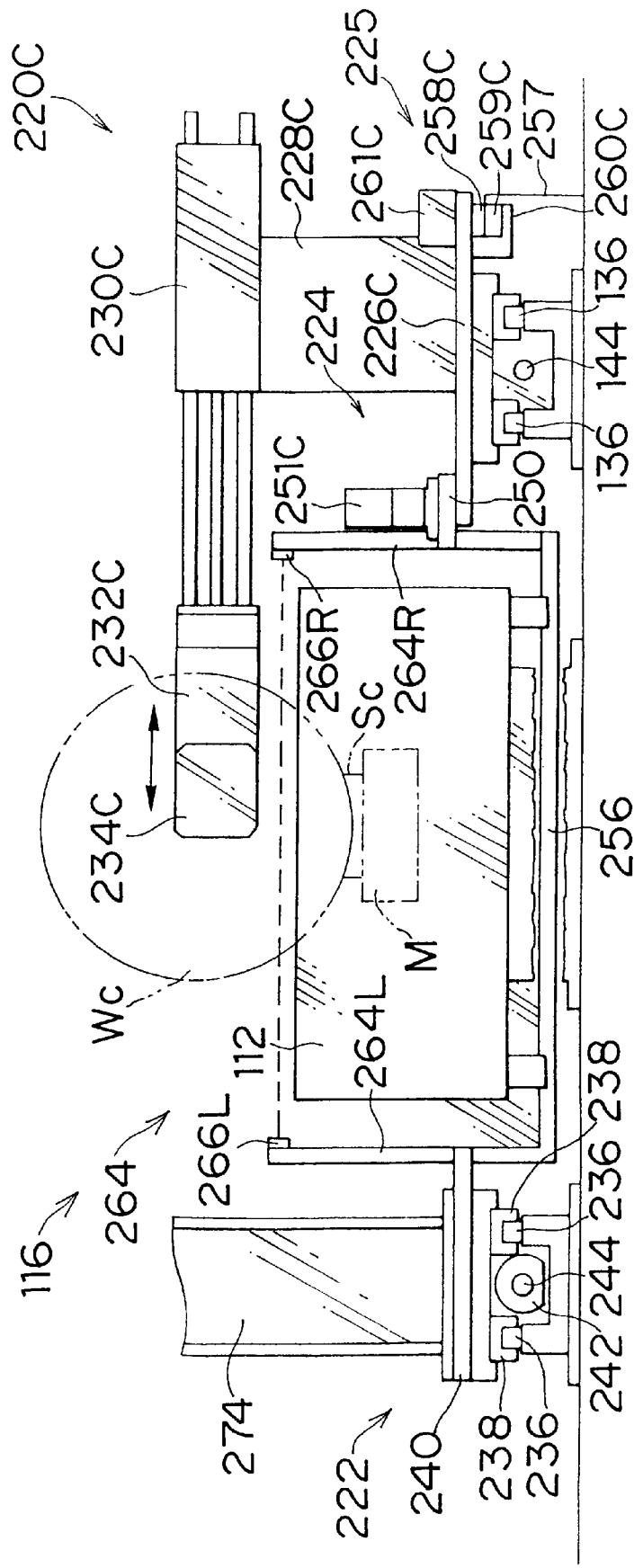
FIG. 15 is a front view illustrating the structure of a partition apparatus.

As shown in FIGS. 6 and 15, a pair of second guide rails 236 is arranged in proximity to the left side of the hot water tank 112 and in parallel with the hot water tank 112. A second slide table 240 is slidably supported on the second guide rails 236 through linear guides 238.

A nut member 242 is secured to the bottom of the second slide table 240, and the nut member 242 is engaged with a screw 244 arranged between the second guide rails 236. Both ends of the screw 244 are rotatably supported by bearing members 246. One end of the screw 244 connects to a second feed motor 248, which is arranged at one end of the second guide rails 236. Running the second feed motor 248 rotates the screw 244, which causes the second slide table 240 to move along the second guide rails 236.

A description will be given of the structure of a connection unit 224, which connects the drive unit 222 to the partition units 220A–220C.

As shown in FIGS. 13 and 14, a rectangular connection plate 250 is arranged above the ends of the slide plates 226A–226C at a predetermined interval. Three pin insertion apparatuses 251A, 251B, 251C are arranged at regular intervals on the connection plate 250.

The pin insertion apparatuses 251A–251C drive pin insertion cylinders 254A–254C to project connection pins 253A–253C, which are inserted into guide pin bushes 252A–252C, from the bottom of the connection plate 250. The connection pins 253A–253C projected from the bottom of the connection plate 250 are inserted into the connection pin holes 255A–255C formed in the slide plates 226A–226C so that the connection plate 250 can connect to the slide plates 226A–226C.

As shown in FIGS. 6 and 15, the connection plate 250 of the connection unit 224 connects to the second slide table 240 of the drive unit 222 through a connection lever 256. The connection plate 250 moves with the second slide table 240.

In the state wherein the connection plate 250 connects to the slide plates 226A–226C, in other words, in the state wherein the connection pins 253A–253C are inserted into the connection pin holes 255A–255C of the slide plates 226A–226C, the second slide table 240 is moved to move the slide plates 226A–226C. Moving the slide plates 226A–226C moves the partitions 234A–234C along the axis of the wafers Wa–Wc set in the hot water tank 112.

The connection bar 256 is arranged in a space below the hot water tank 112, and it moves within the space.

A description will be given of the structure of the brake unit 225, which fixes the partition units 220A–220C.

As shown in FIG. 6, a brake plate 257 is arranged in proximity to the sides of the first guide rails 136 and in parallel with the first guide rails 136. As shown in FIG. 14, the end of the brake plate 257 is bent horizontally in a reverse L-shape.

On the other hand, pairs of brake pads 258A–258C and 259A–259C are arranged at the slide plates 226A–226C across a flat part of the brake plate 257 (FIG. 14 only shows the structure of the brake unit in the first partition unit 220A). The lower brake pads 259A–259C are fixed to the slide plates 226A–226C through a support member 260. On the other hand, the upper brake pads 258A–258C are fixed to the ends of the rods of brake cylinders 261A–261C placed o the slide plates 226A–226C. Driving the brake cylinders 261A–261C causes the upper brake pads 258A–258C to project from the bottoms of the slide plates 226A–226C.

In the brake unit 225, which is constructed in the above-mentioned manner, the brake cylinders 261A–261C are driven so that the brake pads 258A–58C and 259A–259C can pinch the brake plate 257. Consequently, the partition units 220A–220C are fixed.

The movable partitions 234A–234C are inserted between the wafer lots Wa–Wc so that the boundaries between the lots can be recognized. In order to automatically insert the partitions 234A–234B between the wafer lots Wa–Wc, it is necessary to automatically detect the boundaries between the wafer lots Wa–Wc.

Accordingly, the partition apparatus 116 is provided with a lot detecting unit 264, which detects the boundaries between the wafer lots Wa–Wc automatically. The lot detecting unit 264 is constructed as described below.

As shown in FIGS. 6 and 15, a pair of support frames 264R, 264L stands vertically across the hot water tank 112 on the connecting bar 256 which connects the connection unit 224 to the drive unit 222.

A light projecting sensor 266L is provided at the top of the support frame 264L, and a light receiving sensor 266R is provided at the top of the support frame 264R.

The light projecting sensor 266L and the light receiving sensor 266R are arranged to face one another. The light receiving sensor 266R receives the light that is projected by the light projecting sensor 266L.

As shown in FIG. 13, the light projecting sensor 266L and the light receiving sensor 266R are arranged in such a way as to be flush with the first partition plate 234A when the slide plates 226A–226C are spliced together.

The lot detecting unit 264 detects the boundaries between the wafer lots Wa–Wc as described below.

The lot detecting unit 264 is arranged on the connecting bar 256, and thus, the lot detecting unit 264 is moved along the axis of the wafers Wa–Wc by moving the second slide table 240 of the drive unit 222.

Figure 16:
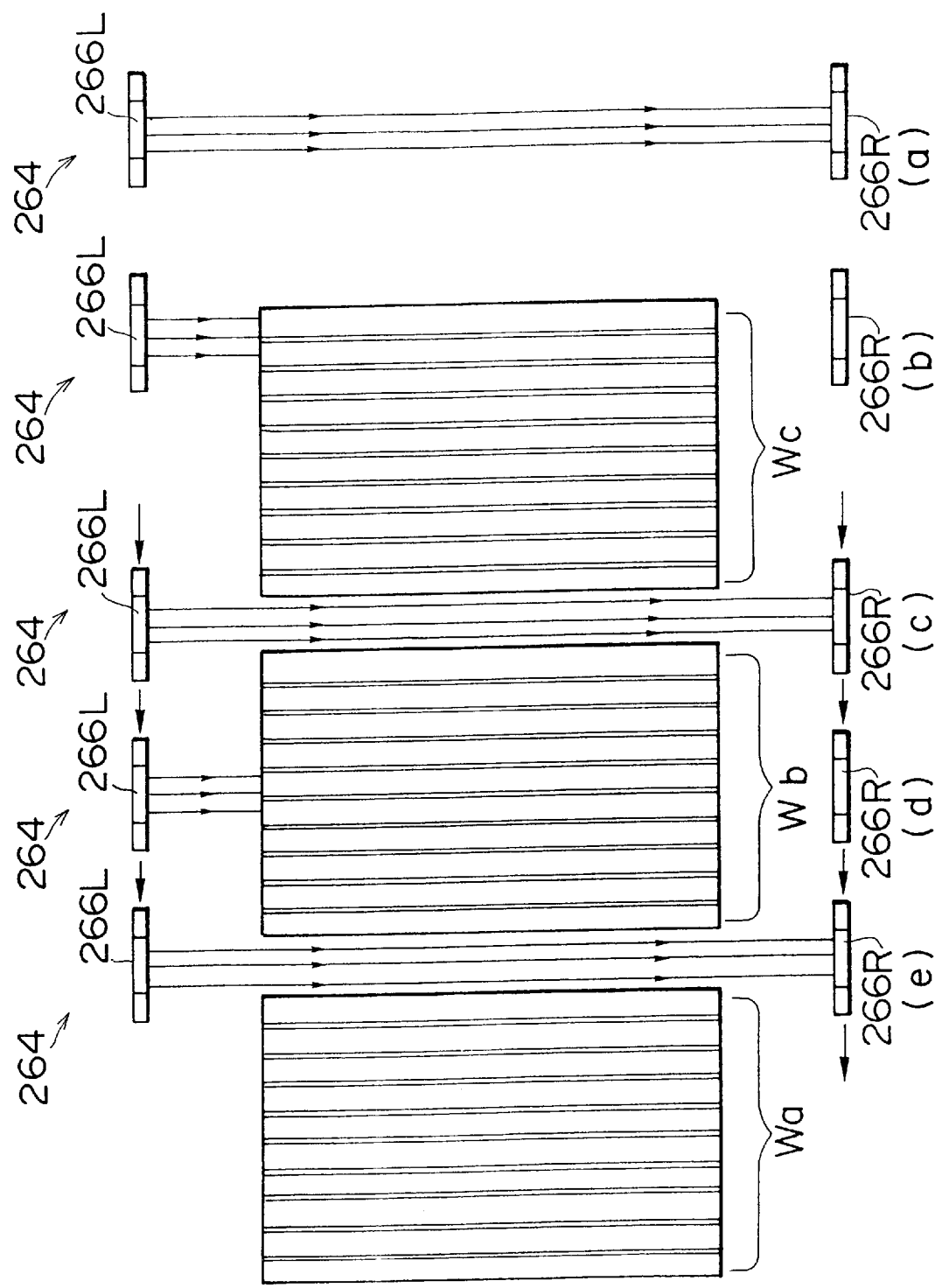
FIG. 16 is a view of assistance in explaining the operation of a partition apparatus.

As shown in FIG. 16, the lot detecting unit 264 is positioned behind the wafers Wc (the third lot) (a position (a) in FIG. 16). Then, the light projecting sensor 266L projects a light toward the light receiving sensor 266R. The light receiving sensor 266L receives the light directly from the light projecting sensor 266L since nothing blocks the light.

Then, the second slide table 240 of the drive unit 222 is moved to thereby move the lot detecting unit 264 along the axis of the wafers Wa–Wc. Consequently, the wafers Wc (the third lot) block the light projected by the light projecting sensor 266L, and the light receiving sensor 266R receives no light (a position (b) in FIG. 16).

A control unit (not illustrated) stops moving the second slide table 240 when it detects that the light receiving sensor 266R does not receive any light. Then, the control unit inserts the partition 234C. The partition 234C is inserted as described later in detail.

After the insertion of the partition plate 234C, the control unit moves the second slide table 240 again, and moves the lot detecting unit 264 along the axis of the wafers Wa–Wc.

Even if the second slide table 240 is moved as stated above, the wafers Wc block the light projected by the light projecting sensor 266L, and the light receiving sensor 266R does not still receive the light.

Since there is a predetermined interval between the third lot and the second lot, however, the light receiving sensor 266R starts receiving the light again when the lot detecting unit 264 passes a position between the third lot and the second lot (a position (c) in FIG. 16). The control unit stops moving the second slide table 240 when it detects that the light receiving sensor 266R starts receiving the light again and the light is blocked by the wafers Wb again. Then, the control unit inserts the partition plate 234B.

After the insertion of the partition 234B, the control unit (not illustrated) moves the second slide table 240 to thereby move the lot detecting unit 264 along the axis of the wafers Wa–Wc.

When the lot detecting unit 264 passes the position between the third lot and the second lot, the wafers Wb (the second lot) block the light emitted by the light projecting sensor 266L, and thus, the light receiving sensor 266R does not receive the light (a position (d) in FIG. 16).

Since there is a predetermined interval between the second lot and the first lot, however, the light receiving sensor 266R starts receiving the light again when the lot detecting unit 264 passes a position between the second lot and the first lot (a position (e) in FIG. 16). The control unit stops moving the second slide table 240 when it detects that the light receiving sensor 266R starts receiving the light again and the light is blocked by the wafers Wa again. Then, the control unit inserts the partition 234A.

As stated above, the lot detecting unit 264 detects the boundaries between the wafer lots Wa–Wc by detecting the light, which is emitted by the light projecting sensor 266L, by means of the light receiving sensor 266R. In accordance with the detection results of the lot detecting unit 264, the partitions 234A–234C are inserted between the wafers Wa–Wc.

The light emitted by the light projecting sensor 266L is wider than the intervals between the wafers (the width of kerf losses) and is narrower than the intervals between the wafer lots. Accordingly, even if the light receiving sensor detects the light which has passed through the gap between the wafers, it is possible to prevent the erroneous detection based on the fact that the light receiving sensor 266R has not received all the light projected by the light projecting sensor 266L.

In this case, a plurality of projecting sensors 266L may be arranged horizontally (the intervals between the projecting sensors are smaller than the interval between the wafer lots), and a plurality of light projecting sensors 266R may be arranged opposite to the projecting sensors 266L. It is possible to prevent the erroneous detection by detecting the boundaries between the wafer lots Wa–Wc based on the detection that all the light receiving sensors 266R have received the light.

The boundaries between the wafer lots Wa–Wc are detected in the above-mentioned manner, and the partitions 234A–234C are inserted between the wafer lots Wa–Wc. A mechanism below detects the partitions 234A–234C that are inserted between the wafer lots Wa–Wc.

As shown in FIGS. 10, 12 and 13, a first contact 268A is provided on the first slide table 140 of the individual wafer separation apparatus 114. On the other hand, a first touch sensor 270A is provided on a slide plate 226A of the first partition unit 220A, and the first touch sensor 270A contacts with the first contact 268A.

A second contact 268B is provided on the slide plate 226A of the first partition unit 220A. A second touch sensor 270B is provided on a slide plate 226B of the second partition unit 220B, and the second touch sensor 270B contacts with the second contact 268B.

A third contact 128C is provided on the slide plate 226B of the second partition unit 220B. A third touch sensor 270C is provided on a slide plate 226C of the third partition unit 220C, and the third touch sensor 270C contacts with the third contact 268C.

The control unit (not illustrated) receives operation signals from the touch sensors 270A–270C to thereby detect the partitions 234A–234C inserted between the wafer lots Wa–Wc.

Specifically, moving the first slide table 140 moves the separation vacuum pads 200, which separate the wafers, along the axis of the wafers Wa–Wc. When the separation vacuum pads 200 reach the set position of the first partition 234A, the first contact 268A set on the first slide table 140 comes into contact with the first touch sensor 270A, which is provided on the slide plate 226A. When the first touch sensor 270A contacts with the first contact 268A, it starts operating. The control unit detects the first partition 234A in response to an operation signal from the first touch sensor 270A.

If the first slide table 140 is further moved in order to move the separation vacuum pad 200 after the detection of the first partition 234A, the first slide table 140 presses and moves the slide plate 226A. When the separation vacuum pads 200 reach the set position of the second partition plate 234B, the second contact 268B set on the slide plate 226A comes into contact with the second touch sensor 270B set on the slide plate 226B. When the second touch sensor 270B contacts with the second contact 268B, it starts operating. The control unit detects the second partition 234B in response to an operation signal from the second touch sensor 270B.

If the first slide table 140 is further moved to move the separation vacuum pad 200 after the detection of the second partition 234B, the slide plate 226B is pressed and moved by the slide plate 226A, which is pressed and moved by the first slide table 140. When the separation vacuum pads 200 reach the set position of the third partition 234C, the third contact 268C set on the slide plate 226B comes into contact with the third touch sensor 270C set on the slide plate 226C. When the third touch sensor 270C contacts with the third contact 268C, it starts operating. The control unit detects the third partition 234C in response to an operation signal from the third touch sensor 270C.

As stated above, when the separation vacuum pads 200 reach the set points of the partitions 234A–234C, the touch sensors 270A–270C start operating sequentially so that the partitions 234A–234C inserted between the wafers Wa–Wc can be detected.

A description will be given of the structure of the delivery apparatus 118. The delivery apparatus 118 receives the wafers Wa–Wc, which have been separated from the slice base mounting beams Sa–Sc by the separation vacuum pads 200 of the individual wafer separation apparatus 114, from the separation vacuum pads 200 and delivers them to the shuttle conveyor 312. As shown in FIGS. 6 and 7, the delivery apparatus 118 is provided on the second slide table 240 of the drive unit 222. Driving the second feed motor 248 moves the delivery apparatus 118 along the second guide rails 236.

Figure 17:
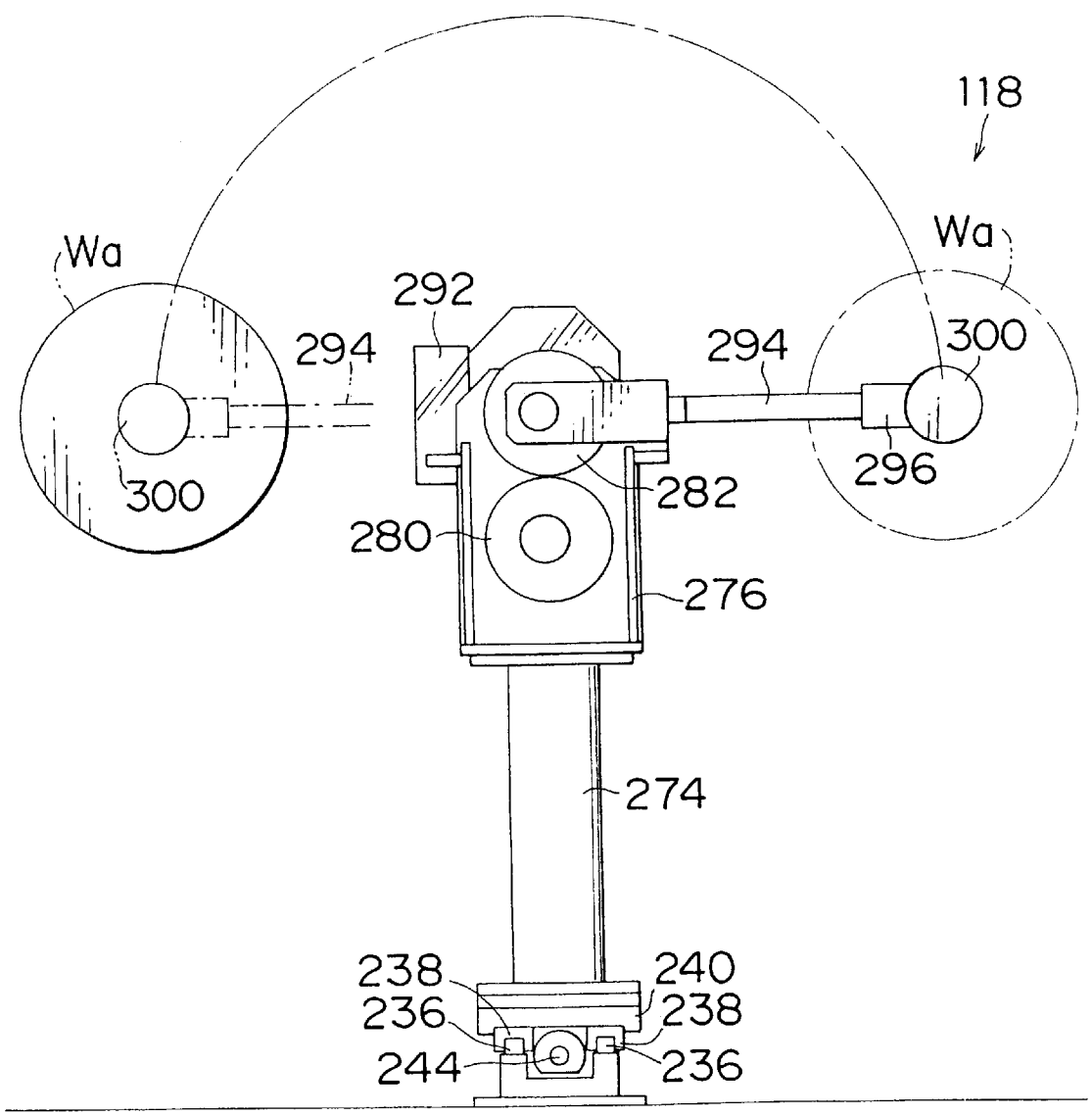
FIG. 17 is a front view illustrating the structure of a delivery apparatus.
Figure 18:
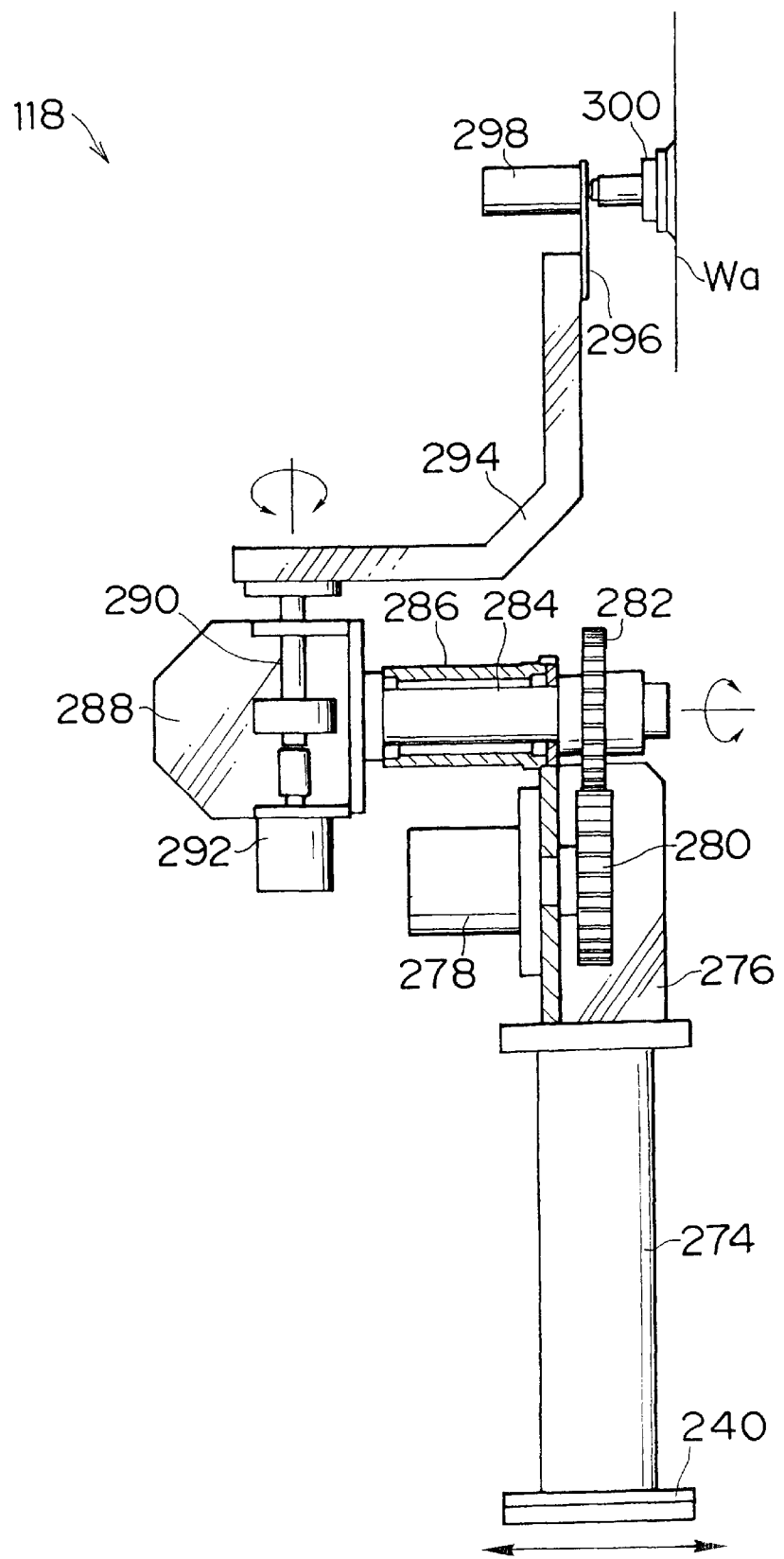
FIG. 18 is a partially sectional side view illustrating the structure of a delivery apparatus.
Figure 19:
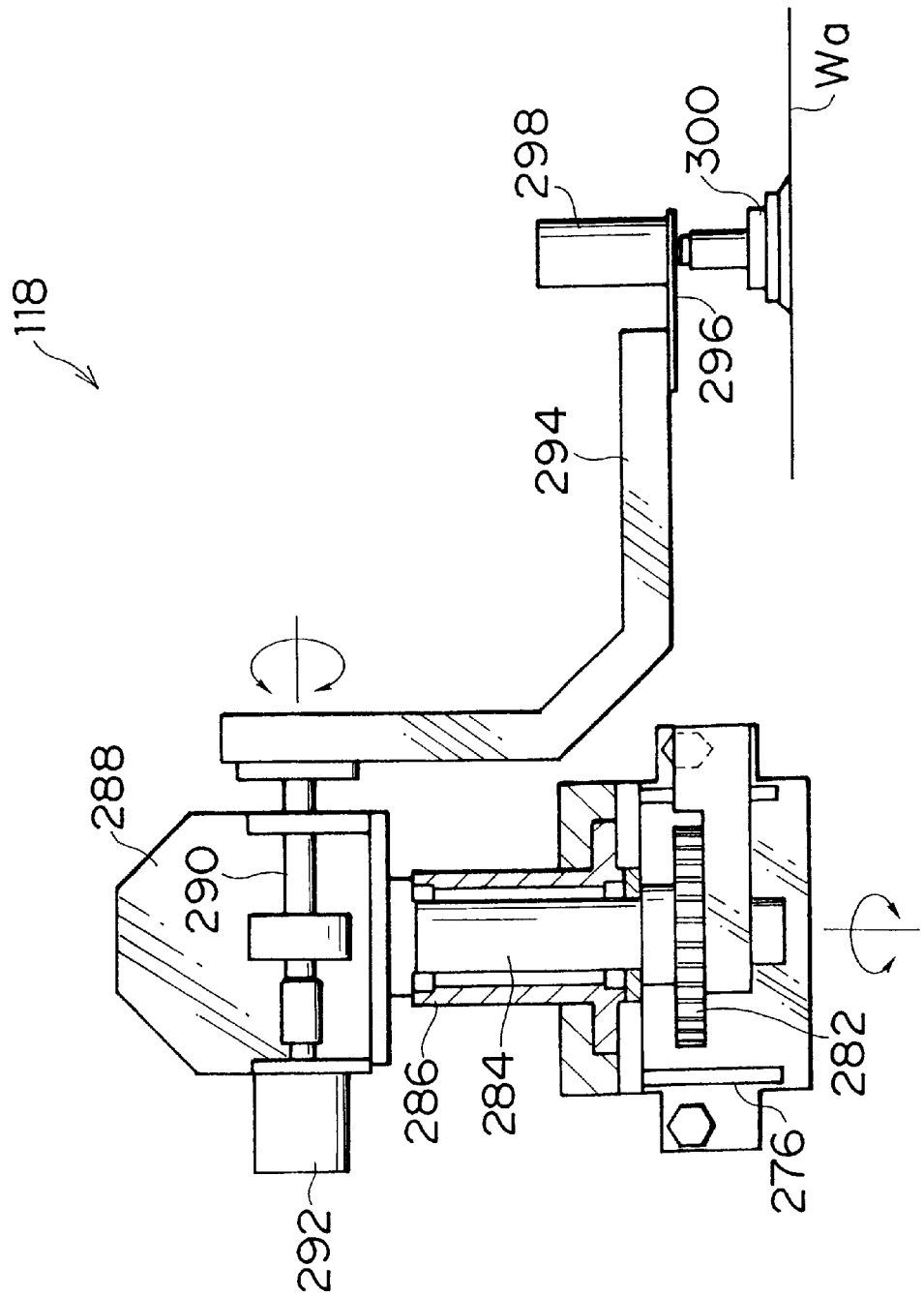
FIG. 19 is a partially sectional plan view illustrating the structure of a delivery apparatus.

As shown in FIGS. 17–19, a support 274 stands vertically on the second slide table of the drive unit 222. A support frame 276 stands vertically at the top of the support 274, and a revolving rotary actuator 278 is horizontally set on the support frame 276.

A drive gear 280 is engaged with an output shaft of the revolving rotary actuator 278. A follower gear 282, which is secured to a revolving shaft 284, is engaged with the drive gear 280. The revolving shaft 284 is rotatably supported by a bearing unit 286, which is provided at the top of the support frame 276. Driving the revolving rotary actuator 278 rotates the revolving shaft 284 within the range of 180°.

A revolving frame 288 is secured to the base end of the revolving shaft 284, and a rotary shaft 290 is rotatably supported by the revolving frame 288. An output shaft of a turning rotary actuator 292 set in the revolving frame 288 is secured to the base end of the rotary shaft 290. Driving the turning rotary actuator 292 rotates the rotary shaft 290 within the range of 90°.

An L-shaped revolving arm 294 is secured to the end of the rotary shaft 290. A support plate 296 is secured to the end of the turn arm 294. A pad moving cylinder 298 is attached to the support plate 296, and a delivery vacuum pad 300 is provided at the end of the rod of the pad moving cylinder 298. The wafers Wa–Wc, which have been separated by the separation vacuum pads 200 of the individual separation apparatus 114, are transported to a predetermined delivery position and are delivered to the delivery vacuum pad 300.

In the delivery apparatus 118 constructed in the above-mentioned manner, driving the revolving rotary actuator 278 revolves the wafers Wa–Wc, held by the delivery vacuum pad 300, on a vertical plane within the range of 180° (see FIG. 17). Driving the turning rotary actuator 292 turn the wafers Wa–Wc from the vertical state to the horizontal state.

The wafers Wa–Wc separated from the slice base mounting beams Sa–Sc move up to a predetermined delivery position in a state of being held by the separation vacuum pads 200. The delivery vacuum pad 300 waits at the delivery position, and the wafers Wa–Wc are positioned coaxially with the delivery vacuum pad 300.

When the wafers Wa–Wc reach the delivery position, the pad moving cylinder 298 is driven to move the delivery vacuum pad 300 by a predetermined amount toward the wafer Wa. Consequently, the delivery vacuum pad 300 is adhered to the end face of the wafer Wa.

Then, the delivery vacuum pad 300 is driven to hold the wafer Wa. When the delivery vacuum pad 300 holds the wafer Wa, the separation vacuum pads 200 are stopped so that the wafer Wa can be delivered from the separation vacuum pads 200 to the delivery vacuum pad 300.

After receiving the wafer Wa, the delivery vacuum pad 300 moves back from the separation vacuum pads 200. After delivering the wafer Wa, the separation vacuum pads 200 lower and return to the original separating position.

When the delivery vacuum pad 300 moves back, the revolving rotary actuator 278 is driven to turn the revolving arm 294 by 180°. Consequently, the wafer Wa is transferred to a position above the shuttle conveyor 312.

The wafer Wa, which has been transferred to the position above the shutter conveyor 312, is perpendicular to the shuttle conveyor 312. Thus, the turning rotary actuator 292 is driven to rotate the turn arm 294 by 90° about the rotary shaft 290. Consequently, the wafer Wa is positioned horizontally at a predetermined height from the shuttle conveyor 312.

After the turning rotary actuator 292 is driven, the pad moving cylinder 298 is driven to move the delivery vacuum pad 300 by a predetermined amount toward the shuttle conveyor 312. Consequently, the wafer Wa is placed on the shuttle conveyor 312.

When the wafer Wa is placed on the shuttle conveyor 312, the delivery vacuum pad 300 is stopped. Then, the pad moving cylinder 298 is driven to move back the delivery vacuum pad 300 from the shuttle conveyor 312.

This completes the delivery of the wafer Wa, and the delivery vacuum pad 300 returns to the original delivery position in the reverse operation. On the other hand, the shuttle conveyor 312, which has received the wafer Wa, is driven by a drive means (not illustrated) to transport the received wafer Wa to the next step.

The individual wafer separation part 100 is constructed in the above-mentioned manner. A control unit (not illustrated) automatically controls the driving of the individual wafer separation part 100, and each component operates in accordance with drive signals from the control unit.

A description will be given of the wafer separation method at the individual wafer separation part 100, which is constructed in the above-mentioned manner.

Before the start of the separation, the first slide table 140, on which the separation unit 150 is installed, is positioned at one end of the first guide rail 136 (the bottom end in FIG. 6, which is referred to as a separation starting position). The second slide table 240, on which the delivery apparatus 118 is installed, is positioned at the other end of the second guide rail 236 (the top end in FIG. 6, which is referred to as a partition starting position). The slide plates 226A–226C connect to the connection plate 250 of the connection apparatus through the pin insertion apparatuses 251A–251C.

The mounting plate M, to which the wafers Wa–Wc are adhered, is set at the workpiece holding part 212. This causes the slice base mounting beams Sa–Sc, to which the wafers Wa–Wc are adhered, to be soaked in the hot water 120 stored in the hot water tank 112.

The second lifter (not illustrated) receives the mounting plate M transported from the rough cleaning part 10 by the transfer chuck (not illustrated) so that the mounting plate M can be automatically set at the workpiece holding plate 212.

When the wafers Wa–Wc are set in the hot water tank 112, the control unit drives the second feed motor 248 to move the second slide table 240 downward in FIG. 6. At the same time, the control unit starts receiving a light reception signal from the light receiving sensor 266R of the lot detecting unit 264.

Nothing blocks the light for a predetermined period since the second slide table 240 starts moving, and thus, the light receiving sensor 266R receives the light directly from the light projecting sensor 266L.

When the lot detecting unit 264 reaches the wafers Wc of the third lot, the wafers Wc block the light projected by the light projecting sensor 266L. Thus, the light receiving sensor 266R does nor receive the light.

The control unit stops moving the second slide table 240 when it detects that the light receiving sensor 266R does not receive the light. Then, the control unit drives the brake cylinder 261C of the third partition unit 220C to fix the third partition unit 220C.

After fixing the third partition unit 220C, the control unit drives the cylinder 230C to move the third partition 234C forward. Consequently, the third partition 234C is inserted into the rear part of the third lot (the wafers Wc).

After the insertion of the third partition 234C, the control unit releases the connection between the connection plate 250 and the third slide plate 226C. Specifically, the control unit drives a pin insertion cylinder 254C of the pin insertion apparatus 251C to extract the connection pin 253C from the connection pin hole 255C formed in the third slide plate 226C. This releases the connection between the connection plate 250 and the third slide plate 226C. Even if the second slide table 240 is moved, the third slide plate 226C does not move any longer.

After releasing the connection between the third slide plate 226C and the connection plate 250, the control unit moves the second slide table 240 again and moves the lot detecting unit 264 along the axis of the wafers Wa–Wc.

Even if the second slide table 240 is moved, the wafers Wc block the light. Thus, the light receiving sensor 266R does not receive the light.

Since there is a predetermined interval between the third lot and the second lot, the light receiving sensor 266R starts receiving the light again when the lot detecting unit 264 passes through a space between the third lot and the second lot.

The control unit stops moving the second slide table 240 when it detects that the light receiving sensor 266R starts receiving the light again and the wafers Wb block the light again. Then, the control unit drives the brake cylinder 261B (not illustrated) of the second partition unit 220B in order to fix the second partition unit 230B.

After fixing the second partition unit 220B, the control unit drives the cylinder 230B to move the second partition 234B forward. Consequently, the second partition 234B is inserted between the second lot (the wafers Wb) and the third lot (the wafers Wc).

After the insertion of the second partition 234B, the control unit releases the connection between the connection plate 250 and the second slide plate 226B. Specifically, the control unit drives the pin insertion cylinder 254B of the pin insertion apparatus 251B to extract the connection pin 253B from the connection pin hole 255B formed in the second slide plate 226B. This releases the connection between the connection plate 250 and the second slide plate 226B. Even if the second slide table 240 is moved, the second slide plate 226B does not move any longer.

After releasing the connection between the second slide plate 226B and the connection plate 250, the control unit moves the second slide table 240 and moves the lot detecting unit 264 along the axis of the wafers Wa–Wc.

Even if the second slide table 240 is moved, the wafers Wb block the light, and thus the light receiving sensor 266R does not receive the light.

Since there is a predetermined interval between the second lot and the first lot, however, the light receiving sensor 266R starts receiving the light when the lot detecting unit 264 passes the space between the second lot and the first lot.

The control unit stops moving the second slide table 240 when it detects that the light receiving sensor 266R starts receiving the light and the wafers Wa block the light again. Then, the control unit drives the brake cylinder 261A of the first partition unit 220A to fix the first partition unit 230A.

After fixing the first partition unit 220B, the control unit drives the cylinder 230A to move the first partition plate 234A forward. Consequently, the first partition 234A is inserted between the second lot (the wafers Wb) and the first lot (the wafers Wa).

After the insertion of the first partition plate 234A, the control unit cancels the connection between the connection plate 250 and the first slide plate 226A. Specifically, the control unit drives the pin insertion cylinder 254A of the pin insertion apparatus 251A to extract the connection pin 253A from the connection pin hole 255A formed in the first slide plate 226A. This releases the connection between the connection plate 250 and the first slide plate 226A. Even if the second slide table 240 is moved, the first slide plate 226A does not move any longer.

Figure 20:
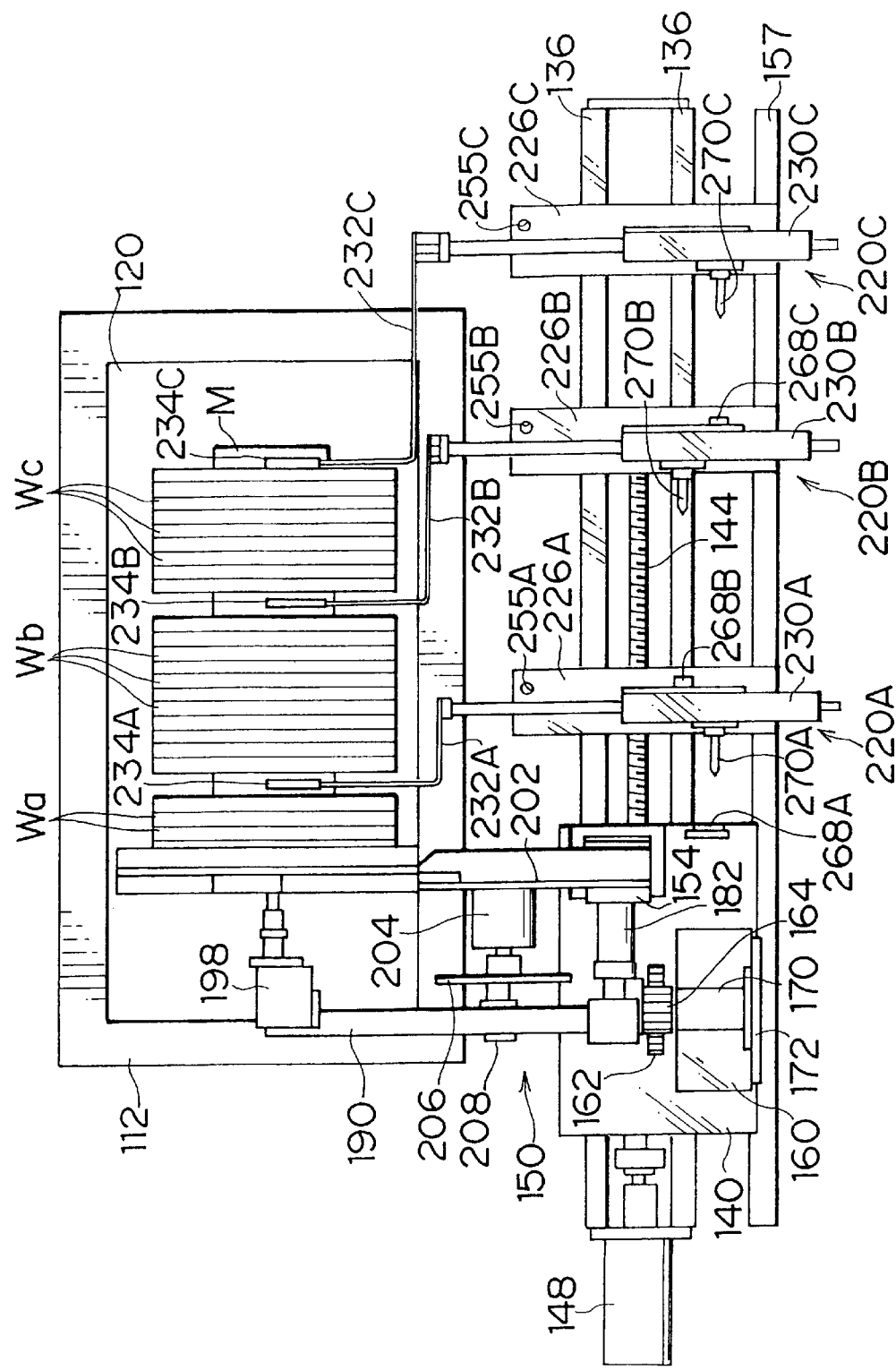
FIG. 20 is a plan view illustrating the structure of the essential parts of an individual wafer separation part.

As shown in FIG. 20, the partitions 234A–234C are inserted between the wafer lots Wa–Wc as described above.

After releasing the connection between the first slide plate 226A and the connection plate 250, the control unit moves the second slide table 240 downward in FIG. 6 so that the second slide table 240 can be positioned at a predetermined delivery starting position. When the second slide table 240 reaches the delivery starting position, the separation of the wafers Wa–Wc is started.

First, the control unit drives the first feed motor 148 and the second feed motor 248 synchronously, and moves the first slide table 140 and the second slide table 240 forward (upward in FIG. 6).

A non-contact position sensor (not illustrated) is provided at the stopper plate 214 of the individual wafer separation apparatus 114 provided on the first slide table 140. The position sensor starts operating if the distance to the end face of the wafer Wa reaches a predetermined distance. In response to an operation signal from the position sensor, the control unit stops driving the first feed motor 148 and the second feed motor 248, and stops the first slide table 140 and the second slide table 240. Consequently, the separation vacuum pads 200 of the individual wafer separation apparatus 114 provided on the first slide table 140 come into contact with the end face of the wafer Wa. The control unit drives the separation vacuum pads 200, which contacts with the end face of the wafer Wa, so that the separation vacuum pads 200 can hold the wafer Wa.

Then, the control unit drives the swinging rotary actuator 160 to swing the swinging frame 154 forward and backward and swing the separation vacuum pads 200 forward and backward (along the axis of the wafers). The adhesive agent, which adhered the wafer Wa to the slice base mounting beam Sa, is sufficiently softened because it is soaked in the hot water 120. The separation vacuum pads 200 swing about a point in proximity to the adhering part of the wafers Wa and the slice base mounting beam Sa. For this reason, if the separation vacuum pads 200 swing the wafer Wa several times, the wafers Wa can easily be separated from the slice base mounting beam Sa.

The control unit stops driving the swinging rotary actuator 160 after swinging the separation vacuum pads 200 a predetermined times. Consequently, the wafers Wa are separated from the slice base mounting beam Sa.

Then, the control unit drives the lifting rotary actuator 204 to revolve the arms 190, 192 upward and move the separation vacuum pads 200 upward.

In this case, the wafers Wa held by the separation vacuum pads 200 pass through the slit 216a of the double separation prevention plate 216 secured to the top of the stopper plate 214 in order to prevent two wafers from being separated at the same time. Even if the wafer $Wa_2$ is attached to the wafer $Wa_1$ held by the vacuum pads 200, the wafer $Wa_2$ is separated from the wafer $Wa_1$ when it passes through the slit 216a. Therefore, only one wafer Wa held by the vacuum pads 200 can be taken out.

Moreover, the wafer, which drops without passing through the slit 216a, can be prevented from falling forward by the stopper plate 214, and thus, the wafer can be collected in the next separation.

The separation vacuum pads 200, which have moved upward, stop at a predetermined deliver position. The delivery vacuum pad 300 of the delivery apparatus 118 waits at the delivery position, and the wafer Wa held by the separation vacuum pads 200 is positioned coaxially with the delivery vacuum pad 300.

When the separation vacuum pads 200 stop at predetermined delivery positions, the control unit drives the pad moving cylinder 298 so that the delivery vacuum pad 300 can move toward the wafer Wa by a predetermined amount. Consequently, the delivery vacuum pad 300 is adhered to the end face of the wafer Wa.

Then, the control unit drives the delivery vacuum pad 300, which holds the end face of the wafer Wa. Then, the control unit stops driving the separation vacuum pads 200 so that the wafer Wa can be delivered to the delivery vacuum pad 300.

Then, the control unit drives the pad moving cylinder 298 so that the delivery vacuum pad 300 can move back from the separation vacuum pads 200.

After driving the pad moving cylinder 298, the control unit drives the lifting rotary actuator 204 to revolve the arms 190, 192 downward and move the separation vacuum pads 200 downward to the original separating position.

At the same time, the control unit drives the revolving rotary actuator 278 to revolve the revolving arm 294 by 180° so that the wafer Wa can be transferred to a position above the conveyor 312. After the transfer of the wafer Wa, the control unit drives the turning rotary actuator 292 to rotate the revolving arm 294 by 90° about the rotary shaft 290. Consequently, the wafer Wa is parallel to the conveyor 312.

The control unit drives the pad moving cylinder 298 so that the delivery vacuum pad 300 can move toward the conveyor 312. Therefore, the wafer Wa is placed on the conveyor 312, and the control unit stops driving the delivery vacuum pad 300 so that the wafer Wa can be delivered to the conveyor 312.

Then, the control unit drives the pad moving cylinder 298 so that the delivery vacuum pad 300 can move back from the conveyor 312. The control unit also drives the conveyor 312 to transport the wafer Wa to the next step.

After driving the pad moving cylinder 298, the control unit drives the turning rotary actuator 292 and the revolving rotary actuator 278 so that the delivery vacuum pad 300 can return to the original delivery position.

Thus, the separation of the first wafer Wa is completed. The control unit drives the first feed motor 148 and the second feed motor 248 synchronously and moves the first slide table 140 and the second slide table 240 forward by a predetermined amount. Consequently, the separation vacuum pads 200 come into contact with the end face of the wafer Wa$_2$, which is separated secondly. The control unit separates the second wafer Wa$_2$ in the above-mentioned manner.

The wafers Wa are sequentially separated from the slice base mounting beam Sa as described above and they are transported to the next step.

Suppose that all the wafers Wa (the first lot) have been separated. At this stage, the control unit cannot recognize that the separation of the first lot is complete. The control unit drives the first feed motor 148 and the second feed motor 248 to move the first slide table 140 and the second slide table 240 forward.

Since the first partition 234A is inserted between the wafers Wa (the first lot) and the wafers Wb (the second lot), the first contact 268A comes into contact with the first touch sensor 270A provided on the first slide plate 226A at which the first partition 234A is arranged. In response to the operation signal from the first touch sensor 270A, the control unit detects that all the wafers Wa (the first lot) have been separated. Then, the control unit transmits the information about the completion of the separation of the wafers Wa (the first lot) to the following steps.

Accordingly, at the following steps, it is possible to recognize that the wafers Wb transported next from the conveyor 312 are the wafers Wb (the second lot). Moreover, the different kinds of wafers are not mixed during the processing, collection, etc. of the wafers.

In response to the operation signal of the first touch sensor 270A, the control unit stops driving the first feed motor 148 and the second feed motor 248 and stops moving the first slide table 140 and the second slide table 240. Then, the control unit drives the first cylinder 230A to move back the first partition 234A.

After moving back the first partition 234A, the control unit stops driving the brake cylinder 261A of the first partition unit 220A to release the lock of the first partition unit 220A.

After transmitting the information about the completion of the separation of the wafers Wa (the first lot) to the following steps, the control unit drives the first feed motor 148 and the second feed motor 248 synchronously and moves the first slide table 140 and the second slide table 240 forward (upward in FIG. 6). In this case, the first slide table 140 moves forward while pressing the first slide plate 226A, at which the first partition 234A is provided.

When the distance to the wafers Wb (the second lot) reaches a predetermined distance, the position sensor (not illustrated) provided at the stopper plate 214 starts operating. In response to the operation signal from the position sensor, the control unit stops driving the first feed motor 148 and the second feed motor 248 and stops the first slide table 140 and the second slide table 240. Consequently, the separation vacuum pads 200 of the individual wafer separation apparatus 114 come into contact with the end faces of the wafers Wb of the second lot.

The control unit drives the separation vacuum pads 200 which contact with the end face of the wafer Wb so that the separation vacuum pads 200 can hold the wafer Wb.

Thereafter, the wafers Wb are separated from the slice base mounting beam Sb in the same procedure as in the case where the wafers Wa of the first lot are separated. The separated wafers Wb are transported to the next step.

Suppose that all the wafers Wb (the second lot) have been separated, the control unit cannot recognize that the separation of the wafers Wb is complete. The control unit drives the first feed motor 148 and the second feed motor 248 in order to move the first slide table 140 and the second slide table 240 forward.

Since the second partition 234B is inserted between the wafers Wb (the second lot) and the wafers Wc (the third lot), however, the second contact 268B provided on the second slide plate 226B comes into contact with the second touch sensor 270B provided on the second slide plate 226B at which the second partition 234B is arranged. In response to the operation signal from the second touch sensor 270B, the control unit detects that all the wafers Wb of the second lot have been separated. Then, the control unit transmits the information about the completion of the separation of the wafers Wb (the second lot) to the following steps.

Accordingly, at the following steps, it is possible to recognize that the wafers Wc transported next from the conveyor 312 are the wafers Wc (the third lot). Moreover, the different kinds of wafers are not mixed during the processing, collection, etc. of the wafers.

In response to the operation signal of the second touch sensor 270B, the control unit stops driving the first feed motor 148 and the second feed motor 248 and stops moving the first slide table 140 and the second slide table 240. Then, the control unit drives the second cylinder 230B to move back the second partition 234B.

After moving back the second partition 234B, the control unit stops driving the brake cylinder 261B of the second partition unit 220B to release the lock of the second partition unit 220B.

After transmitting the information about the completion of the separation of the wafers Wb (the second lot) to the following steps, the control unit drives the first feed motor 148 and the second feed motor 148 synchronously and moves the first slide table 140 and the second slide table 240 forward (upward in FIG. 6). In this case, the first slide table 140 moves forward while pressing the first slide plate 226A, at which the first partition 234A is provided, and the second slide plate 226B, at which the second partition 234B is provided.

When the distance to the wafer Wc (the third lot) reaches a predetermined distance, the position sensor (not illustrated) provided at the stopper plate 214 starts operating. In response to the operation signal from the position sensor, the control unit stops driving the first feed motor 148 and the second feed motor 248 and stops the first slide table 140 and the second slide table 240. Consequently, the separation vacuum pads 200 of the individual wafer separation apparatus 114 come into contact with the end face of the wafer Wc (the third lot).

The control unit drives the separation vacuum pads 200 which contact with the end face of the wafer Wc so that the separation vacuum pads 200 can hold the wafer Wc.

Thereafter, the wafers Wc are separated from the slice base mounting beam Sc in the same procedure as in the case where the wafers Wb (the second lot) are separated. The separated wafers Wc are transported to the next step.

Suppose that all the wafers Wc (the third lot) have been separated. As stated previously, the control unit cannot recognize that the separation of the wafers Wc is complete. The control unit drives the first feed motor 148 and the second feed motor 248 in order to move the first slide table 140 and the second slide table 240 forward.

Since the third partition 234C is inserted just behind the wafers Wc (the third lot), however, the third contact 268C provided on the second slide plate 226B comes into contact with the third touch sensor 270C provided on the third slide plate 226C at which the third partition 234C is arranged when the first slide table 140 moves forward. In response to the operation signal from the third touch sensor 270C, the control unit detects that all the wafers Wc (the third lot) have been separated, which means all the wafers Wa–Wc have been separated. Then, the control unit transmits the information about the completion of the separation of all the wafers Wa–Wc to the following steps.

Accordingly, in the following steps, it is possible to recognize that one cycle of the separation is completed.

In response to the operation signal of the third touch sensor 270C, the control unit stops driving the first feed motor 148 and the second feed motor 248 and stops moving the first slide table 140 and the second slide table 240. Then, the control unit drives the third cylinder 230C to move back the third partition 234C.

After moving back the third partition 230C, the control unit stops driving the brake cylinder 261C of the third partition unit 220C to release the lock of the third partition unit 230C.

After transmitting the information about the completion of the separation of the wafers Wc, that is, the completion of the separation of all the wafers Wa–Wc to the following steps, the control unit drives the first feed motor 148 and the second feed motor 248 synchronously and moves the first slide table 140 and the second slide table 240 forward (upward in FIG. 6). In this case, the first slide table 140 moves forward while pressing the first slide plate 226A, at which the first partition 234A is provided, the second slide plate 226B, at which the second partition 234B is provided, and the third slide plate 226C, at which the third partition 234C is provided.

When the second slide table 240 and the first and third slide plates reach the predetermined partition starting positions (this is detected by a proximity sensor, etc. which is not illustrated), the control unit stops driving the first feed motor 148 and the second feed motor 248 and stops moving the first slide table 140 and the second slide table 240.

Consequently, the second slide table 240 and the slide plates 226A–226C, at which the partitions 234A–234C are provided, return to the initial positions. The control unit drives the pin insertion cylinders 254A–254C of the pin insertion apparatuses 251A–251C to thereby insert the connection pins 253A–253C into the connection pin holes 255A–255C formed in the slide plates 226A–226C so that the slide plates 226A–226C can connect to the connection plate 250. Then, the control unit waits for the next separation.

After returning the second slide table 240 to the predetermined partition starting position, the control unit drives only the first feed motor 148 to hereby move back the first slide table 140 (downward in FIG. 6).

When the first slide table 140 reaches a predetermined separation starting position (this is detected by a servo encoder, etc., which is not illustrated), the control unit stops driving the first feed motor 148 and stops moving the first slide table 140. Consequently, the first slide table 140 returns to the initial position.

Thus, the separation of one cycle is completed. After the separation, the workpiece holding part 122 stops clamping the mounting late M. The second lifter pulls up the mounting plate M from the hot water tank 112, and the mounting plate M is delivered to the first lifter. Then, the mounting plate M is transported to the slice base removal part 600, which will be described later, in order to remove the slice base mounting beams Sa–Sc.

A description will be given of the transport part 310. As stated previously, the transport part 310 receives the individual wafers W, which are separated by the individual wafer separation part 100, and transports the individual wafer cleaning part 350. The transport part 310 is provided with the conveyor 312, which transports the wafers W to the individual wafer cleaning part 350.

A description will be given of the individual wafer cleaning part 350. The individual wafer cleaning part 350 cleans the wafers W separated by the individual wafer separation part 100. The individual wafer cleaning part 350 consists of an individual wafer brushing part 352, an individual wafer pre-rinse part 354 and an individual wafer rinse part 356.

Figure 21:
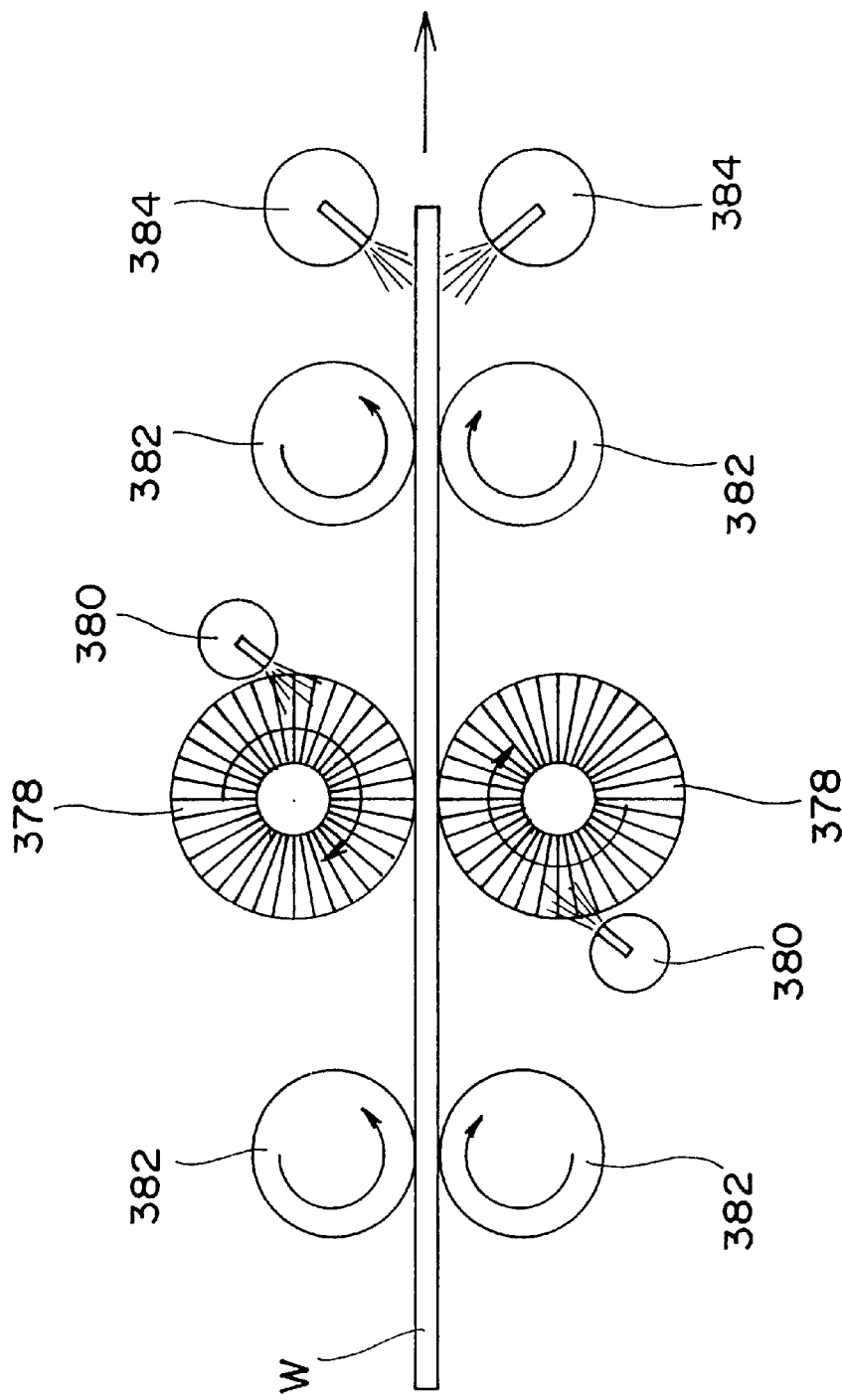
FIG. 21 is a side view illustrating the structure of an individual wafer cleaning part.

The individual wafer brushing part 352 has a chamber-type cleaning tank (not illustrated). As shown in FIG. 21, a pair of rotary brushes 378, a pair of cleaning liquid nozzles 380 for flowing a cleaning liquid, a roller conveyor 382 for transporting the wafer, a pair of air knife nozzles 384 for draining the liquid are arranged in the cleaning tank.

At the individual wafer brushing part 352, a pair of rotary brushes 378 brushes the reverse side of the wafer W that has been transported on the conveyor 312 of the transport part 312 while a cleaning liquid is supplied to the wafer W from the cleaning liquid nozzles 380. After the cleaning, air knife nozzles 384 jet the compressed air to drain the cleaning liquid to thereby prevent the liquid from being brought to the next stage. The brushed wafer W is transported to the individual wafer pre-rinse part 352 at the next stage by a roller conveyor 382.

The individual wafer pre-rinse part 354 is constructed in the same manner as the individual wafer brushing part 352. Specifically, the individual wafer pre-rinse part 354 has a chamber-type cleaning tank. A pair of rotary brushes, a pair of pre-rinse liquid nozzles which allows a pre-rinse liquid (warm water of 60° C.) to flow, a roller conveyor for transporting the wafer, and a pair of air knife nozzles for draining a liquid (see FIG. 21) are arranged in the cleaning tank.

At the individual wafer rinse part 356, the pair of rotary brushes cleans the wafer W transported on the roller conveyor of the individual rinse cleaning part while the rinse liquid nozzles supply the rinse liquid to the reverse side of the wafer W. After the cleaning, the air knife nozzles jet the compressed air to drain the liquid to thereby prevent the rinse liquid from being brought to the next stage. The brushed wafer W is transported on the roller conveyor to a detecting part 400.

A description will be given of the detecting part 400. The detecting part 400 detects whether each cleaned wafer W is broken or chipped and whether the adhesive agent remains on the wafer W, and measures the thickness of the wafers W one by one.

Figure 22:
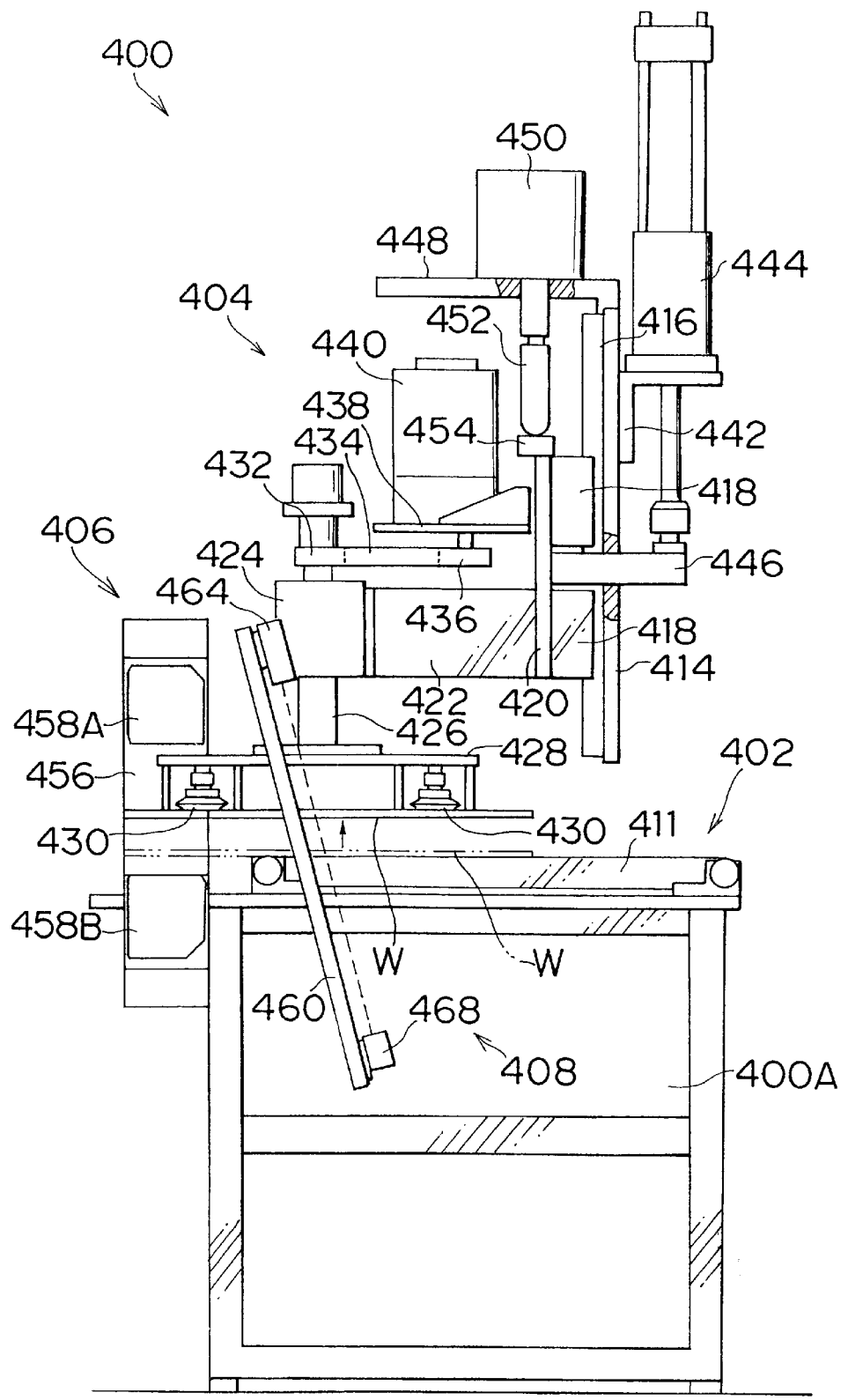
FIG. 22 is a side view illustrating the structure of a detecting part.

As shown in FIG. 22, the detecting part 400 consists of a transport unit 402 which transports the wafer cleaned by the individual wafer cleaning part 350 to a predetermined receiving position, a rotation drive unit 404 which lifts the wafer W transported to the receiving position to a predetermined detecting position and rotates the wafer W, a thickness measurement unit 406 which measures the thickness of the wafer W rotated by the rotation drive unit 404, a failed wafer detecting unit 408 which detects whether the wafer W rotated by the rotation drive unit 404 is broken or chipped and whether the adhesive agent remains on the wafer, and a delivery unit 410 which delivers the detected wafer W to a wafer transport robot of a collecting part 500.

First, a description will be given of the transport unit 402. The transport unit 402 has a circular belt conveyor 411, which connects to the end of the individual wafer cleaning part 350. A pair of guide members 411a is arranged at both sides of the circular belt conveyor 411. The guide members 411a guide the wafer W straight.

Figure 23:
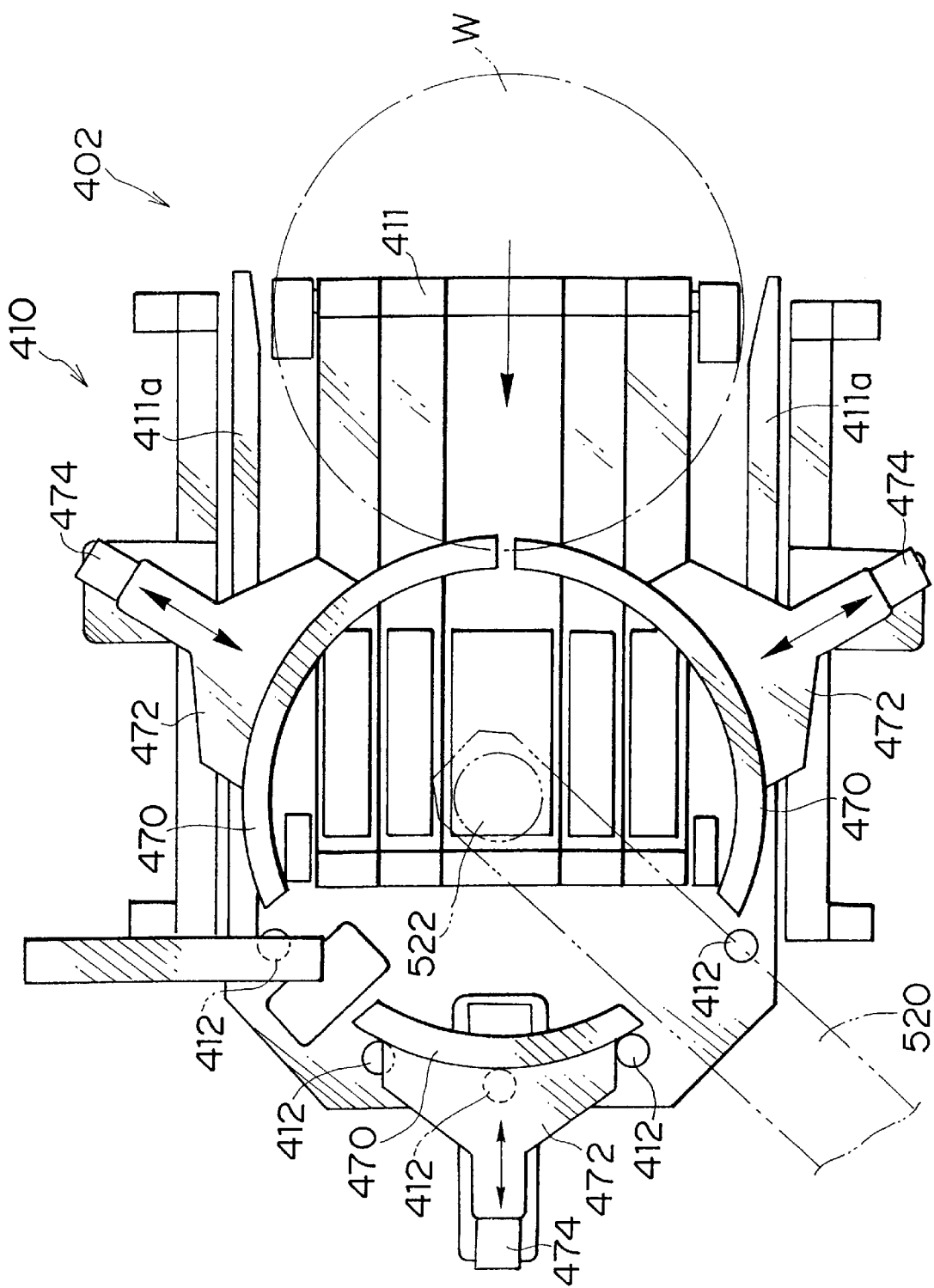
FIG. 23 is a plan view illustrating the structure of a transport unit.

As shown in FIG. 23, five positioning pins 412 are arranged at the end of the circular belt conveyor 411 in such a way as to describe an arc. The wafer W transported on the circular belt conveyor 411 comes into contact with the positioning pins 412 so that the wafer W can be positioned at the predetermined receiving position.

When the wafer W comes into contact with the positioning pins 412, a sensor (not illustrated) operates to stop driving the circular belt conveyor 411.

A description will be given of the rotation drive unit 404. The rotation drive unit 404 is arranged in a support frame (not illustrated), and a base plate 414 is placed in the support frame in such a way as to be vertical to the circular belt conveyor 411. A pair of guide rails 416 is formed on the base plate 414, and a lift table 420 is slidably supported on the guide rails 416 through linear guides 418.

An arm 422 is horizontally fixed on the lift table 420, and a bearing unit 424 is provided at the end of the arm 422. A rotary shaft 426 is rotatably supported on the bearing unit 424, and a rotary table 428 is secured to the bottom end of the rotary shaft 426. Three vacuum pads 430 (FIG. 22 illustrates only two of them) are arranged coaxially at regular intervals on the rotary table 428, and the vacuum pads 430 hold the wafer W.

A follower pulley 432 is secured to the top end of the rotary shaft 426, and the follower pulley 432 connects to a drive pulley 436 through a belt 434. The drive pulley 436 connects to an output shaft of a rotation drive motor 440, which is provided on the lift table 420 through a bracket 438. Driving the rotation drive motor 40 rotates the rotary shaft 426. The rotation of the rotary shaft 426 results in the rotation of the rotary table 428.

A lift cylinder 444 is provided at the back of the base plate 414 through a support member 442. A connection member 446, which is secured to the reverse side of the lift table 420, is secured to the end of the lift cylinder 444. Consequently, driving the lift cylinder 444 causes the lift table 420 to move vertically. The rotary table 428 moves vertically with the lift table 420.

A height adjustment cylinder 450 is attached to the top end of the base plate 414 through a bracket 448. A stopper member 452 is secured to the end of the height adjustment cylinder 450. Driving the height adjustment cylinder 450 changes the positions of the stopper member 452. On the other hand, a stopper plate 454 is provided at the top end of the lift table 420, and the stopper plate 454 is engaged with the stopper member 452. If the stopper plate 454 comes into contact with the stopper member 452, the lift table 420, which is moved up by the lift cylinder 444, stops at a predetermined position.

A description will be given of the thickness measurement unit 406. As shown in FIG. 22, a support 456 stands vertically on a rack 400A provided with the circular belt conveyor 411. A pair of laser sensors 458A is arranged at a predetermined interval L on the support 456. The laser sensors 458A, 458B are arranged in such a way as to face one another across the wafer W.

The laser sensors 458A, 458B have a laser oscillating part and a light receiving part (not illustrated) on detecting surfaces 458a, 458b, and the oscillating part oscillates the laser toward the wafer W. Then, the light receiving part receives the laser reflected by the wafer W. The laser sensors 458A, 458B detects the distance $l_A$, $l_B$ to the wafer W in accordance with the angle of the received light.

Figure 25:
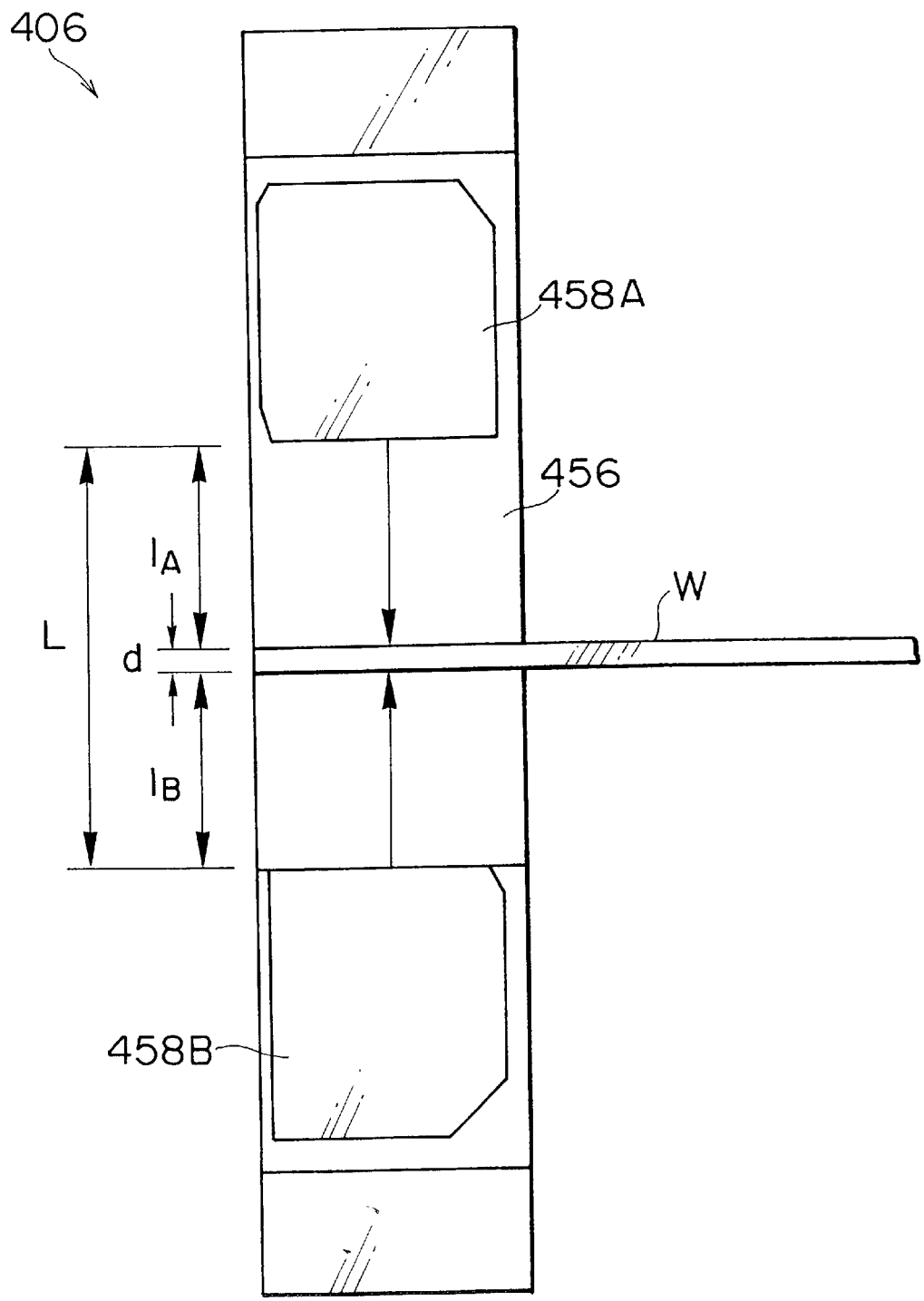
FIG. 25 is a view of assistance in explaining the operation of a thickness measuring unit.

The detected values of the laser sensors 458A, 458B are output to a control unit (not illustrated), and the control unit calculates the thickness of the wafer W as described below. The interval between the laser sensors 458A, 458B is fixed as shown in FIG. 25, and thus, if the detected values of the laser sensors 458A, 458B are $l_A$, $l_B$, the thickness d of the wafer W is calculated by the following equation: $d = L - (l_A + l_B)$.

The laser sensors 458A, 458B detect the distance to the wafer W in the state wherein the rotation drive unit 404 drives the wafer.

Figure 24:
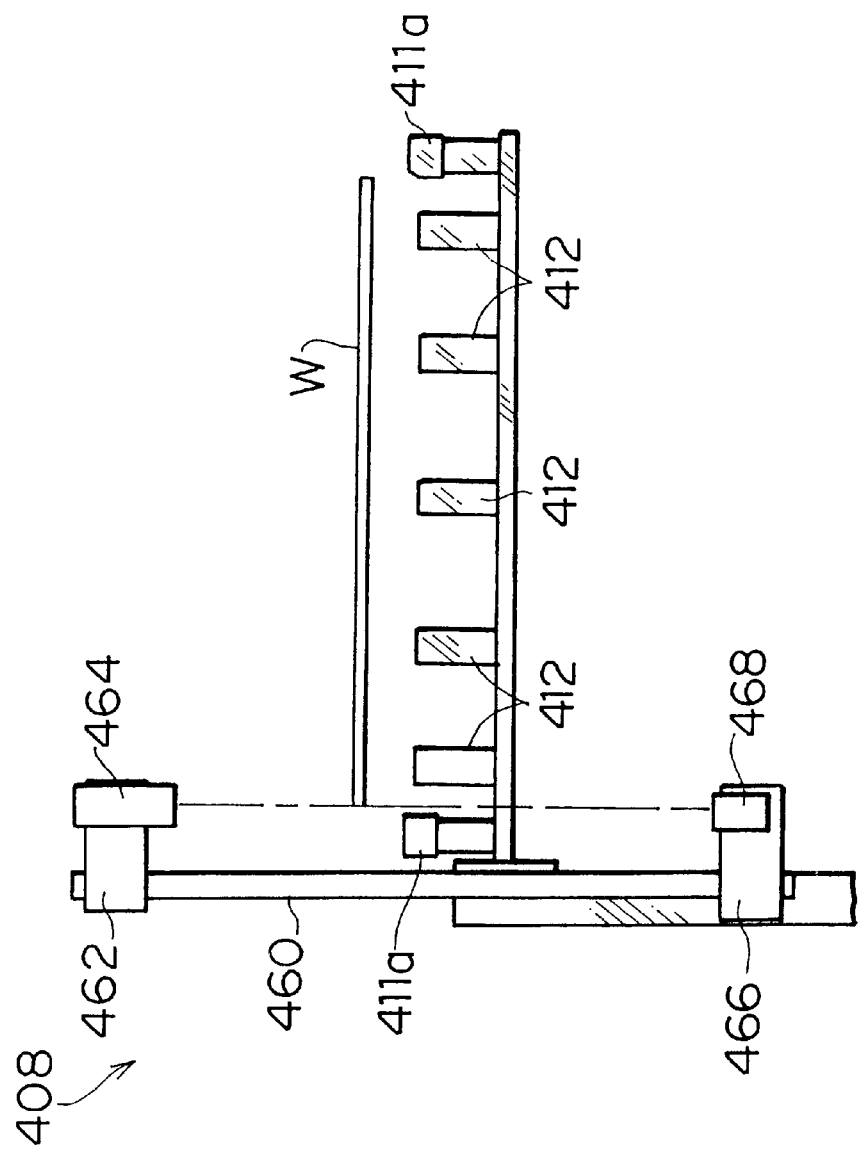
FIG. 24 is a front view illustrating the structure of a failed wafer detecting unit.

A description will be given of the failed wafer detecting unit 408. As shown in FIGS. 22 and 24, a support rod 460 is fixed to the rack 400A at a predetermined angle. A light projecting sensor 464 is provided at the top end of the support rod 460 through a support member 462, and a light receiving sensor 468 is provided at the bottom end of the support rod 460 through the support member 466. The light projecting sensor 464 and the light receiving sensor 468 are arranged in such a way as to face one another across the peripheral edge off the wafer W. The light receiving sensor 468A receives the light projected by the light projecting sensor 464.

A number of light projecting devices are arranged in parallel on the light projecting plane of the light projecting sensor 464 so that they can be perpendicular to the peripheral edge of the wafer W. Light receiving devices in the same number as the light projecting devices are arranged in parallel so that they can be perpendicular to the peripheral edge of the wafer W.

The control unit (not illustrated) detects changes in the amount of the light received by the light receiving sensor 468 (changes in the number of light receiving devices which receive the light projected by the light projecting devices) to thereby detect that the wafer W is broken or chipped and the adhesive agent remains on the wafer W.

Figure 26:
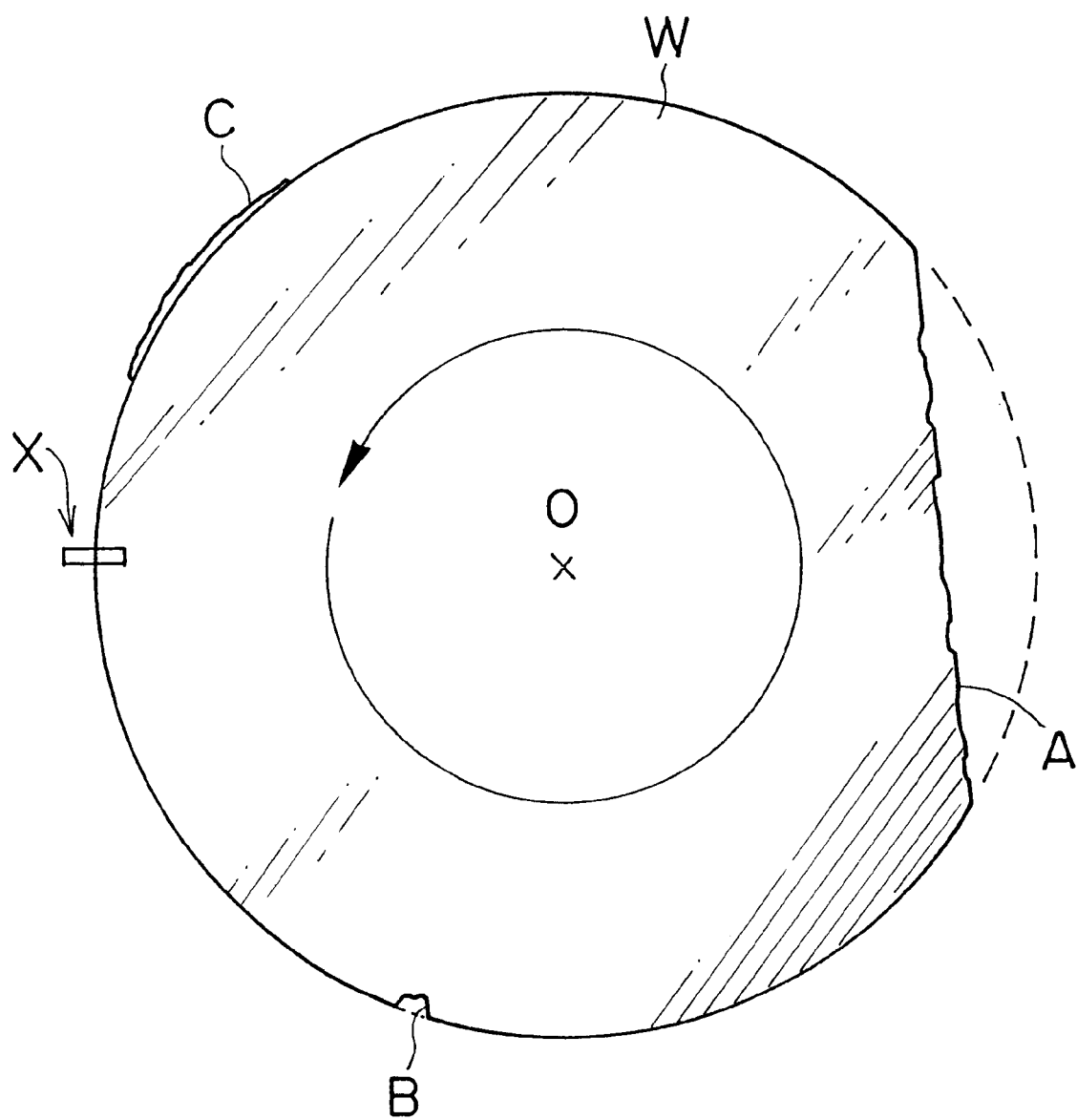
FIG. 26 is a view of assistance in explaining the operation of a failed wafer detecting unit.

If the wafer W is broken or chipped and no adhesive agent remains on the wafer W, there is no change in the quantity of light received by the light receiving sensor 468 even if the wafer W is rotated. If the wafer W is broken at an area A or chipped at an area B as shown in FIG. 26, the quantity of light going through the wafer W is increased when the broken part A or the chipped part B passes a detecting part X. Accordingly, the quantity of received light is increased. Thus, the broken part A or the chipped part B on the wafer W can be detected by detecting the increase in the quantity of light received by the light receiving sensor 468.

If the adhesive agent C remains on the wafer W, the light going through the wafer W is decreased, and thus, the quantity of received light decreases accordingly.

As stated above, the control unit (not illustrated) detects the broken or chipped part by detecting the increase in the quantity of light received by the light receiving sensor 468. The control unit detects the remaining adhesive agent on the wafer W by detecting the decrease in the quantity of received light.

A description will be given of the delivery unit 410. As shown in FIG. 23, arc-shaped three wafer receiving members 470 are arranged to form a circle at a predetermined height from the circular belt conveyor 411. The three wafer receiving members 470 are fixed to slide blocks 472, which are slidably supported on radially-arranged guide rails 474. The slide blocks 472 are moved on the guide rails 474 by drive means (not illustrated), and consequently, the three wafer receiving members 470 expand and contract.

When the detection of the wafer W is completed, the three wafer receiving members 470 contract in diameter. The wafer W is placed on the contracted wafer receiving members 470. The wafer transport robot of the collecting part 500 receives the wafer W placed on the wafer receiving members 470 and collects the wafer W in a collecting cassette.

A description will hereunder be given of the operation of the detecting part 400, which is constructed in the above-mentioned manner.

The wafer W, which has already been cleaned by the individual wafer cleaning part 350, is transferred on the circular belt conveyor 410 of the detecting part 400 to the predetermined receiving position. The wafer W transferred to the predetermined receiving position comes into contact with the positioning pins 412 so that the wafer W can be positioned. When the wafer W reaches the receiving position, the sensor (not illustrated) operates to stop driving the circular belt conveyor 410.

When the wafer W reaches the predetermined receiving position, the lift cylinder 444 drives the rotary table 428 down to the wafer W positioned at the predetermined receiving position. Consequently, the three vacuum pads 430 provided on the rotary table 428 come into contact with the top of the wafer W.

When the vacuum pads 430 come into contact with the top of the wafer W, the lift cylinder 444 is stopped, and the vacuum pads 320 are driven to hold the wafer W.

When the vacuum pads 430 hold the wafer W, the lift cylinder 444 is driven again to lift the rotary table 428. When the stopper plate 454 comes into contact with the stopper member 452 attached to the top end of the lift table 426, the lift cylinder 444 is stopped so that the wafer W can be positioned at a predetermined detecting position.

When the wafer W is positioned at the predetermined detecting position, the rotation drive motor 440 is driven to rotate the rotary table 428, and the wafer W is rotated. At the same time, the thickness measuring unit 406 and the failed wafer detecting unit 408 detect the thickness of the wafer W, the broken or chipped part and the remaining adhesive agent.

On completion of the detection, the rotation drive motor 440 is stopped, and a drive means (not illustrated) of the delivery unit 410 is run. Consequently, the expanded wafer receiving members 470 contract in diameter and are positioned under the wafer W supported on the rotary table 428.

When the wafer receiving member 470 is positioned under the wafer W supported on the rotary table 428, the vacuum pads 430 are stopped. Consequently, the wafer W supported on the rotary table 428 is delivered to the wafer receiving members 470. Then, the wafer transport robot of the collecting part 500 collects the wafer W delivered to the wafer receiving members 470.

The lift cylinder 444 and the height adjustment cylinder 450 lift the rotary table 428, which has delivered the wafer W, by a predetermined amount, and the rotary table 428 waits at a predetermined waiting position.

Figure 27:
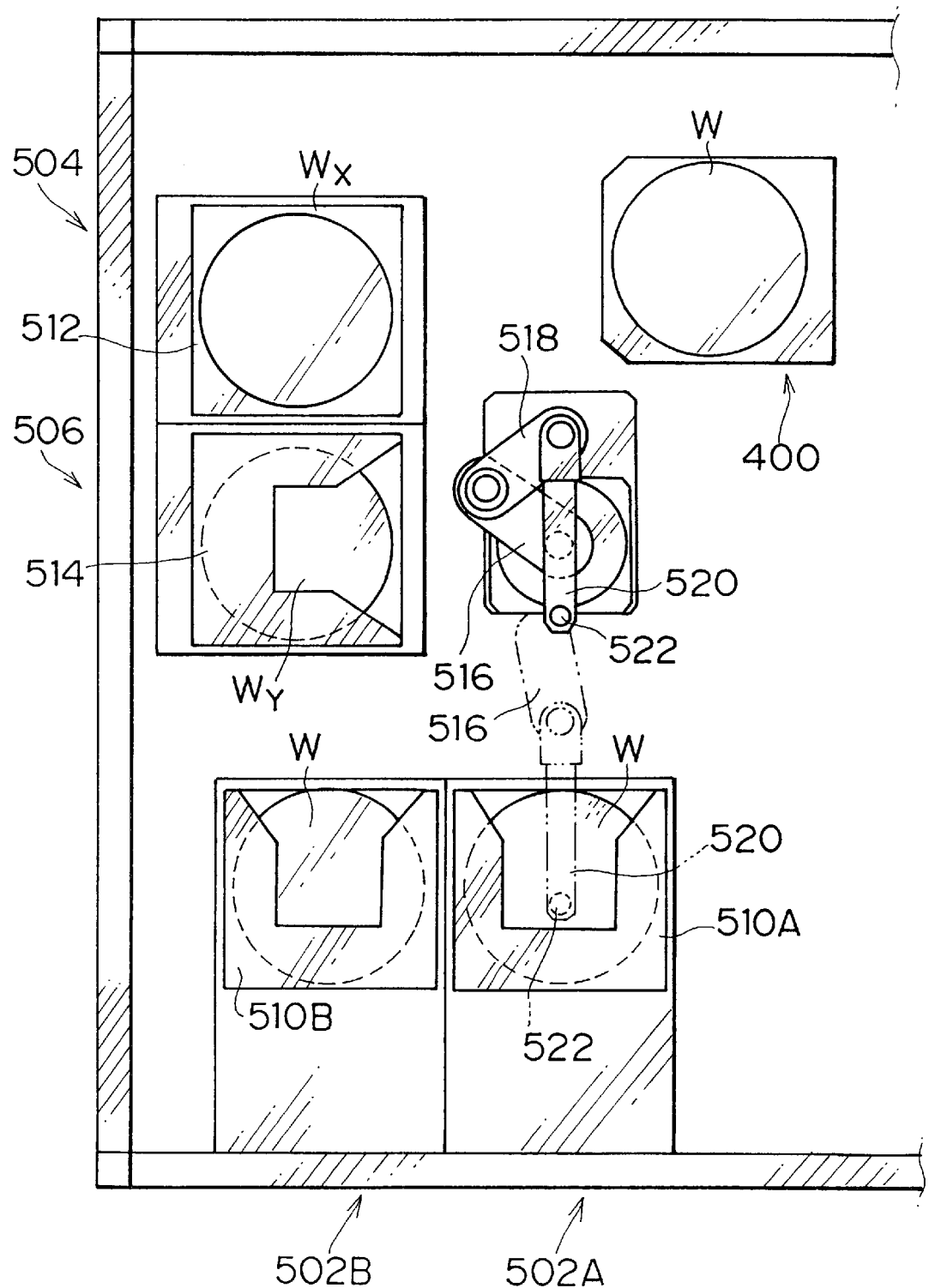
FIG. 27 is a plan view illustrating the structure of a collecting part.

A description will be given of the collecting part 500. The collecting part 500 collects the wafers W detected by the detecting part 400 in the cassettes according to their types, and collects the wafers with the adhesive agent and the failed wafers (the broken wafers, the chipped wafers, the wafers with ununiform thickness, and end wafers). As shown in FIG. 27, the collecting part 500 consists of two wafer collecting parts 502A, 502B which collect the normal wafers, a failed wafer collecting part 504 which collects the failed wafers, an adhesive agent remaining wafer collecting part 506 which collects the wafers with the adhesive agent, and a wafer transport robot 508 which transports the wafer to each collecting part.

Each of the wafer collecting parts 502A, 502B has a two-step cassette holder (not illustrated), which is liftably supported by a cassette positioning mechanism (not illustrated). The two wafer collecting cassettes 510A and the two wafer collecting cassettes 510B are placed in the cassette holders.

As is the case with the wafer collecting parts 502A, 502B, the failed wafer collecting part 504 and the adhesive agent remaining wafer collecting part 506 are provided with a cassette holder (not illustrated), which is liftably supported by a cassette positioning mechanism (not illustrated). A failed wafer collecting box 512 for collecting the failed wafers $W_x$ and an adhesive agent remaining wafer collecting cassette 514 for collecting the adhesive agent remaining wafers W are set in the cassette holders.

The wafer transport robot 508 receives the wafer W placed on the wafer receiving members 470 of the detecting part 400, and transports the wafer W to each collecting part in accordance with the detection results of the detecting part 400. The wafer transport robot 508 is a robot with many joints. A rotary second arm 518 is provided at the end of a rotary first arm 516, ad a rotary hand part 520 is provided at the end of the second arm 518. The wafer W is transported in a stated of being vacuumed by a vacuum pad 522 provided at the end of the hand part 520.

The wafer transport robot 508 transports the wafer W from the detecting part 400 to the wafer collecting cassette 510A of the wafer collecting part 502A in a manner described below.

First, the end of the hand part 520 moves to a position under the wafer W placed on the wafer receiving members 470, and the end of the hand part 520 moves up to lift the wafer W. The vacuum pad 522 holds the bottom of the wafer W. Consequently, the wafer W is delivered from the wafer receiving members 470 to the hand part 520.

After receiving the wafer W, the hand part 520 moves toward the wafer collecting part 502A and places the wafer W in the wafer collecting cassette 510A.

The interior of the wafer collecting cassette 510A, 510B is partitioned into many spaces, and one wafer W is stored in each space. The adhesive remaining wafer collecting cassette 514 is constructed in the same manner.

On the other hand, the failed wafers are placed in the failed wafer collecting box 512.

When one wafer W is stored, a cassette positioning mechanism (not illustrated) is driven to lift the wafer collecting cassette by one partition.

The wafer manufacturing apparatus 1 of the present invention is constructed in the above-mentioned manner. The control unit (not illustrated) controls all the components of the wafer manufacturing apparatus 1, and the components operate in accordance with drive signals output from the control unit.

Figure 28:
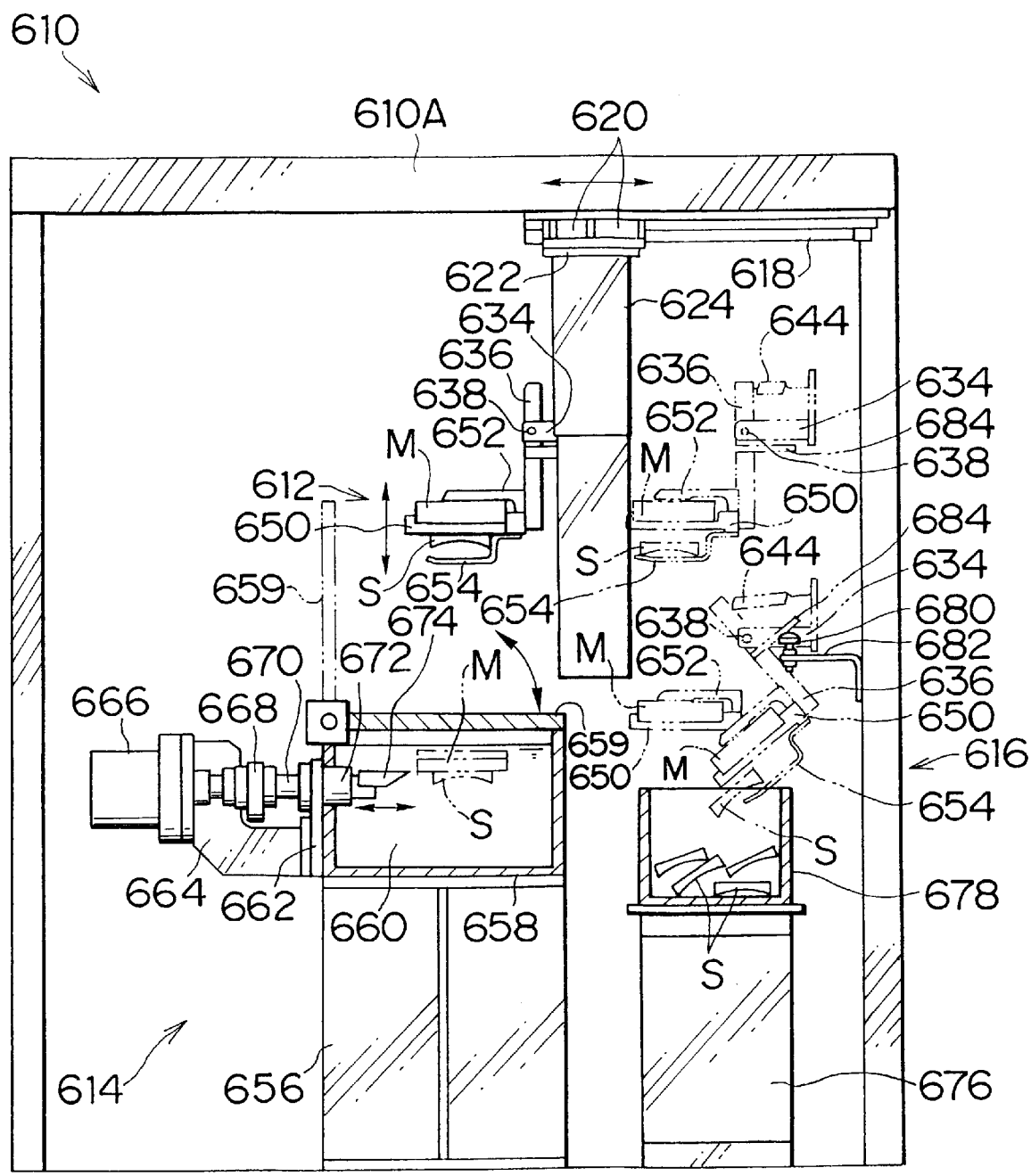
FIG. 28 is a side view illustrating the entire structure of slice base mounting beam removal equipment.

A description will be given of a slice base mounting beam removal part 600. The slice base mounting beam removal part 600 removes the slice base mounting beam S, from which the wafers W are separated, from the mounting late M. As shown in FIG. 28, the slice base mounting beam removal part 600 is provided with slice base mounting beam removal equipment 610, which consists of a mounting plate holding unit 612 for holding the mounting plate M, a slice base mounting beam removal unit 614 for removing the slice base mounting beam S from the mounting plate M, and a slice base mounting beam disposal unit 616 for disposing the slice base mounting beam S removed from the mounting plate M.

A description will be given of the structure of the mounting plate holding unit 612. As shown in FIG. 28, a guide rail 618 is formed on a ceiling of a body frame 610A. A slide table 622 is slidably supported on the guide rail 618 through a linear guide 620. A drive means (not illustrated) moves the slide table 622 on the guide rail 618.

Figure 29:
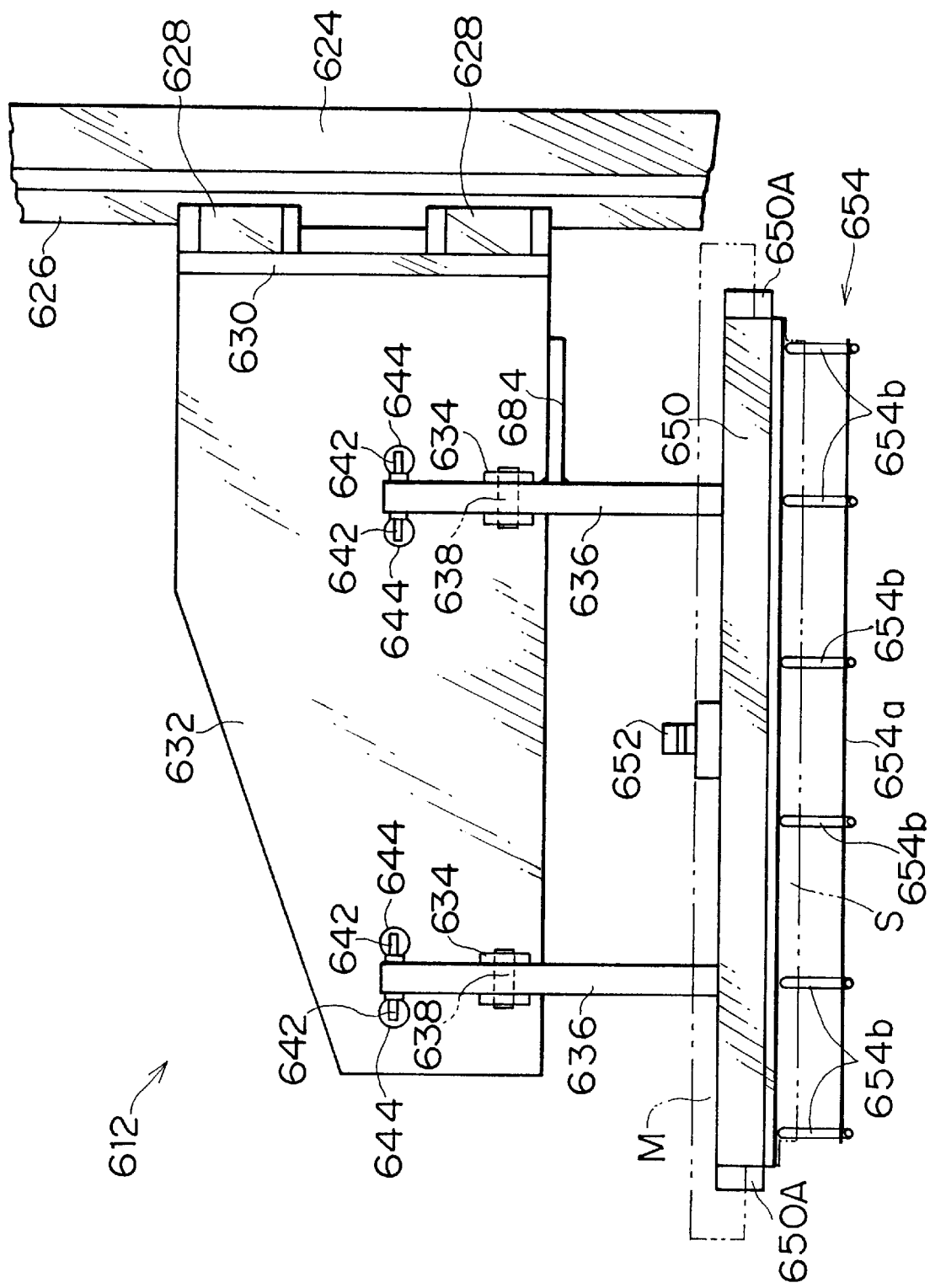
FIG. 29 is a front view illustrating the structure of the essential parts of a mounting plate holding unit.
Figure 30:
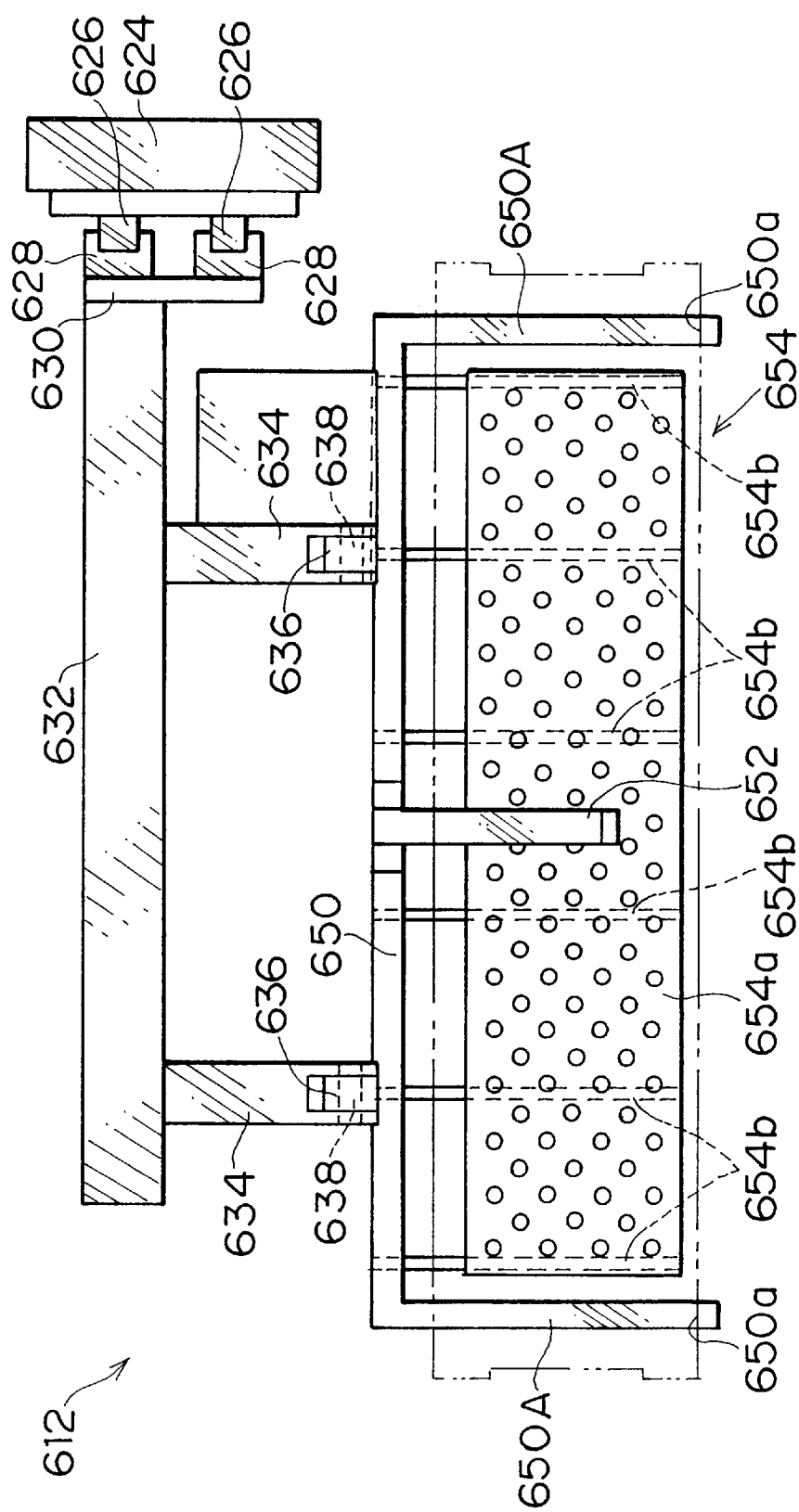
FIG. 30 is a plan view illustrating the structure of the essential parts of a mounting plate holding unit.

A lift base frame 624 is provided vertically at the bottom of the slide table 622. As shown in FIGS. 29 and 30, a pair of guide rails 626 is formed on the lifting base frame 624. A lift table 630 is slidably supported on the guide rails 626 through linear guides 628. A drive means (not illustrated) moves up and down the lift table 630 on the guide rails 626.

Figure 31:
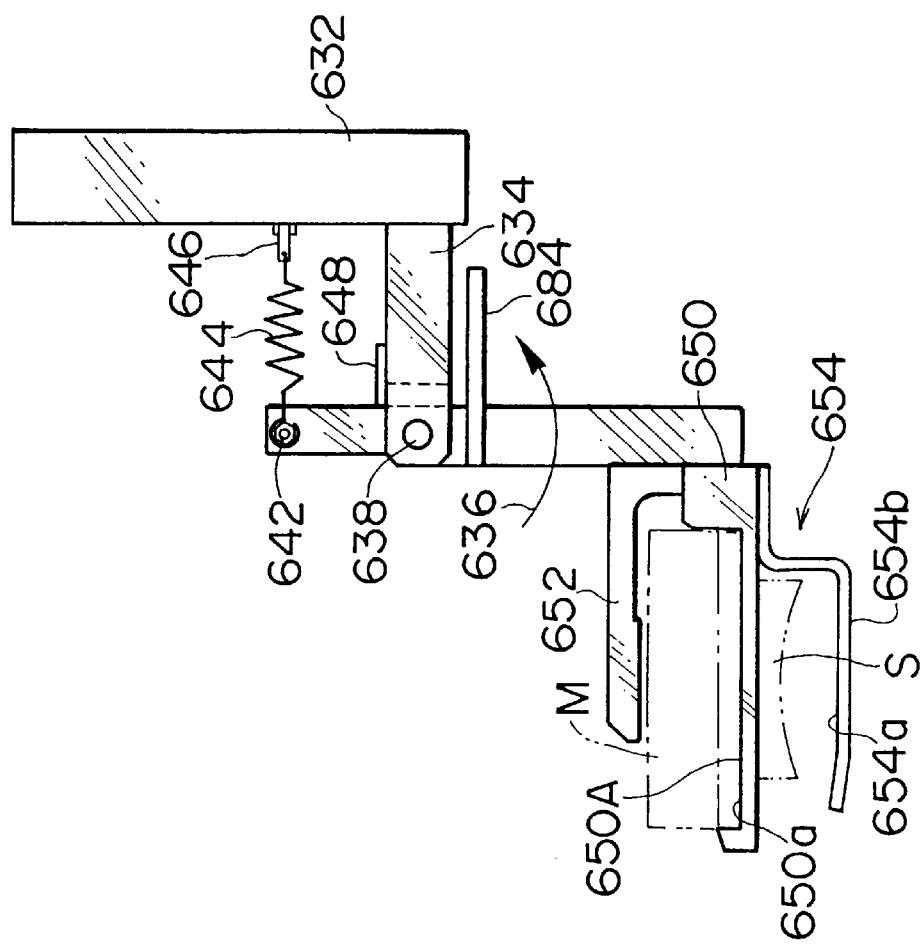
FIG. 31 is a side view illustrating the structure of the essential parts of a mounting plate holding unit.

As shown in FIGS. 29–31, a support plate 632 vertically stands on the lift table 630, and a pair of support arms 634 is horizontally secured to the support plate 632. Swinging frames 636 are swingably supported by the ends of the support arms 634 through pins 638.

Spring support pins 642 are attached to both sides of the end of each swinging frame 636, and one end of each tension spring 644 is fixed to each spring support pin 642. The other end of the tension spring 644 is fixed to each spring support pin 644. Thus, the swinging frames 636 are pressed clockwise.

Stoppers 648 are secured to the swinging frames 636, and the stoppers 648 connect to the support arms 634, thereby regulating the clockwise rotation of the swinging frames 636. Consequently, the swinging frames 636 are kept vertical under no load as shown in FIG. 31.

A mounting plate holding hand 650, which holds the mounting plate M, is horizontally secured to the bottom end of the swinging frames 636. The mounting plate holding hand 650 is U-shaped, and a pair of grooves 650*a* is formed at arm parts 650A, which extend from both ends of the mounting plate holding hand 650. Both ends of the mounting plate M are inserted into the grooves 650*a*. Both ends of the mounting plate M are fitted into the grooves 650*a*.

A pressing member 652 is secured to the center of the mounting plate holding hand 650. The pressing member 652 connects to the top end of the mounting plate M when the slice base mounting beam S is removed or disposed, so that the mounting plate M can be prevented from dropping.

A slice base mounting beam receiving plate 654 is provided below the mounting plate holding hand 650. The slice base mounting beam receiving plate 654 receives the slice base mounting beam removed from the mounting plate M. The slice base mounting beam receiving plate 654 is constructed in such a way that a rectangular punching plate 654*a* is supported by six support metal fittings 654*b* secured to the mounting plate holding hand 650.

In the mounting plate holding unit 612 which is constructed in the above-mentioned manner, the slice table 622 slides to move the mounting plate holding hand 650 horizontally, and the vertical movements of the lift table 630 result in the vertical movements of the mounting plate holding hand 650. Tilting the swinging frames 636 against the forces of the tension springs 644 tilts the mounting plate holding hand 650.

Figure 32:
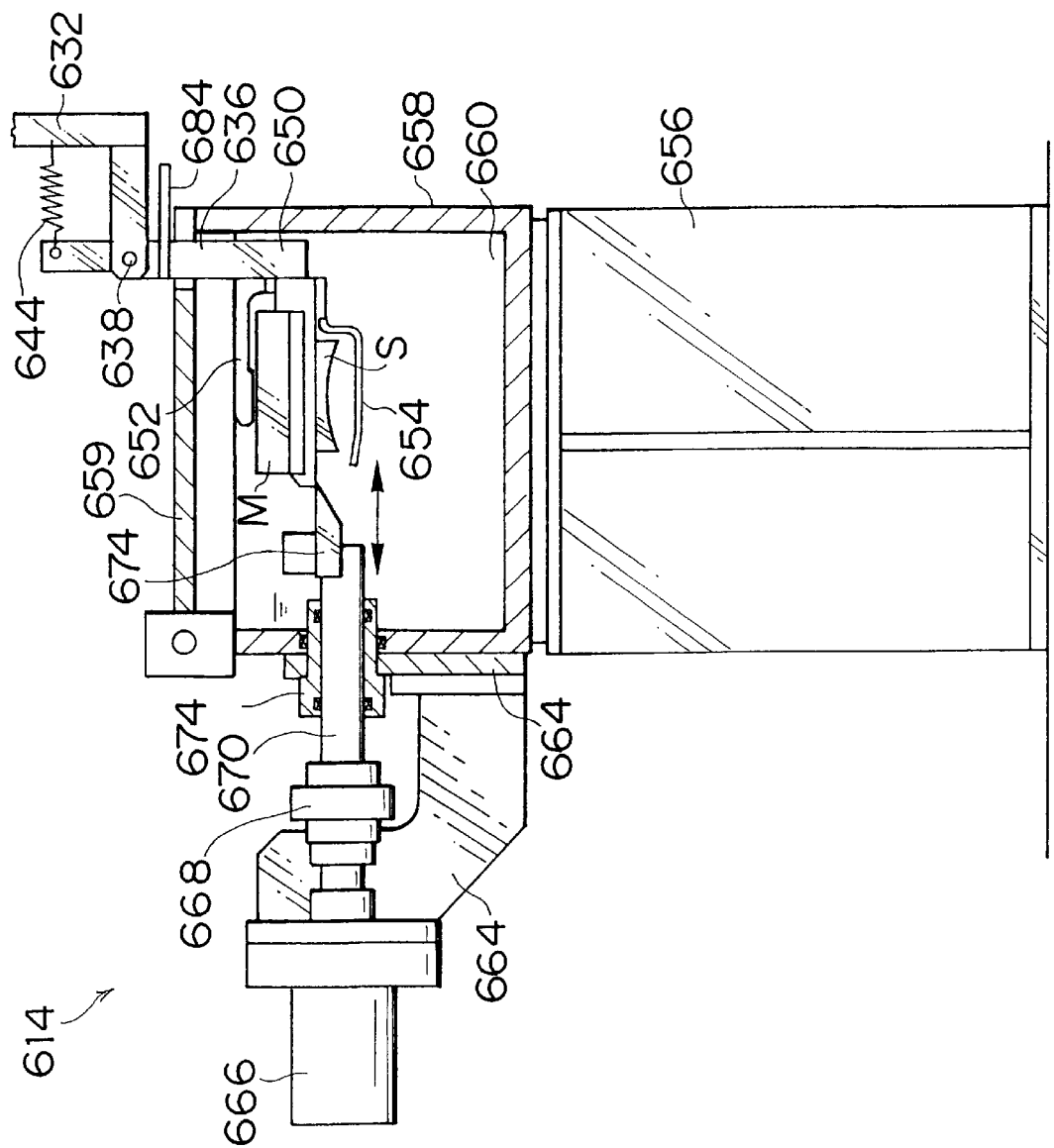
FIG. 32 is a plan view illustrating the structure of a slice base mounting beam removal unit.
Figure 33:
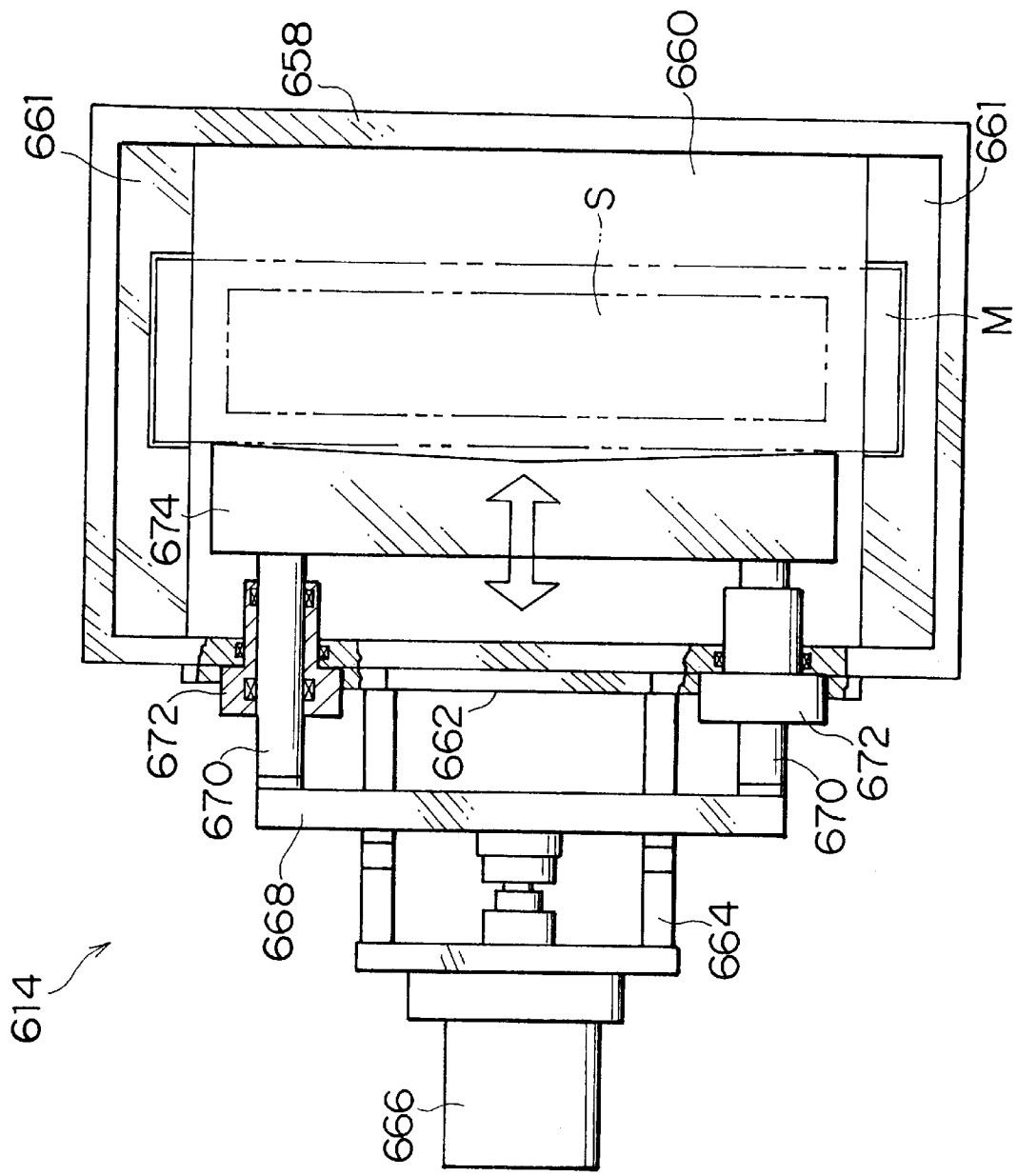
FIG. 33 is a sectional side view illustrating the structure of a slice base mounting beam removal unit.

A description will be given of the structure of the slice base mounting beam removal unit 614. As shown in FIGS. 32 and 33, a hot water tank 658 is placed on a rack 656. The hot water tank 658 contains hot water 660, and a cover 659 is attached to the top of the hot water tank 658. A rotary actuator (not illustrated) opens and closes the cover 659.

A support frame 662 is fixed to the side of the hot water tank 658, and a mounting plate receiving base 661 and a cylinder bracket 664 are fixed to the support frame 662. The mounting plate receiving base 661 holds the mounting plate M, and thus, the mounting plate M as well as the slice base mounting beam S are soaked in the hot water.

A press cylinder 666 is horizontally supported on the cylinder bracket 664. A joint plate 668 is horizontally secured to the end of the press cylinder 666, and a pair of pressure rods 670 is horizontally secured to the joint plate 668 at a predetermined interval. The pair of press rods 670 is pivotally supported on a pair of bushes 672 attached to the support plate 662. The bushes 672 go through the wall of the hot water tank 658.

A slice base mounting beam pressing member 674 is secured to the ends of the press rods 670. Pressing the side of the slice base mounting beam S with the slice base mounting beam pressing member 674 removes the slice base mounting beam S from the mounting plate M. The section of the end of the slice base mounting beam pressing member 674 is tapered so that the force can be centered on the adhering part between the mounting plate M and the slice base mounting beam S (see FIG. 32). The plane of the end of the slice base mounting beam pressing member 674 is V-shaped in order to apply the concentrated load by contacting the slice base mounting beam S at a point (see FIG. 33).

The slice base mounting beam removal unit 614, which is constructed in the above-mentioned manner, removes the slice base mounting beam S from the mounting plate M by driving the press cylinder 666 so that the slice base mounting beam pressing member 674 can press the side of the slice base mounting beam S.

A description will be given of the structure of the slice base mounting beam disposal unit 616. As shown in FIG. 28, a slice base mounting beam disposal box 678 is placed on a rack 676, and the slice base mounting beam S removed from the mounting plate M is disposed into the slice base mounting beam disposal box 678.

A stopper pin 680 is provided above the slice base mounting beam disposal box 678, and the stopper pin 680 is fixed to the body frame 610A through a bracket 682. The stopper pin 680 is connected to a lever 684 secured to the swinging frames 636. If the stopper pin 680 presses the lever 684, the swinging frames 636 tilt against the force of the tension springs 644. The slice base mounting beam receiving plate 654 tilts in association with the swinging frames 636, and therefore, the slice base mounting beam S received by the slice base mounting beam receiving plate 654 drops from the slice base mounting beam receiving plate 654. Then, the slice base mounting beam S is disposed into the slice base mounting beam disposal box 678.

A description will hereunder be given of a method for removing the slice base mounting beam S by means of the slice base mounting beam removal equipment 610 that is constructed in the above-mentioned manner.

In the initial state, the mounting plate holding hand 650 waits at a position above the slice base mounting beam disposal box 678 as indicated by broken lines in FIG. 28.

After the individual wafer separation part 14 separates the wafers W from the slice base mounting beam S, the second lifter (not illustrated) lifts the mounting plate M from the hot water tank 112 and delivers the mounting plate M to the transfer chuck (not illustrated). The transfer chuck transports the mounting plate M to the slice base mounting beam removal part 600.

When the transfer chuck reaches the slice base mounting beam removal part 600, the mounting plate holding hand 650 moves forward to receive the mounting plate M at a position (a receiving position) indicated by a solid line in FIG. 28. Then, the equipment starts operating.

First, the rotary actuator (not illustrated) opens the cover 659 for the hot water tank 658. Then, the drive means (not illustrated) moves the lift table 630 downward, and delivers the mounting plate M held by the mounting plate holding hand 650 to the mounting plate receiving base 661. When the mounting plate M is delivered to the mounting plate receiving base 661, the rotary actuator (not illustrated) is driven again to close the cover 659 for the hot water tank 658.

When, the mounting plate M is delivered to the mounting plate receiving base 661, the mounting plate M as well as the slice base mounting beam S are soaked in the hot water 660. This softens the adhesive agent, which adheres the mounting plate M to the slice base mounting beam S.

When the mounting plate M is delivered to the mounting plate receiving base 661, the slice base mounting beam S and the slice base mounting beam pressing member 674 are positioned in such a way as to face one another.

If a predetermined period (which is enough for softening the adhesive agent) has passed since the mounting plate M and the slice base mounting beam S are soaked in the hot water, the press cylinder 666 is driven to move the slice base mounting beam press member 674 forward to the slice base mounting beam S. The slice base mounting beam pressing member 674 presses the slice base mounting beam S adhered to the mounting plate M. Consequently, the slice base mounting beam S is removed from the mounting plate M.

The removed slice base mounting beam S drops due to its deadweight, and the slice base mounting beam receiving plate 654 receives the slice base mounting beam S. On the other hand, the press cylinder 666 drives the slice base mounting beam pressing member 674 again so that the slice base mounting beam pressing member 674 can move backward.

When the slice base mounting beam pressing member 674 moves back, the rotary actuator (not illustrated) is driven to open the cover 659 of the hot water tank 658. Then, the drive means (not illustrated) moves up the lift table 630. The lift table 630 stops when the mounting plate holding hand 650 reaches the receiving position (indicated by the solid line in FIG. 28). When the mounting plate holding hand 650 reaches the receiving position, the rotary actuator (not illustrated) closes the cover 659 for the hot water tank 658.

When the mounting plate holding hand 650 reaches the receiving position, the drive means (not illustrated) moves the slide table 622 horizontally. The slide table 622 stops when the mounting plate holding hand 650 stops at a predetermined waiting position (indicated by the broken lines in FIG. 28).

After the slide table 622 stops, the drive means (not illustrated) lowers the lift table 630, and therefore, the mounting plate holding hand 650 moves down toward the slice base mounting beam disposal box 678.

When the mounting plate holding hand 650 moves down to the slice base mounting beam disposal box 678, the lever 684 of the mounting plate holding hand 650 comes into contact with the stopper pin 680 fixed to the body frame 610A.

The mounting plate holding hand 650 continues moving downward after the lever 684 comes into contact with the stopper pin 680. Consequently, the lever 684 presses and tilts the stopper pin 684.

Since the lever 684 is fixed to the swinging frames 636, tilting the lever 684 causes the swinging frames 636 to tilt against the forces of the tension springs 644. Tilting the swinging frames 636 tilts the slice base mounting beam receiving plate 654. Consequently, the slice base mounting beam S drops from the slice base mounting beam receiving plate 654. The slice base mounting beam S is disposed into the slice base mounting beam disposal box 678, and the disposal of the slice base mounting beam S is completed.

The lift table 630 stops when the mounting plate holding hand 650 reaches a predetermined disposal finishing position (indicated by the broken lines in FIG. 28). Then, the lift table 630 starts moving up again so that the lift table 630 can return to the initial waiting position.

A description will be given of the operation of the wafer manufacturing apparatus 1 according to this embodiment.

The wafer manufacturing apparatus 1 of this embodiment is capable of separating and cleaning the wafers sliced in the normal slicing method (only one ingot is sliced in one slicing operation) and the wafers sliced in a multiple slicing method (different kinds of ingots are sliced at the same time in one slicing operation). First, a description will be given of the case where the wafer manufacturing apparatus 1 separates and cleans the wafers sliced in the normal slicing method.

The batched wafers W, which have been sliced by the wire saw, are transported to the loading/unloading part 50 of the wafer manufacturing apparatus 1. At the loading/unloading part 50, the wafers W are loaded in the transfer chuck (not illustrated), which is provided in the wafer manufacturing apparatus 1. When the wafers W are loaded in the transfer chuck, the mounting plate M is positioned just above the wafers W.

The wafers loaded in the transfer chuck are transported to the rough cleaning part 10, and they are delivered to the first lifter. The wafers W are showered at the rough cleaning part 10, so that the slurry, which is adhered to the wafers W during the slicing, can be eliminated.

After the showering, the first lifter 1 lifts the wafers W from the cleaning tank 14, and the wafers W are delivered to the transfer chuck. An inverter of the transfer chuck inverts the wafers W so that the mounting plate M can be positioned just above the wafers W. The transfer chuck transports the inverted wafers W to the individual wafer separation part 100, and the wafers W are delivered to the second lifter provided at the individual wafer separation part 100. The second lifter places the wafers W at the workpiece holding part 122 in the hot water tank 122.

When the wafers W are placed at the workpiece holding part 122, the partition 234C is inserted between the wafer lots. Then, the separation vacuum pad 200 separates the wafers W from the slice base mounting beam S one by one. The separated wafers W are sequentially transferred to the conveyor 312 of the transport part 310, and they are transported on the conveyor 312 to the wafer individual cleaning part 400.

At the individual wafer cleaning part 400, the wafers W are brushed with the cleaning liquid. Then, the wafers W are brushed with the pre-rinse liquid at the individual wafer pre-rinse part 354. Finally, the wafers W are brushed with the rinse-liquid at the individual wafer rinse part 356.

The wafers W, which has already been brushed at the individual wafer rinse part 356, are transferred to the circular belt conveyor 411 of the detecting part 400. The wafers are transported on the circular belt conveyor 411 to the predetermined delivery position.

The vacuum pads 430 attached to the rotary table 428 hold the wafers W transported to the delivery position, and the wafers are lifted to a predetermined detecting position and are rotated. The thickness measurement unit 406 measures the thickness of the wafers W, and the failed wafer detecting unit 408 detects the broken or chipped part and the remaining adhesive agent.

On completion of the detection, the wafers W are delivered to the wafer receiving member 470, and the wafer transport robot 508 of the collecting part 500 receives the wafers W delivered to the wafer receiving member 470. Then, the wafers W are stored in the cassettes of the collecting parts 502, 504, 506.

The control unit stores the wafers W in the cassettes of the collecting parts 502, 504, 506 in accordance with the detection results of the thickness measurement unit 406 and the failed wafer detecting unit 408. Specifically, if the thickness measurement unit 406 and the failed wafer detecting unit 408 determine the wafers W as being normal as a result of the detection, the wafers W are stored in the upper wafer collecting cassette 510A set at the wafer collecting part 502A. The wafers $W_x$, which are different in thickness, chipped or broken, etc., are stored in the failed wafer collecting box 510A set at the failed wafer collecting part 504. The wafers $W_y$ with the adhesive agent remaining thereon are stored in the adhesive agent remaining wafer collecting cassette 514 set at the adhesive agent remaining wafer collecting part 506 (The normal wafers W are stored in the lower wafer collecting cassette 510A at the wafer collecting part 402A as soon as the upper wafer collecting cassette 510A is filled. As soon as the lower wafer collecting cassette 510A is filled, the wafers W are stored in the upper wafer collecting cassette 510B set at the wafer collecting part 502B).

The above-described operation is performed for each of the wafers separated from the slice base mounting beam S. The operation is finished when all the wafers W are stored in the cassette.

When all the wafers W are separated from the slice base mounting beam S, in other words, when the third partition 234 is detected, the separation is finished and the second lifter (not illustrated) lifts the mounting plate M from the hot water tank 112 at the individual wafer separation part 100. The lifted mounting plate M is delivered to the transfer chuck (not illustrated). The transfer chuck transports the mounting plate M to the slice base mounting beam removal part 600, and delivers the mounting plate M to the mounting plate holding hand 650 of the slice base mounting beam removal equipment 610.

After receiving the mounting plate M, the mounting plate holding hand 650 soaks the slice base mounting beam S, which is adhered to the mounting plate M, in the hot water 660.

The slice base mounting beam receiving plate 654 receives the slice base mounting beam S removed from the mounting plate M, and the slice base mounting beam S is disposed into the slice base mounting beam disposal box 678.

The wafers are separated and cleaned in the above-mentioned manner, and thereafter, each unit returns to the initial state prior to the start of the operation.

As stated above, the wafer manufacturing apparatus of this embodiment is provided with the detecting part 400, which detects the thickness, the broken or chipped part and the remaining adhesive agent with respect to the separated and cleaned wafers W. The wafers W are classified and collected in accordance with the detection results of the detecting part 400. This eliminates the necessity for transporting the wafers to another detecting unit for the purpose of detection, and thus, the wafers can be manufactured efficiently.

A description will hereunder be given of the case where the wafer manufacturing apparatus 1 of this embodiment separates and cleans the wafers sliced in the multiple slicing method.

The wafers sliced in the multiple slicing method are collected according to their types as described below. The wafers are transported to the individual wafer separation part 100 in the same manner as the wafers sliced in the normal slicing method. Thus, a description will only be given of steps after the wafers are transported to the individual wafer separation part 100.

When the wafers Wa–Wc, which are sliced in the multiple slicing method, are set at the workpiece holding part 122 of the individual wafer separation part 100, the partitions 234A–234C are inserted between the wafer lots Wa–Wc. Then, the separation vacuum pads 200 start separating the wafers.

The separation starts for the wafers Wa of the first lot, and the separated wafers Wa are transferred to the conveyor 312 of the transport part 310.

The wafers Wa transferred to the conveyor 312 are cleaned individually at the individual wafer cleaning part 350. Then, the detecting part 400 measures the thickness of the wafer and detects the broken or chipped part and the remaining adhesives. The wafers Wa are stored in the collecting cassettes of the collecting parts in accordance with the detection results. The normal wafers Wa are stored in the upper wafer collecting cassette 510A set at the wafer collecting part 502A.

When the separation for the wafers Wa of the first lot is completed, the first partition 234A inserted between the first lot and the second lot is detected. If the first partition 234A is detected, the control unit determines the wafers, which are separated thereafter, as being the wafers Wb of the second lot, and collects the wafers Wb in a manner described below. The failed wafers $W_x$, which are irregular in thickness, etc., and the wafers $W_y$ with the adhesive agent are stored in the failed wafer collecting box 512 and the adhesive agent remaining wafer collecting cassette 514, respectively. The normal wafers Wb are stored in the lower wafer collecting cassette 510A at the wafer collecting part 502A. It is therefore possible to classify the wafers according to lots and collect the wafers without mixing different kinds of wafers.

When the separation for the wafers of the second lot is completed, the second partition 234B between the second lot and the third lot is detected. On detection of the second partition 234B, the control unit determines the wafers, which are separated thereafter, as being the wafers Wc of the third lot. The wafers Wc are collected as described below. Specifically, the failed wafers $W_x$, which are irregular in thickness, and the wafers $W_y$ with the adhesive agent are stored in the detective wafer collecting box 512 and the adhesive agent remaining wafer collecting cassette 514, respectively. The normal wafers Wc are stored in the upper wafer collecting cassette 510B at the wafer collecting part 502B.

In this embodiment, the three partitions 234A–234C are arranged, but the number of partitions is not restricted to three. The number of partitions may be changed according to the number of wafer lots subject for separation.

The individual wafer separation apparatus with three partitions 234A–234C is able to separate two wafer lots, and in this case, only the second partition 234B and the third partition 234C are used for partition.

The wafer manufacturing apparatus 1 of this embodiment is provided with the slice base mounting beam removal equipment 610, which removes the slice base mounting beams automatically from the mounting plate M. For this reason, the operator does not have to manually remove the slice base mounting beam S. This improves the processing efficiency, and the operator is not exposed to danger.

In this embodiment, the slice base mounting beam removal equipment 610 is incorporated into the wafer manufacturing apparatus 1. The slice base mounting beam removal equipment 610 may be arranged independently of the wafer manufacturing apparatus 1 (the slice base mounting beam removal equipment 610 may be used separately). In this case, the operator may manually set the mounting plate M on the mounting plate holding hand 650, or a manipulator may automatically set the mounting plate M.

Figure 34:
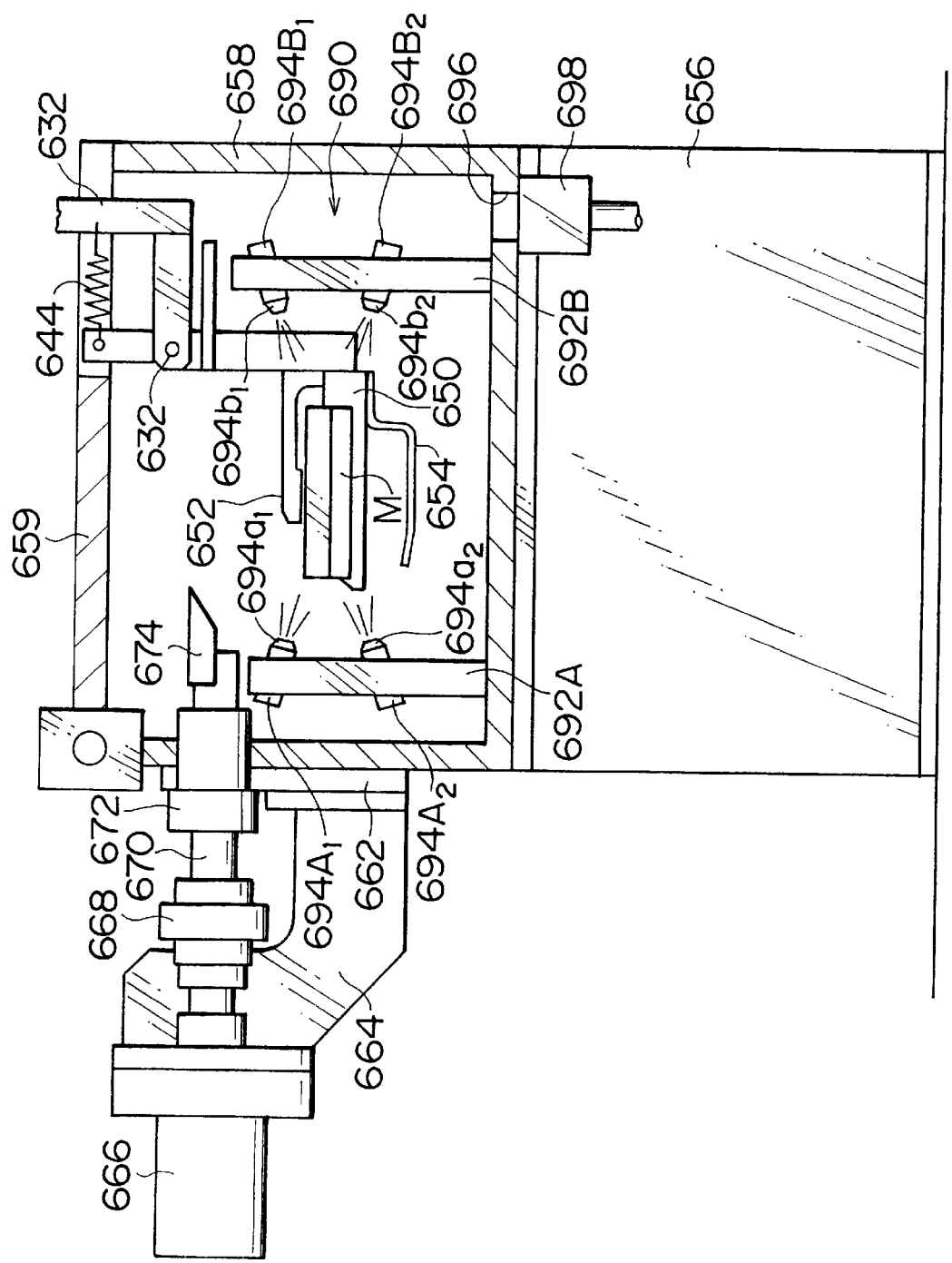
FIG. 34 is a sectional side view illustrating the structure of a mounting plate cleaning unit.

As shown in FIG. 34, a mounting plate cleaning unit 690 is provided in the hot water tank 658 of the slice base mounting beam removal equipment 610 in order to clean the mounting plate M. In this case, the operator does not have to clean the mounting plate M, from which the slice base mounting beam S has been removed, and this improves the processing efficiency.

The mounting plate cleaning unit 690 is constructed as described below.

As shown in FIG. 34, a pair of supports 692A, 692B stands vertically in the hot water tank 658. A pair of cleaning liquid jetting nozzles 694A$_1$, 694A$_2$ is provided on the support 692A, and a pair of cleaning liquid jetting nozzles 694B$_1$, 694B$_2$ is provided on the support 692B. The cleaning liquid jetting nozzles 694A$_1$, 694A$_2$, 694B$_1$, 694B$_2$ have jetting holes 694a$_1$, 694a$_2$, 694b$_1$, 694b$_2$ with almost the same length as the mounting plate M. A high-pressure cleaning liquid is jetted from jetting holes 694a$_1$, 694a$_2$, 694b$_1$, 694b$_2$ toward the mounting plate M, which is positioned at a predetermined cleaning position.

The hot water tank 658 has an outlet 696 for disposing the hot water 660 stored in the hot water tank 658 and the cleaning liquid jetted from the jetting nozzles 694a$_1$, 694a$_2$, 694b$_1$, 694b$_2$. The outlet 696 can be opened and closed by an electromagnetic valve 698.

A description will be given of the operation of the mounting plate cleaning unit 690, which is constructed in the above-mentioned manner.

As stated previously, after removing the slice base mounting beam S from the mounting plate M, the mounting plate holding hand 650 disposes the removed slice base mounting beam S into the slice base mounting beam disposal box 678. Then, the mounting plate holding hand 650 returns to the receiving position.

The hot water 660 in the hot water tank 658 is discharged from the outlet 696 while the mounting plate holding hand 650 disposes the removed slice base mounting beam S into the slice base mounting beam disposal box 678 and returns to the receiving position.

If the drive means (not illustrated) lowers the lift table 630, the mounting plate holding hand 650 lowers from the receiving position toward the hot water tank 658. The lift table 630 stops when the mounting plate holding hand 650 is positioned at the predetermined cleaning position as shown in FIG. 34.

When the lift table 630 stops, a cleaning liquid supply means (not illustrated) connected to the cleaning liquid jetting nozzles 694A$_1$, 694A$_2$, 694B$_1$, 694B$_2$ is driven to jet the high-pressure cleaning liquid toward the mounting plate M through the cleaning liquid jetting nozzles 694A$_1$, 694A$_2$, 694B$_1$, 694B$_2$. The mounting plate M is cleaned by the high-pressure cleaning liquid jetted from the cleaning liquid jetting nozzles 694A$_1$, 694A$_2$, 694B$_1$, 694B$_2$, so that the slurry, etc. adhered to the mounting plate M can be removed.

If a predetermined time has passed since the start of the jetting, the cleaning liquid supply means is stopped, and the drive means (not illustrated) moves up the lift table 630. The lift table 630 stops when the mounting plate holding hand 650 is positioned at the predetermined receiving position, and the cleaning of the mounting plate M is completed. The operator delivers the mounting plate M from the mounting plate holding hand 650 positioned at the receiving position to the transfer chuck (not illustrated), which transports the mounting plate M to the loading/unloading part 50. At the loading/unloading part 50, the mounting plate M is loaded on the transport apparatus 9, which transports the mounting plate M to the mounting plate collecting apparatus 8.

If the slice base mounting beam removal equipment 610 is provided with the mounting plate cleaning unit 690, the operator does not have to clean the mounting plate M, from which the slice base mounting beam S has been removed. This improves the processing efficiency.

In this embodiment, the slice base mounting beam removal unit 614 and the mounting plate cleaning unit 690 share the hot water tank 658 and integrated, but the slice base mounting beam removal unit 614 and the mounting plate cleaning unit 690 may also use different tanks and arranged separately.

In this embodiment, the individual wafer separation apparatus 110 is incorporated into the wafer manufacturing apparatus 1, but the individual wafer separation apparatus 110 may be arranged independently of the wafer manufacturing apparatus 1 (the individual wafer separation apparatus 110 may be used separately). In this case, the operator may manually set the mounting plate M on the workpiece holding part 122, or the manipulator may automatically set the mounting plate M.

It is also possible to use an individual wafer separation apparatus 710 instead of the individual wafer separation apparatus 110. A description will hereunder be given of the individual wafer separation apparatus 710.

Figure 35:
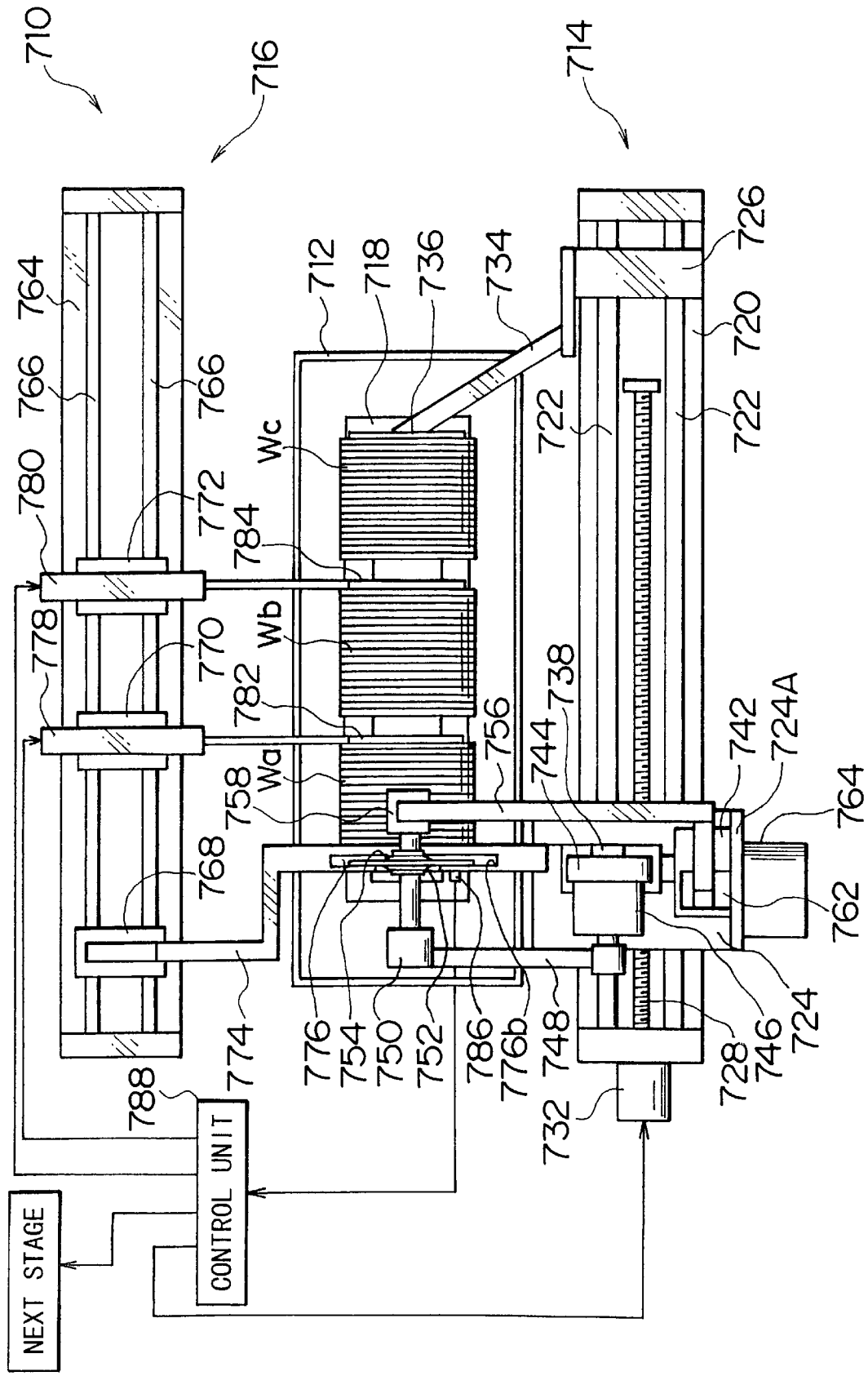
FIG. 35 is a plan view illustrating the structure of another embodiment of an individual wafer separation apparatus.
Figure 36:
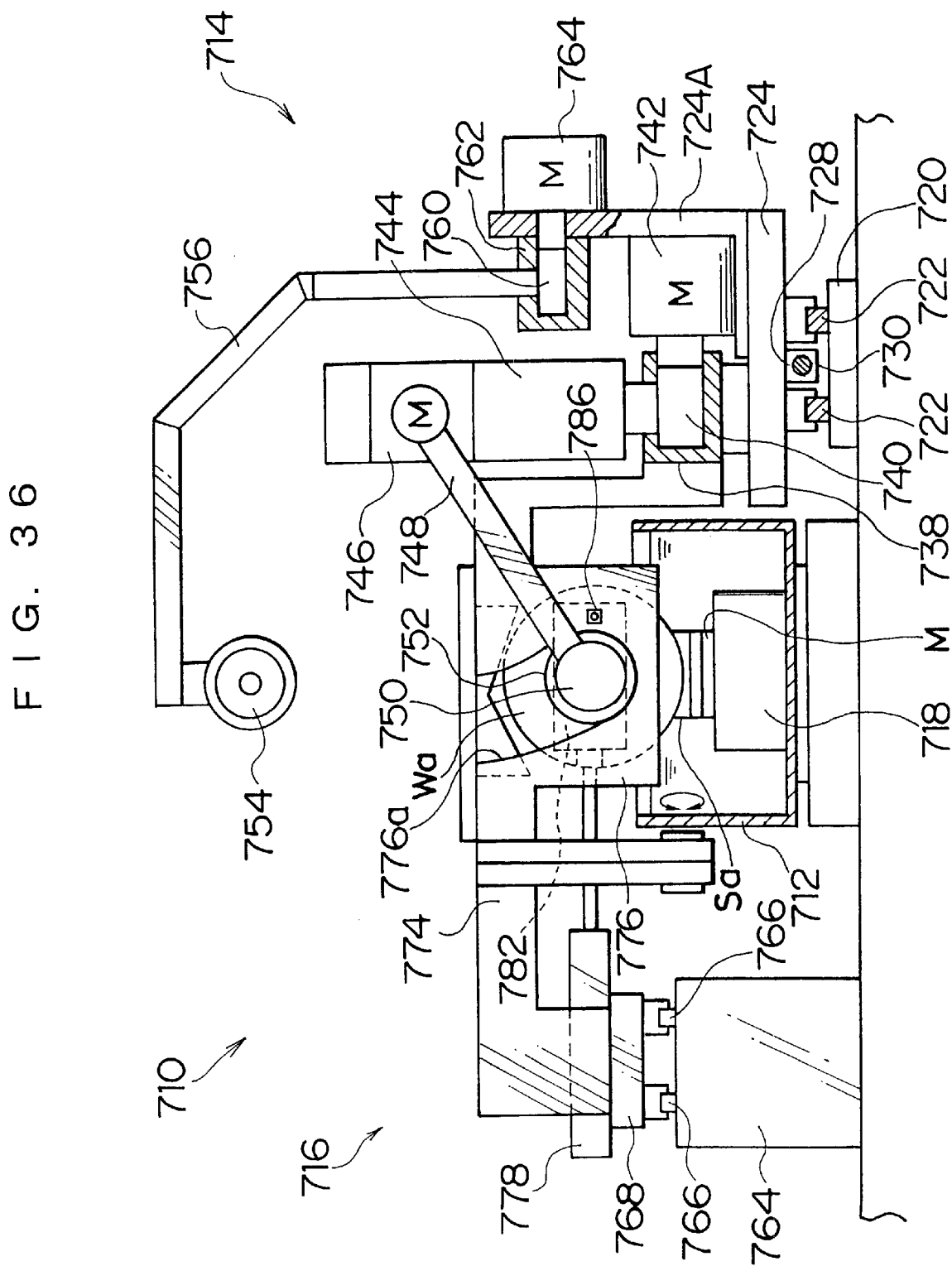
FIG. 36 is a front view illustrating the structure of another embodiment of an individual wafer separation apparatus.

As shown in FIGS. 35 and 36, the individual wafer separation apparatus 710 is comprised mainly of a hot water tank 12, individual wafer separation equipment 714 and a partition apparatus 716. A description will be given of each apparatus.

The hot water tank 712 is a rectangular box, which opens at the top thereof, and hot water is stored in the hot water tank 712. The wafers Wa–Wc subject for separation are attached to an attachment base 718 provided in the hot water tank 712.

The wafers Wa–Wc are attached to the attachment base 718 as described below. The mounting plate M, to which the wafers Wa–Wc are adhered, is placed at predetermined positions on the attachment base 718. A lock means (not illustrated) fixes the placed mounting plate M. Consequently, the adhering parts of the wafers Wa, Wb, Wc, which are adhered to the slice base mounting beams Sa, Sb, Sc, are soaked in the hot water stored in the hot water tank 712.

A description will be given of the structure of the individual wafer separation equipment 714. The individual wafer separation equipment 714 has a base 720, which is arranged in parallel with the hot water tank 712 (at the lower part in FIG. 35). A pair of guide rails 722 is formed on the base 720, and two sliders 724, 726 are slidably supported on the guide rails 722.

The slider 724 arranged at the left side in FIG. 35 is engaged with a feed screw 728, which is arranged in parallel with the guide rails 722 through a nut member 730. A feed motor 732 connects to the feed screw 728. Running the feed motor 732 moves the slider 724 on the guide rails 722.

On the other hand, the slider 726 arranged at the right side in FIG. 35 is manually moved on the guide rails 722, and the lock means (not illustrated) locks the slider 726 at an arbitrary position. A receiving plate 736 is connected to the slider 726 through an arm 734. The receiving plate 736 is arranged in parallel with the reverse sides of the wafers Wc placed in the hot water tank 712. If the wafers Wc, which are separated at last, are separated from the slice base mounting beam S for some reasons before they are separated by a vacuum pad, the receiving plate 736 prevents the separated wafers Wc from falling backward. If the wafers Wc fall backward, the receiving plate 732 supports the wafers Wc to enable the collection of them.

On the other hand, the slider 724 located at the left side in FIG. 35 is provided with a separation mechanism, which separates the wafers Wa–Wc from the slice base mounting beams Sa–Sc. The separation mechanism separates the wafers Wa–Wc from the slice base mounting beams Sa–Sc one by one with the vacuum pad. A description will hereunder be given of the structure of the separation mechanism.

A bearing 738 is provided above the slider 724, and a shaft 740 is rotatably supported on the bearing 738. A spindle of a swinging motor 742 connects to the base end of the shaft 740. Running the swinging motor 742 rotates the shaft 740.

A column 744 stands on the shaft 740, and a lift motor 746 is provided at the end of the column 744. A base end of the arm 748 is secured to a spindle of the lift motor 746, and running the lift motor 746 swings the arm 748 vertically.

A cylinder 750 is attached to the end of the arm 748, and a vacuum pad 752 is secured to the end of the rod of the cylinder 750. The cylinder 750 drives the vacuum pad 752, which moves forward and backward along the axis thereof. A vacuum pump (not illustrated) connects to the vacuum pad 752, and the vacuum pump is driven to hold the wafers.

Accordingly, running the swinging motor 742 swings the vacuum pad 752 and a stopper plate 776 along the wafers, and running the lift motor 746 moves them vertically. Swinging the vacuum pad 752, which holds the end faces of the wafers Wa–Wc, separates the wafers Wa–Wc from the slice base mounting beams Sa–Sc.

A receiving pad 754 is arranged above the vacuum pad 752, and the receiving pad 754 receives the wafers Wa–Wc separated by the vacuum pad 752. The receiving pad 754 is attached to the end of the arm 756 through a cylinder 758. Driving the cylinder 758 moves the receiving pad 754 forward and backward along the axis of the axis thereof. A vacuum pump (not illustrated) connects to the receiving pad 754, and the vacuum pump is driven to hold the wafers.

The base end of the arm 756 provided with the receiving pad 754 connects to the shaft 760, which is rotatably supported on a support plate 724A, which stands on the slider 724 through a bearing 762. A spindle of an arm swinging motor 764 connects to the shaft 760, and running the arm swinging motor 764 swings the arm 756 to the left side in FIG. 35 within the range of 90°.

According to the separation mechanism, the vacuum pad 752 holds the central parts of the end faces of the wafers Wa–Wc, and the vacuum pad 752 swings the wafers Wa–Wc so that the wafers Wa–Wc can be separated from the slice base mounting beams Sa–Sc. The vacuum pads 752 carry the separated wafers upward and deliver them to the receiving pad 754. Then, the receiving pad 754 falls forward at a right angle, so that the wafers can be delivered to the transport apparatus (not illustrated). A description will be given of the operation of the transport apparatus later in detail.

A description will be given of the structure of the partition apparatus 716. As shown in FIG. 35, the partition apparatus 716 is arranged symmetrically with the individual wafer separation equipment 714 with respect to the hot water tank 712. The partition apparatus 716 has a base 764, which is arranged in parallel with the hot water tank 712. A pair of guide rails 766 is formed on the base 764, and three sliders 768, 770, 772 are slidably supported on the guide rails 766.

The slider 768 (hereinafter referred to as a running slider), which is positioned at the left side in FIG. 35, is connected to the slider 724 of the individual wafer separation equipment 714 through a connecting bar 774. The running slider 768 moves with the slider 724.

As shown in FIG. 36, a substantially rectangular stopper plate 776 is attached to the connecting bar 774, which connects the running slider 768 with the slider 724. The stopper plate 776 is positioned at the front of the wafers Wa placed in the hot water tank 712, and the stopper plate 776 prevents the wafers Wa from falling forward (to the left in FIG. 35) during the separation of the wafers Wa.

As shown in FIG. 36, a U-shaped cut 776a is formed in the stopper plate 776 as shown in FIG. 36, and the vacuum pad 752 moves vertically through the cut 776a.

The upper part of the stopper plate 776 is bent at a right angle to form a bearing part, and a slit 776b is formed at the bending part in such a way that one wafer Wa can pass through the slit 776b. When the wafer Wa separated by the vacuum pad 752 is lifted, the slit 776b prevents two wafers Wa from being lifted at the same time. A description will be given of the operation of the slit 776b.

If two wafers Wa are separated at the same time for some reasons, the separated two wafers are attached to one another and they are lifted at the same time. In this case, the lifted two wafers cannot pass through the slit 776b, and therefore, only one wafer can be taken out.

The wafer, which drops without passing through the slit 776b, falls forward or backward. Even if the wafer falls forward, it can be collected in the next separation since there is provided the stopper plate 776.

Although not illustrated, a touch sensor is provided on the stopper plate 776 in such a way as to face the wafers Wa. When the touch sensor contacts with the wafers Wa, it is possible to confirm the positions of the wafers that will be separated by the vacuum pad 752.

The running slider 768 moves with the slider 724 of the individual wafer separation equipment 714. The slider 770 (hereinafter referred to as the first slider) located at the center in FIG. 35 and the slider 772 (hereinafter referred to as the second slider) located at the right side are moved manually on the guide rails 766.

The first slider 770 and the second slider 772 are provided with a first cylinder 778 and a second cylinder 780, respectively. The rod of each cylinder expands and contracts perpendicularly to the wafers Wa–Wc placed in the hot water tank 712. A rectangular first partition 782 and a rectangular second partition 784 are provided at the ends of the first cylinder 778 and the second cylinder 780, respectively. Each partition is inserted between the wafers Wa–Wc in the hot water tank 712 by expanding the rod of each cylinder.

If the first partition 782 and the second partition 784 are inserted between the wafers Wa and Wb and between the wafers Wb and Wc, respectively, and thus, the wafers can be partitioned between the lots.

If the first partition 782 and the second partition 784 are inserted between the wafers, the presence of the inserted partitions must be detected in order to separate the wafers continuously. The presence of the first partition 782 and the second partition 784 is detected as described below.

Both the first partition 782 and the second partition 784 have a contact (not illustrated). On the other hand, the stopper plate 776 is provided with a sensor 786, which detects the contacts provided on the partitions. As shown in FIG. 36, until wafers immediately in front of the first partition 782 and the second partition 784 are separated, the first partition 782 and the second partition 784, are inserted between the wafers, are hidden by those wafers. Thus, the sensor 786 does not detect the contacts in this state. After the wafers immediately in front of the first partition 782 and the second partition 784 are separated, nothing obstructs the contacts. The sensor 786 detects the contacts, and the presence of the partitions is confirmed.

The sensor 786 outputs a detection signal to a control unit 788, which drives the individual wafer separation apparatus 710. The control unit 788 controls the individual wafer separation apparatus 710 in accordance with the detection signal.

A description will be given of the operation of the individual wafer separation apparatus 710.

First, the wafers Wa–Wc subject for separation from the slice base mounting beams are set in the hot water tank 712. The lifter (not illustrated) may automatically set the wafers Wa–Wc, or the operator may set the wafers Wa–Wc manually.

Then, the operator manually moves the first slider 770 provided at the partition apparatus 716, so that the first partition 782 can move into a space between the wafers Wa and Wb. After the first partition 782 moves, the first cylinder 778 is driven to insert the first partition 782 between the wafers Wa and Wb. After the insertion, the first slider 770 is moved forward (to the left in FIG. 35) so that the first partition 782 can contact with the end face of the wafers Wa.

Likewise, the operator inserts the second partition 784 between the wafers Wb and the wafers Wc, so that the second partition 784 can contact with the end face of the wafers Wb.

Then, the operator manually moves the slider 726, which is provided in the individual wafer separation equipment 714, so that the receiving plate 736 can contact with the end face of the wafers Wc.

The operator finishes the initialization processing, and the individual wafer separation apparatus 710 starts operating. The reason for brining the first partition 782 and the second partition 784 into contact with the end faces of the wafers is to prevent the last wafer from separating naturally and falling backward.

First, the feed motor 732 is run to move the slider 724 on the guide rails 722 to the right in FIG. 35. The slider 724 stops when the touch sensor (not illustrated) of the stopper plate 776 contacts with the end face of the wafer Wa. Consequently, the vacuum pad 752 contacts with the end face of the wafer Wa.

When the slider 724 stops moving, the vacuum pump (not illustrated) connected to the vacuum pad 752 is driven to hold the end face of the wafer Wa. In this state, a swinging force is applied to the vacuum pad 752. Specifically, the swinging motor 742 is run to swing the column 744, and therefore, the vacuum pad 752 and the stopper plate 776 are driven to swing.

If the swinging force is applied to the wafer Wa, which is placed in the hot water tank 712, a plurality of times, they are separated from the slice base mounting beam S, since the adhering part with the slice base mounting beam S is soaked in the hot water and softened by heat. The swinging motor 742 stops running after swinging the vacuum pad 752 and the stopper plate 776 a predetermined number of times.

The vacuum pad 752, which holds the wafer Wa separated from the slice base mounting beam Sa, moves up to the receiving pad 754. Specifically, the lift motor 746 is run to rotate the arm 748 upward, and the vacuum pad 752 stops at such a position as to face the receiving pad 754. The separated wafer Wa is delivered to the receiving pad 754.

To deliver the wafer Wa, the cylinder 758 drives the receiving pad 754 so that the receiving pad 754 can move toward the vacuum pad 752 by a predetermined amount. Consequently, the receiving pad 754 is adhered to the wafer Wa.

When the receiving pad 754 is adhered to the wafer Wa, the vacuum pump (not illustrated) connected to the receiving pad 754 is driven so that the receiving pad 754 can hold the wafer Wa. When the receiving pad 754 holds the wafer Wa, the vacuum pad 752 stops vacuuming the wafer Wa, so that the wafers Wa can be delivered to the receiving pad 754.

When the wafers Wa is delivered to the receiving pad 754, the cylinder 750 moves back the vacuum pad 752 from the wafer Wa by a predetermined amount. Then, the arm 748 moves down to the original separating position.

When the wafer Wa is delivered to the receiving pad 754, the arm swinging motor 756 is run to rotate the arm 756 by 90° forward (to the left in FIG. 35). Consequently, the wafer Wa held by the receiving pad 754 rotates to fall forward at an angle of 90°. The transport apparatus (not illustrated) is located at a position that the wafer Wa reaches as a result of the rotation. The transport apparatus receives the wafer W and transports the wafer W to the next stage. (If the individual wafer separation apparatus 710 is incorporated into the wafer manufacturing apparatus 1, the shuttle conveyor 312, which transports the wafer Wa to the individual wafer cleaning part 350, is located, and the shuttle conveyor 312 transports the wafer Wa to the individual wafer cleaning part 350.)

After delivering the wafer Wa to the transport apparatus, the arm 756 is driven by the swinging motor 764 and returns to the original upright state.

Thus, the separation of the first wafer Wa is completed, and the following wafers are separated in the same procedure.

The wafers Wa (the wafers sliced from the ingot Ia), which are placed in the hot water tank 712, are separated sequentially. When the separation of the wafers Wa is completed, the first partition 782 inserted between the wafers Wa and Wb appears in front of the stopper plate 776.

As mentioned previously, the first partition 782 has the contact (not illustrated). When the first partition 782 appears in front of the stopper plate 776, the sensor 786 of the stopper plate 776 detects the contact.

On detection of the contact, the sensor 786 outputs the detection signal to the control unit 788. On input of the detection signal, the control unit 788 recognizes that all the wafers Wa has been separated. The control unit 788 controls the individual wafer separation apparatus 710 as described below.

First, the control unit 788 outputs a stop signal to the individual wafer separation equipment 714 in order to stop the separation of the vacuum pad 752. Then, the control unit 788 outputs a signal to a control part of the next stage to indicate that the separation of the wafers Wa is complete. If the cleaning is performed at the next stage, the control unit 788 outputs the signal to the control part of the cleaning apparatus. On input of the signal, the control part of the cleaning apparatus exchanges the cassettes for collecting the cleaned wafers, and the like in order to prevent the different kinds of wafers from getting mixed.

If the collection is performed at the next stage, the collecting cassettes are exchanged and the partition is inserted between the wafers to indicate that the wafers collected thereafter are of different types.

At the next stage, the above-mentioned preparations may be automatically performed or manually by the operator.

On completion of the preparations, the control unit 788 starts separating the wafers Wb.

Specifically, on input of a signal indicating the restart of the separation from the operator or the next stage, the control unit 788 drives the first cylinder 778 and moves back the first partition 782 from in front of the wafers Wb. Then, the control unit 788 outputs a drive signal to the individual wafer separation equipment 714 to start separating the wafers Wb. The wafers Wb are separated in the same manner as the wafers Wa, and thus, a description will not be given of the method of separating the wafers Wb.

As is the case with the wafers Wa, the sensor 786 detects the second partition 784 to recognize that all the wafers Wb have been separated. After the input of the detecting signal from the sensor 786, the control unit 788 performs the processing in the same procedure.

After moving back from in front of the wafers Wb, the first partition 782 is pressed to the right in FIG. 35 by the running slider 768, which moves together with the slider 724 (the running slider 768 presses the first slider 770, which moves the first partition 782). Similarly, the running slider 768 presses the first slider 770, which moves the second partition 782 to the right in FIG. 35. After the separation of the wafers Wa–Wb, the first partition 782 and the second partition 784 move to the right in FIG. 35.

After the wafers Wa–Wb are separated from the slice base mounting beams Sa–Sc, the slider 724 of the individual wafer separation equipment 714 moves to the left in FIG. 35 and returns to the positions prior to the start of the separation. The operator removes the slice base mounting beams Sa–Sc and the mounting plate M from the hot water tank 712. If there are wafers to be separated next, they are separated in the same procedure.

The individual wafer separation apparatus 710 is able to separate the different kinds of wafers Wa–Wc, which are sliced in the multiple slicing method, without mixing them.

Figure 37:
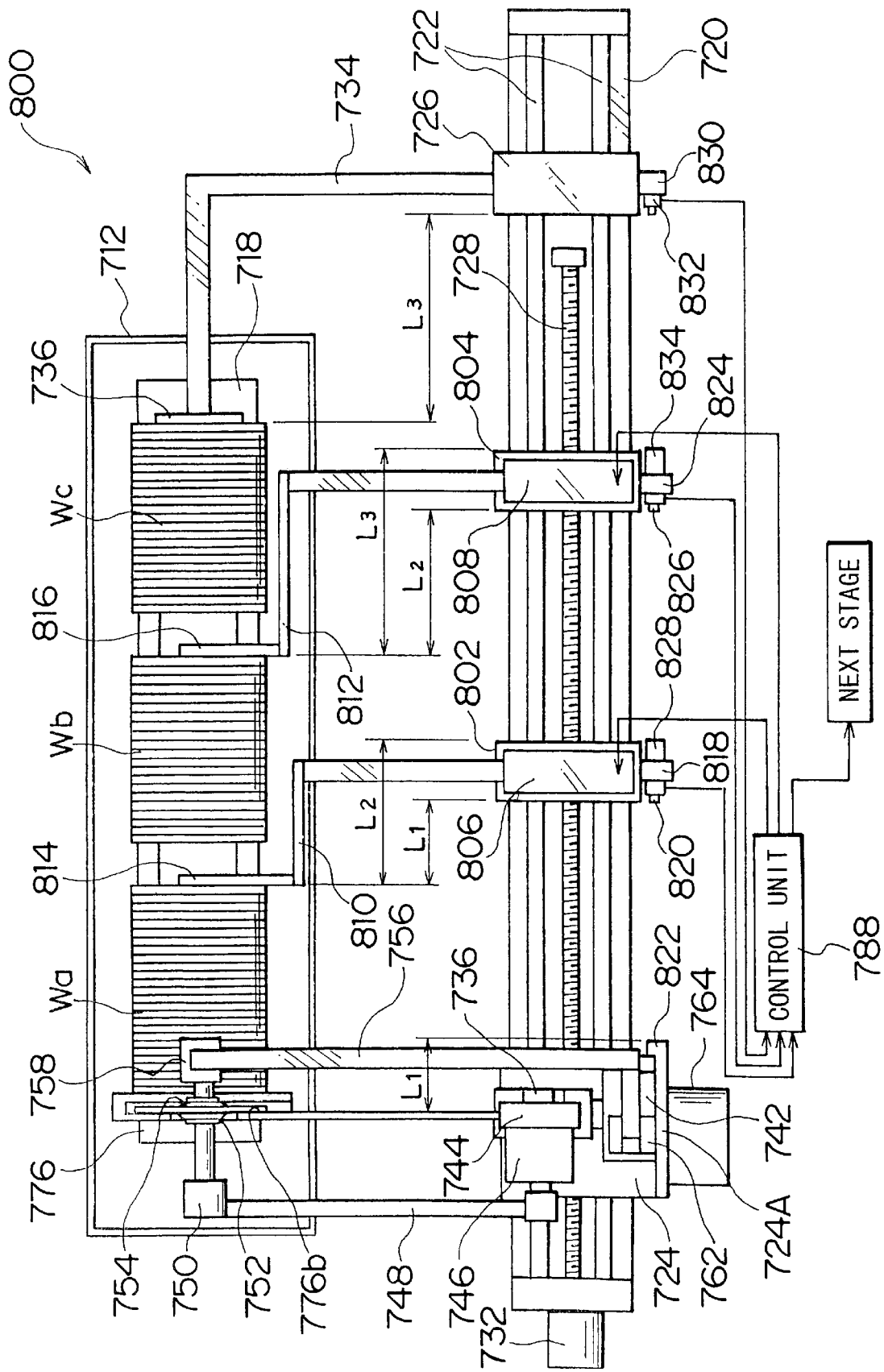
FIG. 37 is a plan view illustrating the structure of another embodiment of an individual wafer separation apparatus.

In this embodiment, the individual wafer separation apparatus, which separates the wafers, and the partition apparatus, which inserts the partitions between the lots, are arranged independently of one another. Like an individual wafer separation apparatus 800 in FIG. 37, it is also possible to integrate the individual wafer separation apparatus and the partition apparatus. A description will be given of the structure of the individual wafer separation apparatus 800. Parts similar to those of the individual wafer separation apparatus 710 are denoted by the same reference numerals, and they will not be described.

In addition to the slider 724 for moving vacuum pad 752 and the slider 726 for moving the receiving plate 736, a first slider 802 and a second slider 804 are slidably supported on the pair of guide rails 722 formed on the base 720.

The first slider 802 and the second slider 804 have a first cylinder 806 and a second cylinder 808, respectively. A rod of each cylinder expands and contracts perpendicularly to the wafers Wa–Wc placed in the hot water tank 12.

A first partition 814 and a second partition 816 are provided at the ends of the rods of the first cylinder 806 and the second cylinder 808 through connecting members 810, 812. The partitions are inserted between the wafers Wa–Wc placed in the hot water tank 712 by expanding the rod of each cylinder. It is possible to partition the wafers between the lots by inserting the first partition 814 and the second partition 816 between the wafers Wa and Wb and between the wafers Wb and Wc.

If the first partition 814 and the second partition 816 are inserted between the lots, it is necessary to detect the presence of the inserted partitions in order to continuously process the wafers as is the case with the individual wafer separation apparatus 710.

The individual wafer separation apparatus 800 detects the first partition 814 and the second partition 816 as described below.

A first touch sensor 820 is provided at the first slider 802 through a support member 818. On the other hand, a sensor dog 822 is provided at the slider 724, and the sensor dog 822 comes into contact with the first touch sensor 820.

The interval between the sensor dog 822 and the first touch sensor 820 is determined so that the sensor dog 822 can come into contact with the first touch sensor 820 if all the wafers Wa are separated. The interval between them is determined by adjusting the length of the connecting member 810, which connects the first partition 814 and the first cylinder 806. Specifically, the length of the connecting member 810 is set so that the length L₁ from the vacuum pad 752 to the end of the sensor dog 822 can be equal to the distance L₁ from the first partition 814 to the end of the first touch sensor 820.

When the vacuum pad 752 finishes separating the wafers Wa, the sensor dog 822 comes into contact with the first touch sensor 820, which starts operating. On receipt of an operation signal from the first touch sensor 820, the control unit 788 recognizes the boundaries between the lots. Then, the first cylinder 806 is driven to move back the first partition 814.

When the first partition 814 moves back, the vacuum pad 752 starts separating the wafers Wb. At this time, the slider 724 moves on the guide rails 722 while pressing the first slider 802.

The presence of the second partition 816 is detected similarly. A second touch sensor 826 is provided at the second slider 804 through a support member 824. A contact 828 is provided at the first slider 802, and the contact 828 comes into contact with the second touch sensor 826.

The interval between the contact 828 and the second touch sensor 826 is determined so that the contact 828 can come into contact with the second touch sensor 826 if all the wafers Wb are separated. The interval between them is determined by adjusting the length of the connecting member 812, which connects the second partition 816 and the second cylinder 808. Specifically, the length of the connecting member 812 is set so that the length L₂ from the first partition 814 to the end of the contact 828 can be equal to the distance L₂ from the second partition 816 to the end of the second touch sensor 826.

When the vacuum pad 752 finishes separating all the wafers Wb, the contact 828 comes into contact with the second touch sensor 826, which starts operating. On input of an operation signal from the second touch sensor 826, the control unit 788 recognizes the boundaries between the lots. Then, the control unit 788 drives the second cylinder 808 to move back the second partition 816.

When the second partition 816 moves back, the vacuum pad 752 starts separating the wafers Wc. As is the case with the first partition 814, the slider 724 moves on the guide rails 722 while pressing the first slider 802 and the second slider 804.

The presence of the first partition 814 and the second partition 816 is detected in the above-mentioned manner. A following mechanism detects that the separation of all the wafers Wa–Wc is completed.

A third touch sensor 832 is provided at the slider 726, which is provided with the receiving plate 736, through a support member 830. A contact 834 is provided at the second slider 804, and the contact 834 comes into contact with the third touch sensor 832.

The interval between the contact 834 and the third touch sensor 832 is determined so that the contact 834 can come into contact with the third touch sensor 832 if all the wafers Wc are separated. The interval between them is determined by adjusting the length of the arm 734, which connects the receiving plate 736 and the slider 726. Specifically, the length of the arm 734 is set so that the length L₃ from the second partition 816 to the end of the contact 834 can be equal to the distance L₃ from the receiving plate 736 to the end of the third touch sensor 832.

When the vacuum pad 752 finishes separating all the wafers Wc, the contact 834 comes into contact with the third touch sensor 832, which starts operating. On input of an operation signal from the third touch sensor 832, the control unit 788 recognizes that the separation of all the wafers Wa–Wc is completed.

A description will hereunder be given of the operation of the individual wafer separation apparatus 800, which is constructed in the above-mentioned manner.

First, the roughly-cleaned wafers Wa, Wb, Wc are placed in the hot water tank 712. Then, the operator moves the first slider 802 manually to position the first partition 814 between the wafers Wa and the wafers Wb. Then, the operator drives the first cylinder 806 to insert the first partition 814 between the wafers Wa and the wafers Wb. After the insertion, the first slider 802 is moved forward (to the left in FIG. 35), so that the first partition 814 can contact with the end face of the wafers Wa.

Similarly, the operator inserts the second partition 816 between the wafers Wb and the wafers Wc, so that the second partition 816 can contact with the end face of the wafers Wb.

Then, the operator moves the slider 716 manually so that the receiving plate 736 can contact with the end face of the wafers Wc.

Thus, the operator finishes the initialization process, and the individual wafer separation apparatus 800 starts operating. The individual wafer separation apparatus 800 separates the wafers in the same manner as the individual wafer separation apparatus 710 of the first embodiment, and thus, a description will not be given of the method for separating the wafers with the individual wafer separation apparatus 800.

The vacuum pad 752 moves to the right in FIG. 35 to separate the wafers Wa adhered to the slice base mounting beam Sa continuously from the slice base mounting beam Sa. When all the wafers Wa are separated from the slice base mounting beam Sa, the sensor dog 822 provided at the slider 724 comes into contact with the first touch sensor 820 provided at the first slider 802.

When the sensor dog 822 contacts with the first touch sensor 820, the first touch sensor 820 starts operating and outputs an operation signal to the control unit 788. On input of the operation signal, the control unit 788 recognizes that all the wafers Wa have been separated from the slice base mounting beam Sa. Then, the control unit 788 controls the individual wafer separation apparatus 710 as described below.

Specifically, the control unit 788 stops driving the feed motor 732 and temporarily stops the separation of the vacuum pad 752. Then, the control unit 788 outputs the signal to the control part of the next stage to indicate that all the wafers Wa have been separated.

When the control unit 788 receives the signal indicating the restart of the separation from the next stage, it drives the first cylinder 806 to move back the first partition 814 from in front of the wafers Wb. Then, the control unit 788 outputs the drive signal to start separating the wafers Wb.

When the wafers Wb are separated, the control unit 788 detects the separation of all the wafers Wb by detecting that the contact 828 presses the second touch sensor 826 to start the second touch sensor 826. Upon input of the operation signal from the second couth sensor 826, the control unit 788 proceeds the operation in the above-mentioned manner.

During the separation of the wafers Wb, the slider 724 presses the first slider 802, which moves to the right in FIG. 35. Likewise, the slider 724 presses the second slider 804, which moves to the right in FIG. 35 with the first slider 802.

When the last wafer Wc is separated from the slice base mounting beam Sc, the contact 834 provided at the second slider 804 contacts with the third touch sensor 832 to activate the third touch sensor 832. Thus, on input of the operation signal from the third touch sensor 832, the control unit 788 recognizes that all the wafers Wa–Wc have been separated. Then, the control unit 788 finishes the separation.

The operator removes the slice base mounting beams Sa–Sc and the mounting plate M from the hot water tank 712. If there are wafers to be separated, they are placed in the hot water tank 712 and are separated in the above-mentioned manner.

As stated above, the individual wafer separation apparatus 800 can achieve the same effects as the previously-described individual wafer separation apparatus 710. Specifically, the individual wafer separation apparatus 800 is able to separate the different kinds of wafers Wa–Wc without mixing them.

Since the individual wafer separation equipment is integrated with the partition apparatus 800, the individual wafer separation apparatus is compact as a whole.

In this embodiment, three kinds of wafers Wa–Wc are separated, but the present invention should not be restricted to this. To separate four kinds of wafers, three partitions are inserted, and one partition is inserted to separate two kinds of wafers.

According to the above-mentioned individual wafer separation apparatus 110, the stopper plate supports the wafers which fall forward as a result of the natural separation, and the partition supports the wafers which fall backward. It is possible to prevent the wafers W from falling by providing a wafer pressing mechanism, which will be described below.

Figure 38:
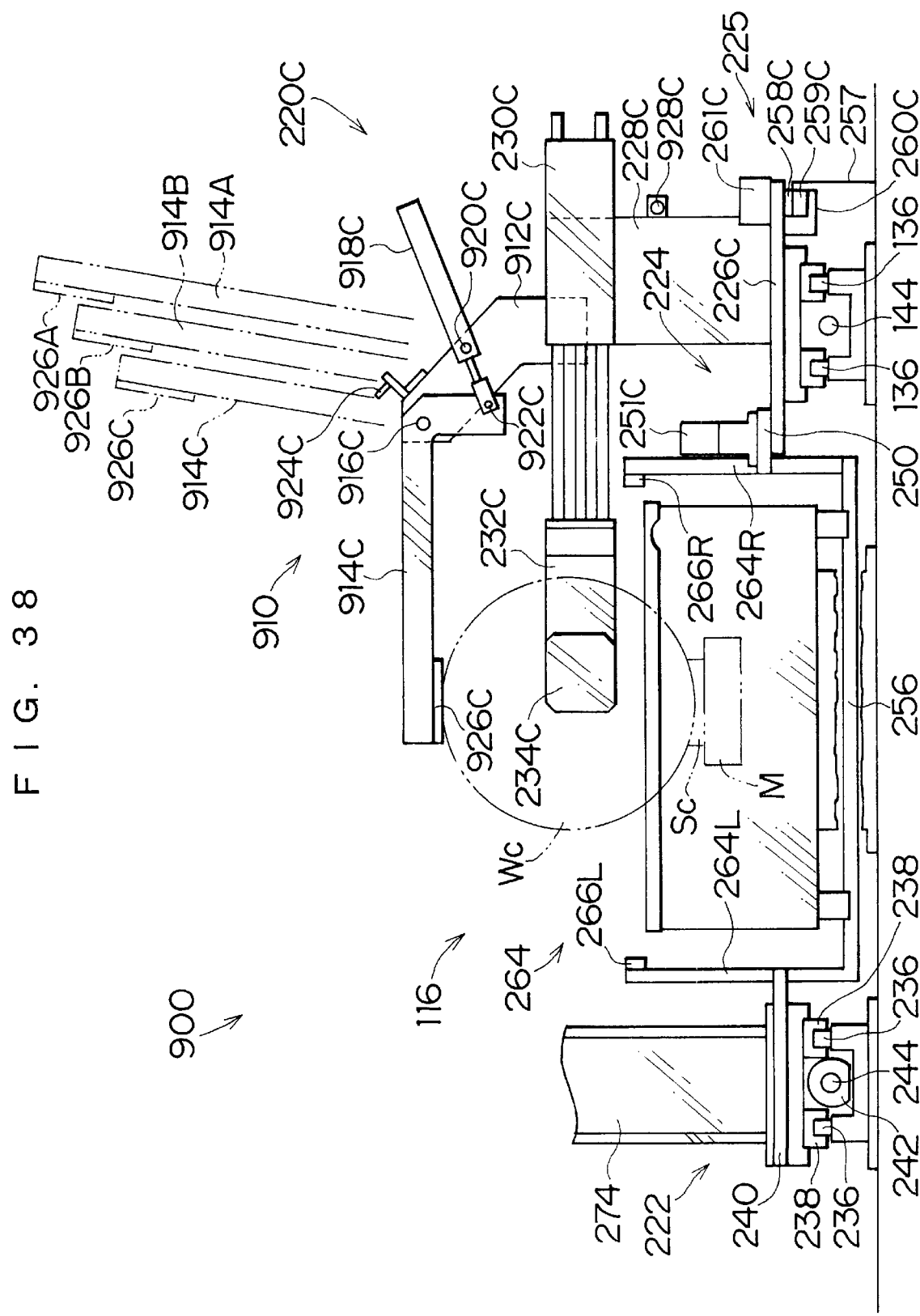
FIG. 38 is a front view illustrating the structure of the essential parts of an individual wafer separation apparatus provided with a wafer pressing mechanism.

FIG. 38, 39, 40 are a front view, a side view and a plan view, respectively, illustrating the structure of the essential parts of an individual wafer separation apparatus 900 provided with the wafer pressing mechanism.

Parts similar to those of the individual wafer separation apparatus 110 are denoted by the same reference numerals.

Figure 39:
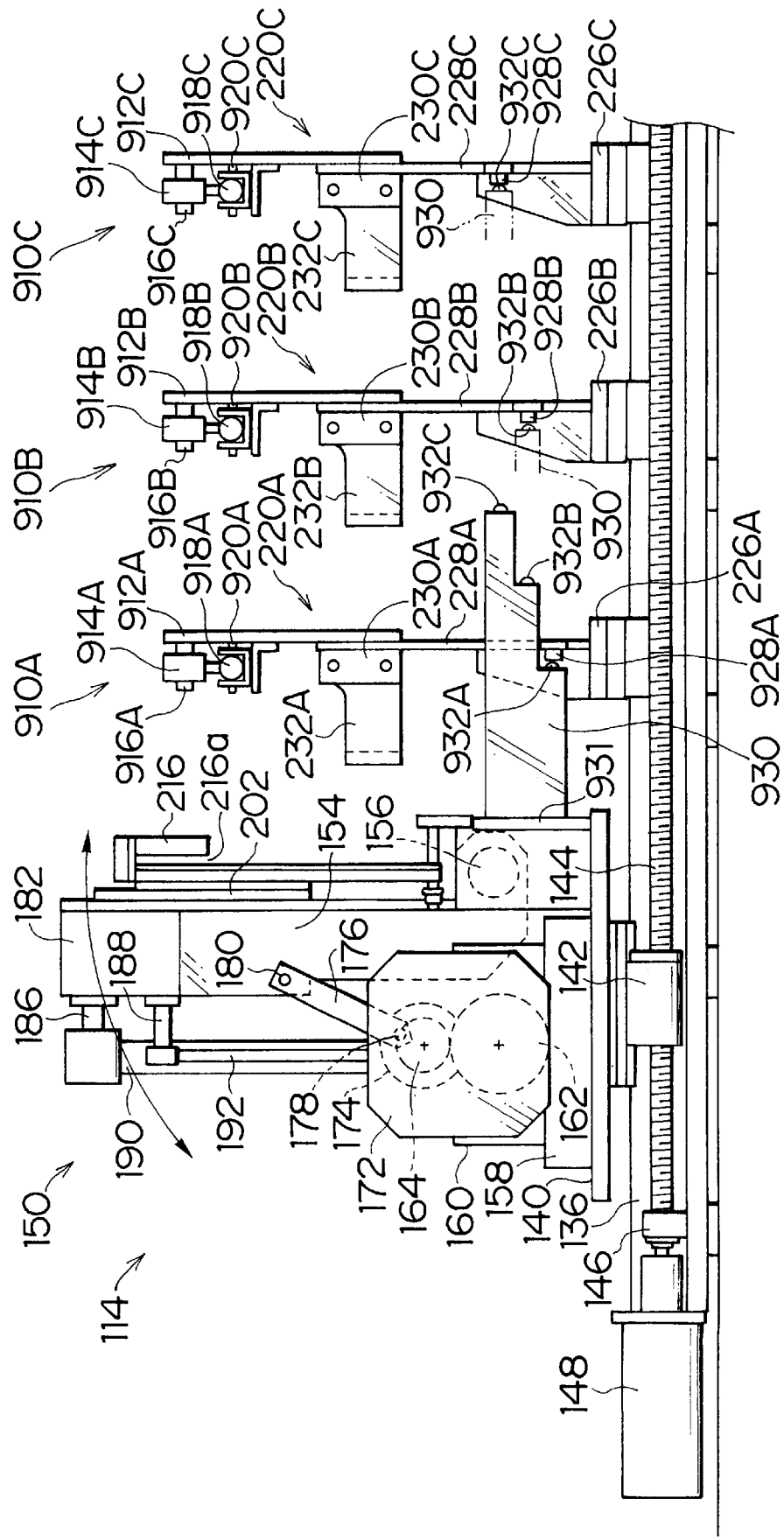
FIG. 39 is a side view illustrating the structure of the essential parts of an individual wafer separation apparatus provided with a wafer pressing mechanism.
Figure 40:
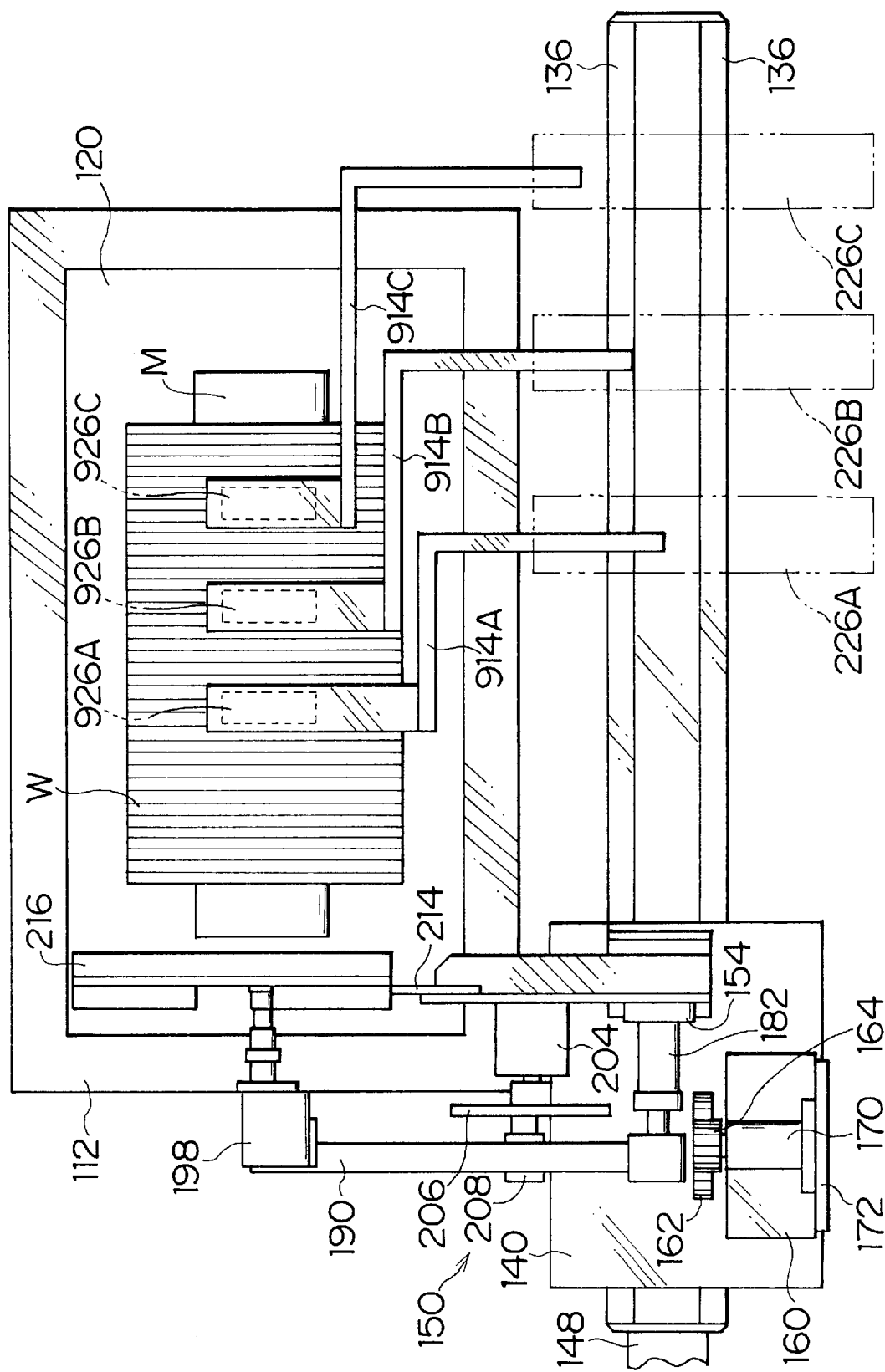
FIG. 40 is a plan view illustrating the structure of the essential parts of an individual wafer separation apparatus provided with a wafer pressing mechanism.

As shown in FIGS. 38–40, the partition units 220A, 220B and 220C are provided with wafer pressing apparatuses 910A, 910B and 910C, respectively. The wafer pressing apparatuses are constructed in substantially the same manner, and thus, a description will only be given of the structure of the wafer pressing apparatus 910C. As for the wafer pressing apparatuses 910A and 910B, parts similar to those of the wafer pressing apparatus 910C are denoted by the same reference numerals, and they will not be described.

As shown in FIGS. 38–41, a support frame 912C is secured to the support plate 228C, which stands on the slide plate 226C of the partition unit 220C. An arm 914C is swingably supported on the end of the support frame 912C through a pin 916C.

An arm drive cylinder 918C is swingably supported on the support frame 912C through a pin 920C. The end of the rod of the arm drive cylinder 918C connects to the base end of the arm 914C through a pin 922C. Expanding the rod of the arm drive cylinder 918C rotates the arm 914C upward about the pin 916C, and contracting the rod of the arm drive cylinder 918C rotates the arm 914C downward. In short, driving the arm drive cylinder 918C swings the arm 914C vertically about the pin 916C. The upwardly-rotated arm 914C comes into contact with a stopper 924C provided at the top end of the support frame 912C so that the rotation of the arm 914C can be regulated.

Figure 41:
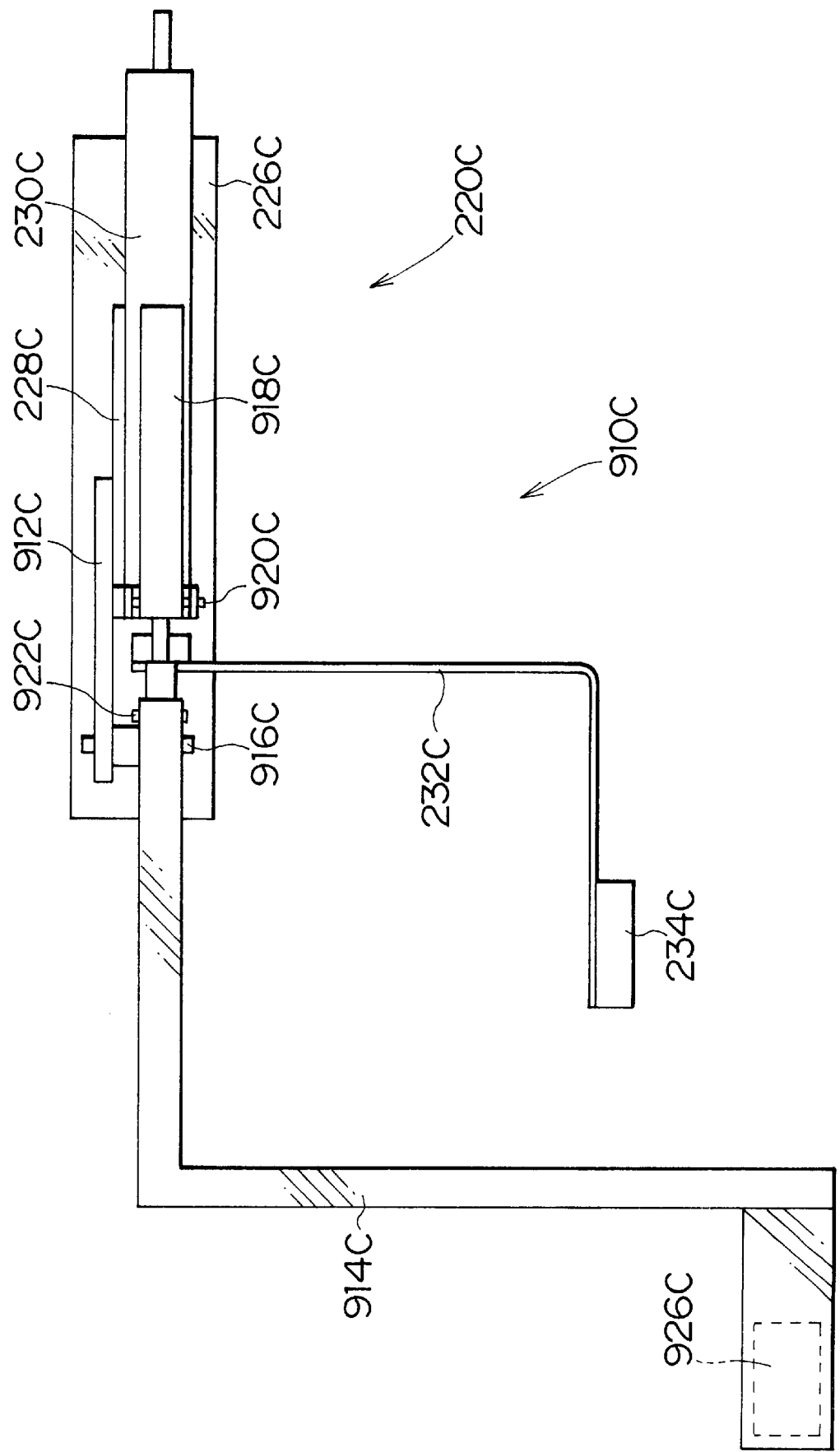
FIG. 41 is a plan view illustrating the structure of a wafer pressing apparatus.

A rubber wafer pressing pad 926C is secured to the end of the swingable arm 914C. The wafer pressing pad 926C presses the top of the wafers W in order to prevent the wafers W from falling. As shown in FIG. 41, the wafer pressing pad 926C and the partition 234C are arranged at a predetermined interval.

The wafer pressing apparatuses 910A, 910B are also provided with wafer pressing pads 926A, 926B at the ends of the arms 914A, 914B in order to prevent the wafers W from falling.

Incidentally, if the wafer pressing pads 926A–926C press the top of the wafers W when the separation unit 150 separates the wafers W one by one, the double separation prevention plate 216 secured to the stopper plate 214 of the separation unit 150 comes into contact with the wafer pressing pads 926A–926C to disable the separation When the interval between the wafer pressing pads 926A–926C and the separation unit 150 reaches a predetermined value, the wafer pressing pads 926A–926C must be moved upward.

As shown in FIG. 39, pad moving touch sensors 928A–928C are attached to the support plates 228A–228C of the partition units 220A–220C. On the other hand, three contacts 932A–932C are provided on a contact plate 930, which is supported on the first slide table 140 of the separation unit 150 through a bracket 931. The contacts 932A–932C contact with the pad moving touch sensors 928A–928C to thereby detect that the interval between the separation unit 150 and the wafer pressing pads 926A–926C has reached the predetermined interval.

A description will be given of an individual wafer separation apparatus 900 provided with the wafer pressing mechanism, which is constructed in the above-mentioned manner.

As the need arises, the wafer pressing apparatus 910A of the first partition unit 220A will be referred to as the first wafer pressing apparatus 910A, and the wafer pressing apparatus 910B of the second partition unit 220B will be referred to as the second wafer pressing apparatus 910B. The wafer pressing apparatus 910C of the third partition unit 220C will be referred to as the third wafer pressing apparatus 910C.

The wafer pressing pad 926A of the first wafer pressing apparatus 910A will be referred to as the first wafer pressing pad 926A, and the wafer pressing pad 926B of the second wafer pressing apparatus 910B will be referred to as the second wafer pressing pad 926B. The wafer pressing pad 926C of the third wafer pressing apparatus 910C will be refereed to as the third wafer pressing pad 926C. This is the case with the arm drive cylinders 918A–918C, the pad moving touch sensors 928A–928C, the contacts 932A–932C, etc.

First, the mounting plate M, to which the wafers Wa–Wc are adhered, is placed on the workpiece holding part 212. Consequently, the part of the slice base mounting beams Sa–Sc, to which the wafers Wa–Wc are adhered, are soaked in the hot water 120 stored in the hot water tank 112.

Then, the partitions 234A–234C are inserted between the wafers Wa–Wc. The partitions are inserted in the same manner as in the individual wafer separation apparatus 110, and this will not be explained.

When the partitions 234A–234C are inserted, the arms 914A–914C of the wafer pressing apparatuses 910A–910C stand up straight. Thus, the wafer pressing pads 926A–926C are positioned upward.

After the partitions 234A–234C are inserted, the arm drive cylinders 918A–918C are driven to rotate the arms 914A–914C downward. Consequently, the wafer pressing pads 926A–926C come into contact with the top of the wafers Wa–Wc, and thus, the wafer pressing pads 926A–926C support the wafers Wa–Wc. When the wafer pressing pads 926A–926C support the wafers Wa–Wc, the separation of the wafers Wa–Wc is started.

Incidentally, the separation is performed in the same manner as in the individual wafer separation apparatus 110. Specifically, the separation vacuum pads 200 hold and swing the end face of the wafers Wa, and the wafers Wa are separated one by one from the slice base mounting beam Sa.

As the separation of the wafers Wa proceeds, the interval between the separation unit 150 and the first wafer pressing pad 926A becomes narrower gradually. When the interval becomes close to a predetermined distance, the first contact 932A provided on the contact plate 930 of the separation unit 150 comes into contact with the first pad moving touch sensor 928A provided on the support plate 228A of the first partition unit 220A so that the first pad moving touch sensor 928A can start operating. In response to an operation signal from the first pad moving touch sensor 928A, the control unit drives the first arm drive cylinder 918A to rotate the first arm 914A upward. Consequently, the first wafer pressing pad 926A, which has supported the wafers Wa, moves upward.

The first wafer pressing pad 926A, which has moved upward, does not support the wafers Wa any more. Since only a small number of wafers remain to be separated, the first partition 234A could support the wafers Wa even if the wafers Wa fall backward. The wafers Wa do not fall to such an extent that they cannot be collected. Therefore, the wafers Wa are collected without fail in such a way that the separation vacuum pads 200 hold the end faces of the wafers Wa.

After the separation of all the wafers Wa, the first partition 234A is moved back to start separating the wafers Wb. In this case, the second wafer pressing pad 926B supports the top of the wafers Wb, and thus, the wafers Wb does not fall during the separation and they are collected without fail.

When the interval between the separation unit 150 and the second wafer pressing pad 926B reaches a predetermined distance, the second contact 932B provided on the contact plate 930 of the separation unit 150 comes into contact with the second pad moving touch sensor 928B provided on the support plate 228B of the second partition unit 220B, so that the second contact 932B can start operating. In response to an operation signal from the second pad moving touch sensor 928B, the control unit drives the second arm drive cylinder 918B to rotate the second arm 914B upward. This moves up the second wafer pressing pad 926B, which has supported the wafers Wb.

The second wafer pressing pad 926B, which has moved up, does not support the wafers Wb any more. Since only a small number of wafers Wb remain to be separated, the second partition 234B supports the wafers Wb, even if the wafers Wb fall backward. Thus, the wafers Wb do not fall to such an extent that they cannot be collected. The wafers Wb can be collected without fail in such a way that the separation vacuum pads 200 hold the end faces of the wafers Wb.

After the separation of all the wafers Wb, the second partition 234B is moved back to start separating the wafers Wc. In this case, the third wafer pressing pad 926C supports the top of the wafers Wc, and thus, the wafers Wc do not fall during the separation to such an extent that they cannot be collected.

When the interval between the separation unit 150 and the third wafer pressing pad 926C reaches a predetermined distance, the third contact 932C provided on the contact plate 930 of the separation unit 150 comes into contact with the third pad moving touch sensor 928C provided on the support plate 228C of the third partition unit 220C. In response to an operation signal from the third pad moving touch sensor 928C, the control unit drives the third arm drive cylinder 918C to rotate the third arm 914C upward. This moves up the third wafer pressing pad 926C, which has supported the wafers Wc.

The third wafer pressing pad 926C, which has moved back, does not support the wafers Wb any more. Since only a small number of wafers Wc remain to be separated, the third partition 234C supports the wafers Wc falling backward. Thus, the wafers Wc do not fall to such an extent that they cannot be collected. Therefore, the wafers Wc are collected without fail in such a way that the separation vacuum pads 200 hold the end faces of the wafers Wc.

Since the individual wafer separation apparatus is provided with the wafer pressing mechanism as mentioned above, the wafers Wa–Wc do not fall during the separation to such an extent that they cannot be collected. Specifically, the wafers Wa–Wc, which are pressed by the wafer pressing pads 926A–926C, do not fall even if the wafers Wa–Wc are naturally separated from the slice base mounting beams Sa–Sc. Thus, the wafers Wa–Wc can be collected. Even if the wafers Wa–Wc, which are not pressed by the wafer pressing pads 926A–926C, are naturally separated from the slice base mounting beams Sa–Sc and fall, they are supported by the wafers Wa–Wc, which are pressed by the wafer pressing pad 926A–926C, or the partitions 234A–234C. Thus, they do not fall completely to such an extent that they cannot be collected. Thus, the wafer pressing mechanism of this embodiment enables the wafers Wa–Wc to be separated and collected without fail.

The above-mentioned embodiment applies to the case where the multiply-sliced wafers Wa–Wb are separated, but it may also apply to the case where the wafers W, which are sliced in the normal slicing method, are separated.

In this case, the first partition 232A and the second partition 232B are not inserted, and thus, the first wafer pressing pad 926A and the second wafer pressing pad 926B are arranged at an appropriate interval to support the wafers W.

Since the partitions 232A, 232B are not inserted between the wafers W sliced in the normal slicing method, the wafers cannot be collected if the wafers W fall backward and all other wafers fall during the separation (if the partitions 232A, 232B are inserted, they support the wafers W, and thus, all the wafers do not fall). In this embodiment, the wafer pressing pads 926A, 926B press the middle part of the wafers W. Even if the wafers W fall, the fallen wafers W are supported by the wafers W supported by the first wafer pressing pad 926A or the second wafer pressing pad 926B. Thus, the wafers W can be collected. For the reasons stated above, the wafer pressing mechanism of this embodiment is particularly advantageous to a long sequence of wafers sliced in the normal slicing method.

In this embodiment, the wafer pressing apparatuses 910A–910C are provided in the partition unit 220A–220B, but they may also be provided separately.

The wafer pressing mechanism of this embodiment may also apply to the individual wafer separation apparatuses 710, 800.

Figure 42:
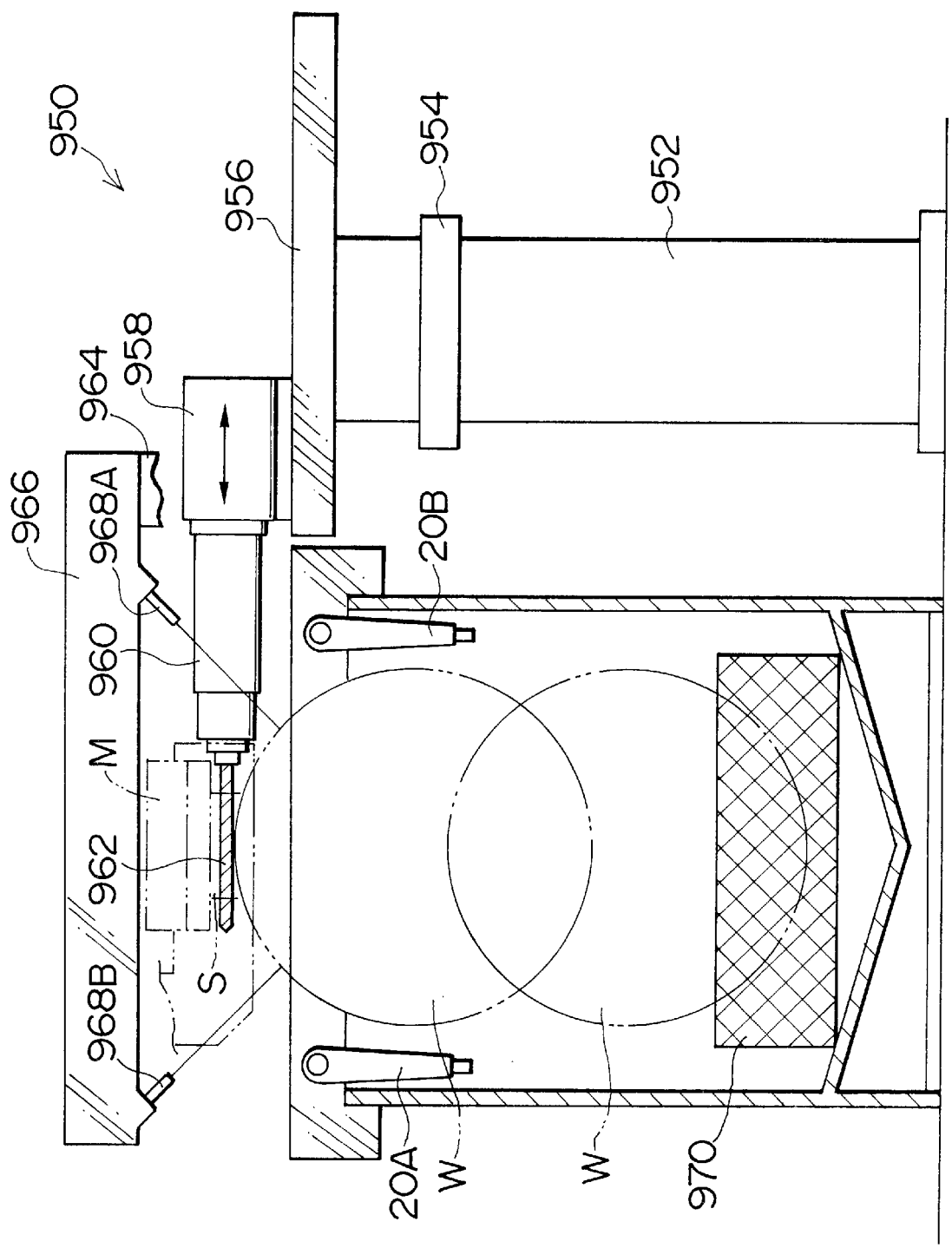
FIG. 42 is a side view illustrating the structure of another embodiment of a rough cleaning apparatus.

FIG. 42 is a side view illustrating the structure of another embodiment of the rough cleaning apparatus which is provided at the rough cleaning part 10. Parts similar to those of the rough cleaning apparatus 12 are denoted by the same reference numerals.

The rough cleaning apparatus is different from the rough cleaning apparatus 12 in that it has an end wafer processing apparatus 950. When the wire saw 2 slices the ingot In, the end wafer processing apparatus 950 removes extremely thin wafers and crescent-shaped wafers (hereinafter referred to as "end wafers"), which are sliced from both ends of the ingot In, from the slice base mounting beam S.

At the top of a support 952 provided close to the side of the cleaning tank 14, a guide plate 954 is horizontally arranged in parallel with the cleaning tank 14. A slide plate 956 is provided on the guide plate 954, and the slide plate 956 is driven by a drive means (not illustrated) to move back and forth on the guide late 954.

A first slide block 958 is slidably provided on the slide plate 956, and the first slide block 958 is driven by a drive means (not illustrated) to move back and forth in a direction perpendicular to the guide plate 954. A drill drive motor 960 is provided on the first slide block 958, and a drill 962 connects to an output shaft of the drill drive motor 960. Running the drill drive motor 960 rotates the drill 962, and moving the slide plate 956 back and forth along the guide plate 954 moves the drill 962 along the cleaning tank 14. Moving the first slide block 954 along the slide plate 954 back and forth moves the drill 962 closer to and farther from the slice base mounting beam S, which is located at a predetermined end wafer processing position. The drill 962 has a relatively larger diameter than the thickness of the wafer W.

A second slide block (not illustrated) is slidably provided on the slide plate 956, and the second slide block is driven by a drive means (not illustrated) to move back and forth in a direction perpendicular to the guide plate 954. A sensor arm 966 is supported on the second slide block through a bracket 964, and a pair of photoelectric sensors 968A, 968B is provided at the end of the sensor arm 966. The pair of photoelectric sensors 968A, 968B detects the presence of the wafers W located at the predetermined end wafer processing position. Specifically, the pair of photoelectric sensors 968A, 968B projects a light toward the wafer located at the predetermined end wafer processing position. When the projected light strikes the wafer, the photoelectric sensors 968A, 968B detect that and outputs an ON signal to a control part (not illustrated) (if the projected light does not strike the wafer, the photoelectric sensors 968A, 968B output an OFF signal). The control part detects the presence of the wafer in accordance with the ON/OFF signals from the photoelectric sensors 968A, 968B.

The end wafer processing apparatus 950 processes the end wafers as described below.

As shown in FIG. 42, the wafers W, which are delivered to the first lifter from the transfer chuck, is positioned at the predetermined end wafer processing position when the first lifter moves down vertically by a predetermined amount. The end wafer processing position is set at a predetermined distance above the bottom of the cleaning tank 14. At this position, about ⅔ of the wafers W are soaked in the liquid stored in the cleaning tank 14. This prevents the end wafers, separated from the slice base mounting beam S, from sticking to the wafers W due to the surface tension of the liquid, and reduces the drop of the end wafers cut off from the slice base mounting beam S.

At the end wafer processing position, the slice base mounting beam S, to which the wafers W are adhered, are positioned at the same height as the drill 962.

When the wafers W are loaded, the drill 962 and the photoelectric sensors 968A, 968B wait at one end of the guide plate 954 in such a way as not to contact with the loaded wafers W.

When the wafers W reach the predetermined end wafer processing position, the sensor arm 966 moves forward to a predetermined detection position. Consequently, the wafers W are positioned between the pair of photoelectric sensors 968A, 968B as shown in FIG. 42.

Then, the pair of photoelectric sensors 968A, 968B projects the light toward the wafers W. At this time, there is no wafer W at the position to which the photoelectric sensors 968A, 968B projects the light, and thus, the photoelectric sensors 968A, 968B are OFF.

Then, the slide plate 956 moves along the guide plate 954, and the pair of photoelectric sensors 968A, 968B moves along the wafers W. Consequently, the light projected by the photoelectric sensors 968A, 968B strikes the wafers W at a predetermined distance from the starting position. On detection of the light striking the wafers W, the photoelectric sensors 968A, 968B are turned on.

Incidentally, the tilting ingot In is attached to the mounting plate M so that the sliced wafers W can be in a desired crystal orientation. For this reason, the photoelectric sensors 968A, 968B are not necessarily turned on at the same time. When the photoelectric sensors 968A, 968B are turned on at the same time, the control part recognizes the end wafer. The control part stops moving the slide plate 956 on detection that the photoelectric sensors 968A, 968B are turned on.

Figure 43:
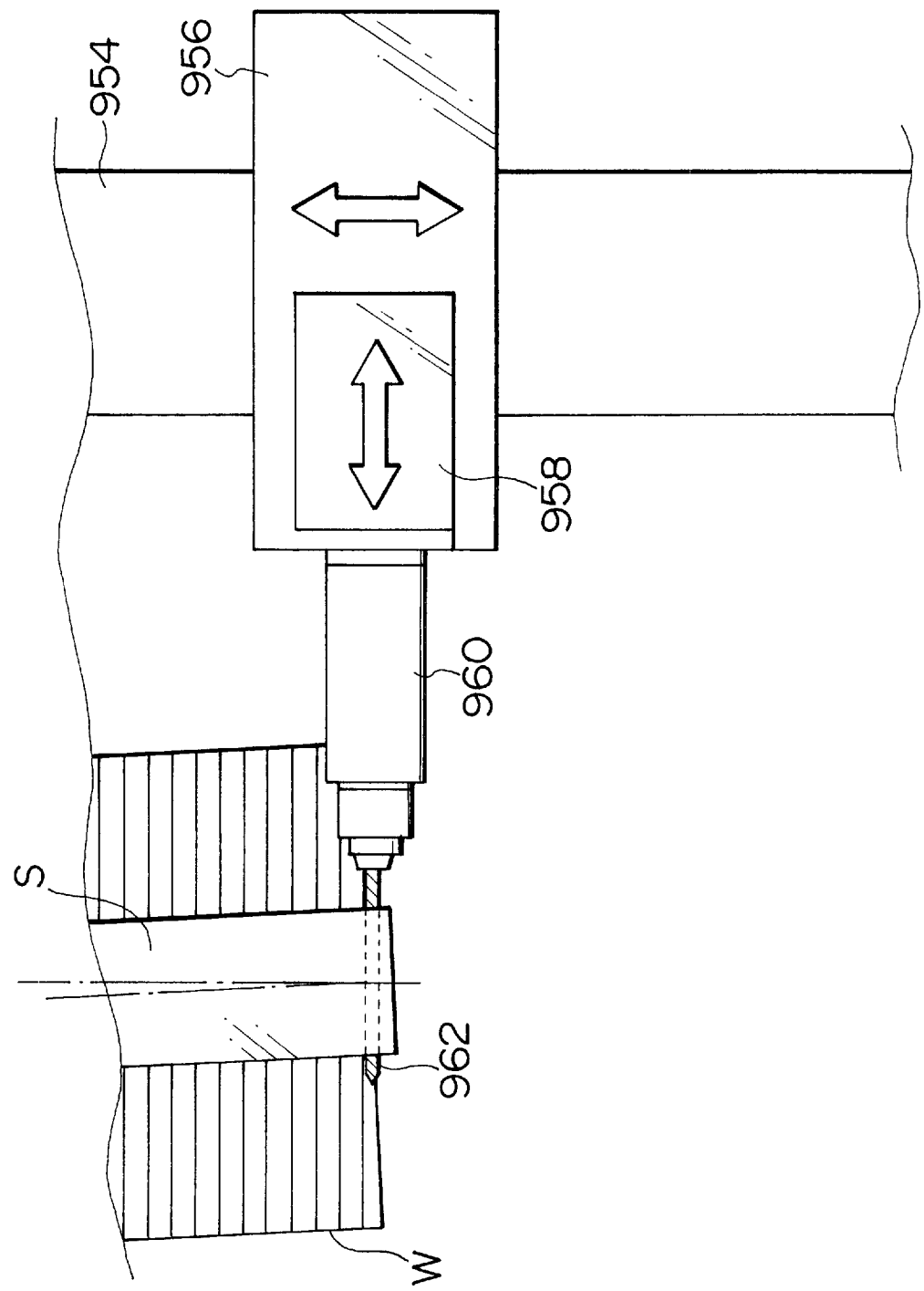
FIG. 43 is a plan view illustrating the structure of the essential parts of an end wafer processing apparatus.
Figure 44:
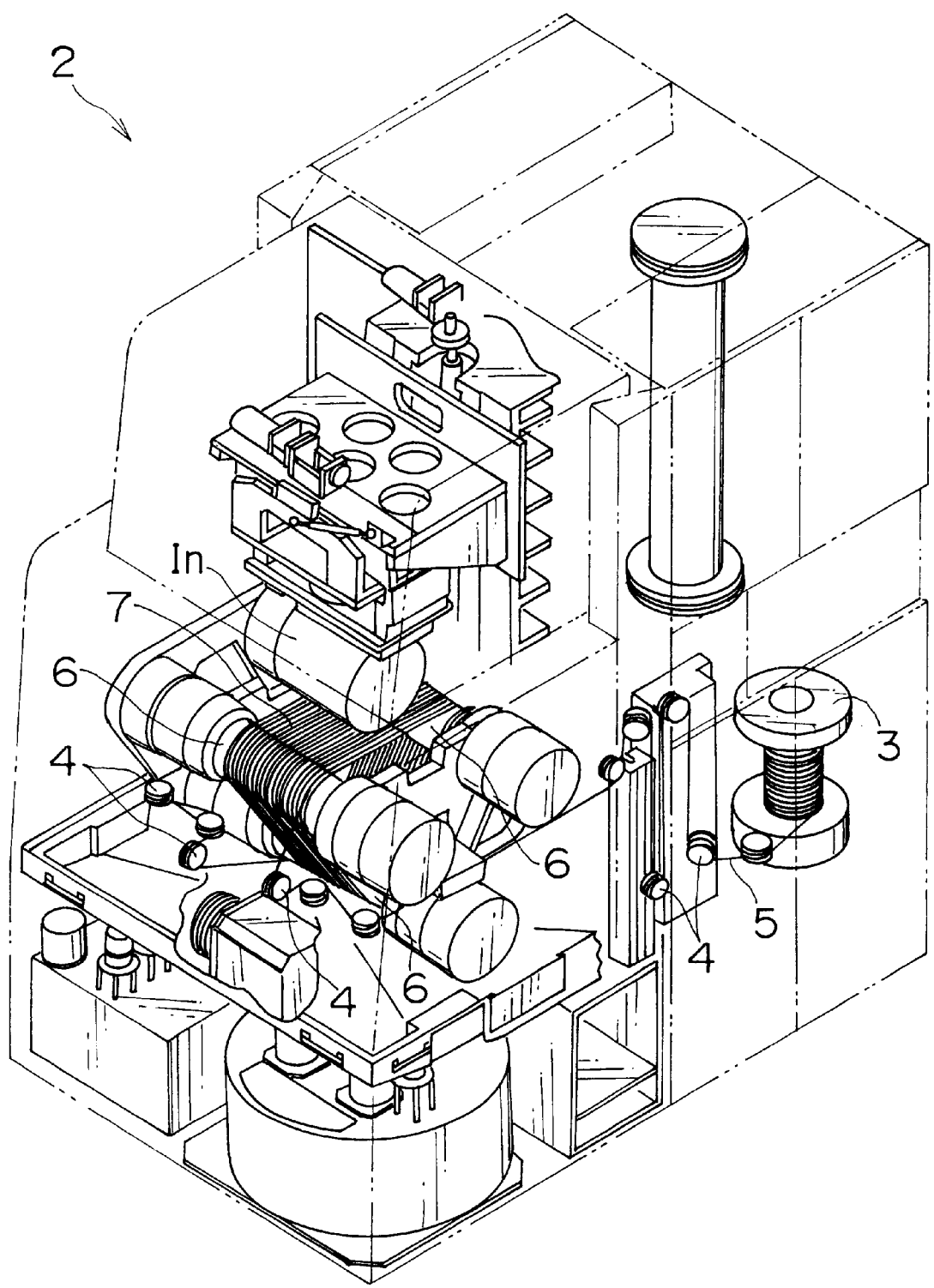
FIG. 44 is a perspective view illustrating the structure of a conventional wire saw.

When the slide plate 956 stops moving, the drill drive motor 960 is run to rotate the drill 962. The first slide block 958 moves on the slide plate 956, and the drill 962 moves toward the slice base mounting beam S. Consequently, as shown in FIG. 43, the drill 962 punches the end of the slice base mounting beam S, and the end wafer is cut off from the slice base mounting beam S.

The end wafer, which is cut off from the slice base mounting beam S, falls into the cleaning tank 14, and it is collected in a basket 970 placed in the cleaning tank 14.

After cutting the end wafer at one side, the drill 962 moves back from the slice base mounting beam S and stops rotating.

Then, the slide plate 956 moves along the guide plate 954, and the pair of photoelectric sensors 968A, 968B moves again along the wafers W. If the pair of photoelectric sensors 968A, 968B has moved a predetermined distance, the light projected by the photoelectric sensors 968A, 968B does not strike the wafers W. If the light projected by the photoelectric sensors 968A, 968B does not strike the wafers W, the photoelectric sensors 968A, 968B are turned off.

Since the tilting ingot In is attached to the mounting plate M, the photoelectric sensors 968A, 968B are not always turned off at the same time. When one of the photoelectric sensors 968A, 968B is turned off, the control part recognizes the end wafer. The control part stops moving the slide plate 956 on detection that either one of the photoelectric sensors 968A, 968B is turned off.

When the slide plate 956 stops moving, the drill drive motor 960 is run to rotate the drill 962. Then, the first slide block 958 moves on the slide plate 956, and the drill 962 moves toward the slice base mounting beam S. Consequently, the drill 962 punches the end of the slice base mounting beam S, and the end wafer at the other side is cut off from the slice base mounting beam S.

The end wafer, which is cut off from the slice base mounting beam S, falls into the cleaning tank 14, and it is collected in the basket 970 placed in the cleaning tank 14.

After cutting the end wafer at the other side, the drill 962 moves back from the slice base mounting beam S and stops rotating. At the same time, the pair of photoelectric sensors 968A, 968B moves back from above the wafers W. When the drill 962 and the pair of photoelectric sensors 968A, 968B moves back, the slide plate 956 returns to the original position.

When the slide plate 956 returns to the original position, the first lifter moves down vertically by a predetermined amount to store the wafers W in the cleaning tank 14. Then, the cover of the cleaning tank 14 is closed to start the rough cleaning.

Since the rough cleaning apparatus 12 is provided with the end wafer processing apparatus 950, the end wafers can be removed before the wafers W are transported to the individual wafer separation part 100. Therefore, the individual wafer separation apparatus 110 of the individual wafer separation part 100 can collect the wafers W without fail (since the end wafers are crescent-shaped and extremely thin, they may not be vacuumed by the pad and they are broken if the pad vacuums them).

The operator may manually collect the end wafers from the basket 970, or the basket 970 may be constructed in such a way as to rise and fall freely so that the wafers can be lifted automatically from the cleaning tank 14 to be disposed.

In this embodiment, the drill 962 cuts the slice base mounting beam S, but a saw, a disc cutter, etc. may cut the slice base mounting beam S by moving back and forth horizontally.

In this embodiment, the wafers W sliced in the normal slicing method are processed, but the present invention may also be applied to the wafers sliced in the multiple slicing method.

As set forth hereinabove, the wafer manufacturing apparatus of this invention is provided with the detecting part, which detects the thickness, breaking, chipping and remaining adhesives of the wafers. The wafers are classified and collected in accordance with the detection results of the detecting part. This eliminates the necessity for separately transporting the wafers to a detecting apparatus after the separation and cleaning, thus improving the wafer manufacturing efficiency.

Moreover, the individual wafer separation apparatus of this invention is able to separate and process the wafers without mixing the different kinds of wafers, which are sliced simultaneously from the different kinds of ingots.

The slice base mounting beam removal apparatus of this invention is able to automatically remove and dispose the slice base mounting beam, from which the wafers are separated, from the mounting plate. This improves the processing efficiency.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer manufacturing method comprising the steps of:
    transporting a plurality of wafers, sliced from an ingot by a wire saw, to a wafer separating part to separate said wafers one by one from a slice base mounting beam;
    transporting the wafers, separated from said slice base mounting beam, to a cleaning part one by one to clean the wafers;
    transporting the wafers cleaned by said cleaning part to a detecting part to detect the shapes of the wafers; and
    collecting the wafers one by one into a cassette of a collecting part after detecting the shapes of wafers at said detecting part.

2. The wafer manufacturing method as defined in claim 1, wherein said detecting part detects the thickness, breaking, chipping and remaining adhesives of the wafers as the shapes of the wafers.

3. The wafer manufacturing method as defined in claim 1, further comprising the step of transporting the wafers, sliced by said wire saw, to a rough cleaning part to roughly clean the wafers before transporting the wafers to said wafer separating part to separate the wafers one by one from said slice base mounting beam.

4. The wafer manufacturing method as defined in claim 1, further comprising the step of transporting said slice base mounting bean, from which the wafers have already been separated by said wafer separating part, to a slice base mounting beam removal part to remove said slice base mounting beam from a mounting plate.

5. The wafer manufacturing method as defined in claim 2, wherein said collecting part comprises:
    a wafer collecting cassette for collecting normal wafers;
    a failed wafer collecting box for collecting the wafers that are failed in shape;
    adhesive remaining wafer collecting cassette for collecting the wafers with adhesives remaining thereon; and
    wherein said collecting part classifies and collects the wafers according to the detected results of said detecting part.

6. A wafer manufacturing method comprising the steps of:
    transporting a plurality of wafers, sliced from a plurality of ingots by a wire saw, to a wafer separating part to separate said wafers one by one from slice base mounting beams for each lot;
    transporting the wafers, separated from said slice base mounting beams, to a cleaning part one by one to clean the wafers;
    transporting the wafers cleaned by said cleaning part to a detecting part to detect the shapes of the wafers; and
    collecting the wafers one by one into each cassette for each lot at a collecting part after detecting the shapes of the wafers at said detecting part.

7. The wafer manufacturing method as defined in claim 6, wherein said detecting part detects the thickness, breaking, chipping and remaining adhesives of the wafers as the shapes of the wafers.

8. The wafer manufacturing method as defined in claim 6, further comprising the step of transporting the wafers, sliced by said wire saw, to a rough cleaning part to roughly clean the wafers before transporting the wafers to said wafer separating part to separate the wafers one by one from said slice base mounting beam.

9. The wafer manufacturing method as defined in claim 6, further comprising the step of transporting said slice base mounting beams, from which the wafers have already been separated by said wafer separating part, to a slice base mounting beam removal part to remove said slice base mounting beam from a mounting plate.

10. The wafer manufacturing method as defined in claim 7, wherein said collecting part comprises:
    a wafer collecting cassette for collecting normal wafers;
    a failed wafer collecting box for collecting failed wafers such as broken wafers, chipped wafers and wafers with ununiform thickness;

an adhesive remaining wafer collecting cassette for collecting the wafers with adhesives remaining thereon; and wherein said collecting part classifies and collects the wafers according to the detected results of said detecting part.

11. A wafer manufacturing apparatus comprising:

a wafer separating part for separating wafers, sliced by a wire saw, individually from a slice base mounting beam;

a cleaning part for cleaning the wafers one by one;

a wafer transport part for transporting the wafers, separated from said slice base mounting beam by said wafer separating part, to said cleaning part;

a detecting part for detecting the shapes of the wafers cleaned by said cleaning part; and a collecting part for collecting the wafers whose shapes have been detected by said detecting part one by one.

12. The wafer manufacturing apparatus as defined in claim 11, wherein said detecting part detects the thickness, breaking, chipping and remaining adhesives of the wafers as the shape of the wafers.

13. The wafer manufacturing apparatus as defined in claim 11, further comprising a rough cleaning part for roughly cleaning the wafers sliced by said wire saw, and wherein the wafers which have been roughly cleaned by said rough cleaning part are transported to said wafer separating part.

14. The wafer manufacturing apparatus as defined in claim 11, further comprising a slice base mounting beam removal part for removing said slice base mounting beam, from which the wafers have been separated by said wafer separating part, from a mounting plate.

15. The wafer manufacturing apparatus as defined in claim 11, wherein said detecting part comprises:

rotation driving means for vacuuming and holding the center of the wafers to rotate the wafers;

a pair of distance measuring means arranged across the wafers rotated by said rotational driving means, said pair of distance measuring means measuring the distance to the wafers;

light projecting means for projecting a light toward edges of the wafers rotated by said rotational driving means;

light receiving means arranged across the wafers rotated by said rotational driving means, said light receiving means receiving the light projected by said light projecting means; and control means for calculating the thickness of the wafers according to the measurement results of said pair of distance measuring means and detecting the chipping and remaining adhesives of the wafers according to changes in the quantity of light received by said light receiving means.

16. The wafer manufacturing apparatus defined in claim 12, wherein said collecting part comprises:

a wafer collecting cassette for collecting normal wafers;

a failed wafer collecting box for collecting failed wafers such as broken wafers, chipped wafers and wafers with ununiform thickness;

adhesive remaining wafer collecting cassette for collecting the wafers with adhesives remaining thereon; and wherein said collecting part collects the wafers according to the detected results of said detecting part.

17. A wafer manufacturing apparatus comprising:

a wafer separating part for separating wafers, sliced by a wire saw, individually from a slice base mounting beam for each lot;

a cleaning part for cleaning the wafers one by one;

a wafer transport part for transporting the wafers, separated from said slice base mounting beam by said wafer separating part, to said cleaning part;

a detecting part for detecting the shapes of the wafers cleaned by said cleaning part; and a collecting part for classifying and collecting the wafers, whose shapes have been detected by said detecting part, one by one into different cassettes for each lot.

18. The wafer manufacturing apparatus as defined in claim 17, wherein said detecting part detects the thickness, breaking, chipping and remaining adhesives of the wafers as the shapes of the wafers.

19. The wafer manufacturing apparatus as defined in claim 17, further comprising a rough cleaning part for roughly cleaning the wafers sliced by said wire saw; and wherein the wafers which have been roughly cleaned by said cleaning part are transported to said wafer separating part.

20. The wafer manufacturing apparatus as defined in claim 17, further comprising a slice base mounting beam removal part for removing said slice base mounting beam, from which the wafers have been separated by said wafer separating part, from a mounting plate.

21. The wafer manufacturing apparatus as defined in claim 17, wherein said detecting part comprises:

rotation driving means for vacuuming and holding the center of the wafers to rotate the wafers;

a pair of distance measuring means arranged across the wafers rotated by said rotational driving means, said pair of distance measuring means measuring the distance to the wafers;

light projecting means for projecting a light toward edges of the wafers rotated by said rotational driving means;

light receiving means arranged across the wafers rotated by said rotational driving means, said light receiving means receiving the light projected by said light projecting means; and control means for calculating the thickness of the wafers according to the measurement results of said pair of distance measuring means and detecting the chipping and remaining adhesives of the wafers according to changes in the quantity of light received by said light receiving means.

22. The wafer manufacturing apparatus as defined in claim 18, wherein said collecting part comprises:

a wafer collecting cassette for collecting normal wafers;

a failed wafer collecting box for collecting the wafers such as broken wafers, chipped wafers and wafers with uniform thickness;

adhesive remaining wafer collecting cassette for collecting the wafers with adhesives remaining thereon; and wherein said collecting part collects the wafers according to the detection results of said detecting.

23. A wafer separating apparatus which separates wafers, sliced simultaneously from a plurality of ingots by a wire saw, one by one from a slice base mounting beam holding the wafers; said wafer separating apparatus comprising:

a hot water tank for containing hot water;

an attachment base placed in said hot water tank, the wafers subject to separation being attached to said attachment base;

holding means for holding an end faces the wafers at one side;

moving means for moving said holding means along said attachment base;

swinging means provided in said moving means, said swinging means swinging said holding means; and partitions inserted into spaces between different kinds of wafers; and a sensor for detecting the partitions inserted between the wafers.

24. The wafer separating apparatus as defined in claim 23, further comprising retreating means for retreating said partitions the spaces between the wafers in accordance with a detection signal from said sensor.

25. A wafer separating apparatus which separates wafers, sliced from a plurality of ingots by a wire saw, one by one from slice base mounting beams to which the wafers are adhered; said wafer separating apparatus comprising:

a hot water tank for containing hot water;

holding means for holding said slice base mounting beam adhered to the wafers while soaking said slice base mounting beams in said hot water;

a guide member arranged along said hot water tank;

a running base running along said guide member;

separating means provided at said running base and separating the wafers one by one from said slice base mounting beam soaked in said hot water;

a plurality of moving means provided in such a way as to move freely along said guide member, said running base pressing and moving each moving means;

partitions provided at each moving means, said partitions being inserted between wafer lots;

moving means driving means connecting to each moving means to move said each moving means along said guide member;

lot detecting means for detecting boundaries between the wafer lots adhered to said slice base mounting beam while said moving means driving means is moving said each moving means along said guide member;

partition detecting means for detecting each partition inserted between the wafer lots while said separating means is separating the wafers;

partition inserting means for inserting said partitions into spaces between the wafer lots in accordance with a detection signal from said lot detecting means and retreating said partitions from said spaces between the wafers in accordance with a detection signal from said partition detecting means; and connecting means for connecting said each moving means to said moving means driving means and releasing the connection in accordance with a detection signal from said lot detecting means.

26. The wafer separating apparatus as defined in claim 25, wherein said moving means driving means comprises:

a second guide member arranged at the opposite side of said guide member across said hot water tank;

a second running base running along said second guide member; and wherein said moving means driving means detachably connects to said each moving means through said connecting means.

27. The wafer separating apparatus as defined in claim 26, wherein said connecting means comprises:

a connecting member provided in a space below said hot water tank, one end of said connecting member being connected to said second running base;

a pin provided in said connecting member and inserted into pin holes formed in each moving means to thereby connect said connecting member to each moving means;

pin inserting means for inserting said pin into pin holes formed in each moving means.

28. The wafer separating apparatus as defined in claim 27, wherein said lot detecting means is provided in said connecting means and is composed of light projecting means and light receiving means arranged to face one another across said hot water tank, and said lot detecting means detects that said light receiving means has received the light projected from said light projecting means to thereby detect boundaries between the wafer lots adhered to said slice base mounting beams.

29. The wafer separating apparatus as defined in claim 25, wherein said partition detecting means detects the contact between said running base and said plurality of moving means and the contact between said plurality of moving means to thereby detect said partitions inserted between the wafer lots.

30. A slice base mounting beam removal apparatus which removes a slice base mounting beam, from which wafers have already been separated, from a mounting plate; said slice base mounting bean removal apparatus comprising:

a hot water tank for containing hot water;

holding means for holding said mounting plate to which said slice base mounting beams is adhered;

transport means for transporting said holding means from a predetermined receiving position to a predetermined slice base mounting beam removal position in said hot water tank; and slice base mounting beam pressing means provided in said hot water tank and pressing the side of said slice base mounting beam adhered to said mounting plate transported to said slice base mounting beam removal position to thereby remove said slice base mounting beam from said mounting plate.

31. The slice base mounting beam removal apparatus as defined in claim 30, comprising:

a slice base mounting beam receiving member provided in said holding means and receiving said slice base mounting beam removed from said mounting plate;

a slice base mounting beam disposal box provided at a predetermined slice base mounting beam disposal position, and the slice base mounting beam removed from said mounting plate being disposed into said slice base mounting beam disposal box;

disposal means for disposing said slice base mounting beam received by said slice base mounting beam receiving member into said slice base mounting beam disposal box; and wherein after the removal of said slice base mounting beam, said transport means transports said holding means to said slice base mounting beam disposal position, and said disposal means disposes said slice base mounting beam, received by said slice base mounting beam receiving member at said slice base mounting beam disposal position, into said slice base mounting beam disposal box.

32. The slice base mounting beam removal apparatus as defined in claim 30, further comprising cleaning means provided in said hot water tank and jetting a cleaning liquid to said mounting plate, from which said slice base mounting beam has already been removed, to thereby clean said mounting plate.

33. The slice base mounting beam removal apparatus as defined in claim 31, further comprising cleaning means provided in said hot water tank and jetting a cleaning liquid to said mounting plate, from which said slice base mounting beam has already been removed, to thereby clean said mounting plate.

34. A wafer separating apparatus which separates a plurality of wafers, sliced from an ingot by a wire saw, from a slice base mounting beam holding said wafers one by one; said wafer separating apparatus comprising:

a hot water tank for containing hot water;

an attachment base placed in said hot water tank, the wafers subject to separation being attached to said attachment base;

holding means for holding end faces of said wafers at one side;

first moving means for moving said holding means along said attachment base;

swinging means provided at said first moving means, said swinging means swinging said holding means;

a wafer pressing member coming into contact with the top of some wafers attached to said attachment base to press the wafers;

second moving means for moving said wafer pressing means along an axis of the wafers attached to said attachment base; and retracting means provided at said second moving means, said retracting means retracting said wafer pressing member from the wafers.

35. An end wafer processing apparatus for removing, from a slice base mounting beam, wafers at both ends of plural wafers sliced by a wire saw; said end wafer processing apparatus comprising:

wafer detecting means for detecting both ends of said plural wafers sliced by the wire saw; and cutting means for cutting the slice base mounting beam, to which the wafers at both ends are adhered, in accordance with detection results of said wafer detecting means.

36. The end wafer processing apparatus as defined in claim 35, wherein said cutting means is a drill, which punches said slice base mounting beam to cut off the wafers.

\* \* \* \* \*